(12) United States Patent
Nishi et al.

(10) Patent No.: US 8,049,157 B2
(45) Date of Patent: *Nov. 1, 2011

(54) SEMICONDUCTOR DEVICE

(75) Inventors: Kazuo Nishi, Kofu (JP); Tatsuya Arao, Ebina (JP); Atsushi Hirose, Atsugi (JP); Yuusuke Sugawara, Minamiarupusu (JP); Naoto Kusumoto, Isehara (JP); Daiki Yamada, Isehara (JP); Hidekazu Takahashi, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/949,301

(22) Filed: Nov. 18, 2010

(65) Prior Publication Data

US 2011/0062543 A1    Mar. 17, 2011

Related U.S. Application Data

(63) Continuation of application No. 12/350,271, filed on Jan. 8, 2009, now Pat. No. 7,838,812, and a continuation of application No. 11/491,507, filed on Jul. 24, 2006, now Pat. No. 7,485,838.

(30) Foreign Application Priority Data

Jul. 27, 2005   (JP) ................. 2005-217757

(51) Int. Cl.
*H03F 3/08* (2006.01)
*H03K 17/78* (2006.01)
*H01J 40/14* (2006.01)
*H04N 3/14* (2006.01)
*H01L 31/062* (2006.01)

(52) U.S. Cl. ......... 250/214 A; 250/214 SW; 250/214 R; 348/308; 257/292; 330/308

(58) Field of Classification Search ............... 250/214 A, 250/214 LA, 214 LS, 214 SW, 214.1, 214 R, 250/208.1, 214 AL; 330/308, 288; 257/291, 257/292, 432, 451, 458; 348/300, 301, 307–310
See application file for complete search history.

(56) References Cited

U.S. PATENT DOCUMENTS 4,954,895 A * 9/1990 Akimoto et al. .............. 348/301
(Continued)

FOREIGN PATENT DOCUMENTS

DE           9213278           1/1993
(Continued)

OTHER PUBLICATIONS

Written Opinion (Application No. PCT/JP2006/314815) dated Oct. 17, 2006.
(Continued)

*Primary Examiner* — Georgia Y Epps
*Assistant Examiner* — Don Williams
(74) *Attorney, Agent, or Firm* — Eric J. Robinson; Robinson Intellectual Property Law Office, P.C.

(57) ABSTRACT

The present invention provides a photoelectric conversion device capable of detecting light from weak light to strong light and relates to a photoelectric conversion device having a photodiode having a photoelectric conversion layer; an amplifier circuit including a transistor; and a switch, where the photodiode and the amplifier circuit are electrically connected to each other by the switch when intensity of entering light is lower than predetermined intensity so that a photoelectric current is amplified by the amplifier circuit to be outputted, and the photodiode and part or all of the amplifier circuits are electrically disconnected by the switch so that a photoelectric current is reduced in an amplification factor to be outputted. According to such a photoelectric conversion device, light from weak light to strong light can be detected.

11 Claims, 33 Drawing Sheets

U.S. PATENT DOCUMENTS

| | | | |
|---|---|---|---|
| 5,004,901 A * | 4/1991 | Yoshimoto et al. | 250/201.5 |
| 5,198,673 A * | 3/1993 | Rougeot et al. | 250/370.11 |
| 5,479,208 A | 12/1995 | Okumura | |
| 5,693,934 A | 12/1997 | Hohmoto et al. | |
| 5,760,760 A | 6/1998 | Helms | |
| 5,936,231 A | 8/1999 | Michiyama et al. | |
| 5,952,992 A | 9/1999 | Helms | |
| 5,969,809 A | 10/1999 | Nishina | |
| 5,981,936 A | 11/1999 | Fujiie | |
| 6,057,738 A | 5/2000 | Ku et al. | |
| 6,287,888 B1 | 9/2001 | Sakakura et al. | |
| 6,531,711 B2 | 3/2003 | Sakakura et al. | |
| 6,858,827 B2 | 2/2005 | Sugiyama et al. | |
| 7,002,881 B2 | 2/2006 | Okuda et al. | |
| 7,030,551 B2 | 4/2006 | Yamazaki et al. | |
| 7,042,980 B2 | 5/2006 | Endo | |
| 7,253,391 B2 | 8/2007 | Koyama et al. | |
| 7,485,838 B2 * | 2/2009 | Nishi et al. | 250/214 A |
| 7,495,272 B2 | 2/2009 | Maruyama et al. | |
| 7,705,283 B2 | 4/2010 | Arao et al. | |
| 7,769,253 B2 | 8/2010 | Imai et al. | |
| 7,838,812 B2 * | 11/2010 | Nishi et al. | 250/214 R |

FOREIGN PATENT DOCUMENTS

| | | |
|---|---|---|
| EP | 0 445 757 | 9/1991 |
| JP | 11-205247 | 7/1999 |
| JP | 2001-174325 | 6/2001 |
| JP | 3444093 | 9/2003 |
| JP | 2005-136392 | 5/2005 |
| JP | 2005-167157 | 6/2005 |
| WO | WO 2005/114749 | 12/2005 |

OTHER PUBLICATIONS

International Search Report (Application No. PCT/JP2006/314815) dated Oct. 17, 2006.

* cited by examiner 262 263     261 260 264

SEMICONDUCTOR DEVICE

TECHNICAL FIELD

The present invention relates to a photoelectric conversion device and a semiconductor device having a photoelectric conversion element. Specifically, the present invention relates to a photoelectric conversion device formed by a thin film semiconductor element and a manufacturing method thereof. Moreover, the present invention relates to an electronic device using a photoelectric conversion device.

BACKGROUND ART

A number of photoelectric conversion devices generally used for detecting an electromagnetic wave are known, and for example, a photoelectric conversion device having sensitivity in ultra-violet rays to infrared rays is referred to as a light sensor in general. A light sensor having sensitivity in a visible radiation region with a wavelength of 400 to 700 nm is particularly referred to as a visible light sensor, and a large number of visible light sensors are used for devices which need illuminance adjustment or on/off control depending on human living environment.

In particular, in a display device, brightness in the periphery of the display device is detected to adjust display luminance thereof. This is done because unnecessary electric-power can be reduced by detecting peripheral brightness and obtaining appropriate display luminance. For example, such a light sensor for adjusting luminance is used for a cellular phone or a personal computer.

In addition, as well as peripheral brightness, luminance of a back light of a display device, particularly, a liquid crystal display device is also detected by a light sensor to adjust luminance of a display screen.

In such a light sensor, a photodiode is used for a sensing part and an output current of the photodiode is amplified in an amplifier circuit. As such an amplifier circuit, for example, a current mirror circuit is used (for example, see Patent Document 1: Patent Publication No. 3444093).

DISCLOSURE OF INVENTION

With a conventional light sensor, weak light can be detected; however, when light from weak light to strong light is detected, there is a problem that a range of an output current is expanded and voltage used for one level is lowered. Accordingly, resolving power is getting worse or an effect of noise is increased.

A photoelectric conversion device of the present invention has a photodiode, an amplifier circuit, and a switch. The switch is turned on and a photoelectric current of the photodiode is amplified when light is weak, and the switch is turned off and a photoelectric current of the photodiode is directly outputted when light is strong.

It is to be noted that, in this specification, a photoelectric conversion device denotes a device provided with a function to convert light, which is received in a sensor portion, into an electronic signal and is referred to as a photoelectric conversion element in a case of being used as an element. In addition, a semiconductor device denotes a device having a semiconductor layer, and the entire device including an element having a semiconductor layer is also referred to as a semiconductor device.

The present invention relates to a semiconductor device having a photodiode having a photoelectric conversion layer; an amplifier circuit including a transistor; and a switch, where the photodiode and the amplifier circuit are electrically connected to each other by the switch and a photoelectric current is amplified by the amplifier circuit to be outputted when intensity of entering light into the photodiode is lower than predetermined intensity, and the photodiode and part or all of the amplifier circuits are electrically disconnected by the switch and a photoelectric current is outputted with a reduced amplification factor when intensity of entering light is higher than predetermined intensity.

The present invention relates to a semiconductor device having a first transistor and a second transistor which are connected to each other so that a common potential is applied to each gate electrode and form a current mirror circuit; a photodiode of which one terminal is connected to a power supply and the other terminal is connected to one of a source region and a drain region of the first transistor and the gate electrode of the first transistor; and a switch which is inserted in series between one terminal of the photodiode and one of a source region and a drain region of the second transistor, where the switch is turned on and off in accordance with intensity of light received by the photodiode.

The present invention relates to a semiconductor device having a first transistor and a second transistor which are connected to each other so that a common potential is applied to each gate electrode and form a current mirror circuit; a photodiode of which one terminal is connected to a power supply and the other terminal is connected to one of a source region and a drain region of the first transistor and the gate electrode of the first transistor; and a switch which is inserted in series between one terminal of the photodiode and one of a source region and a drain region of the second transistor, where the switch is turned off when intensity of light received by the photodiode is higher than a predetermined value and is turned on when intensity of light received by the photodiode is lower than the predetermined value.

The present invention relates to a semiconductor device having a first transistor and a second transistor which are connected to each other so that a common potential is applied to each gate electrode and form a current mirror circuit; a photodiode of which one terminal is connected to a power supply and the other terminal is connected to one of a source region and a drain region of the first transistor and the gate electrode of the first transistor; and a switch which is inserted in series between one terminal of the photodiode and one of a source region and a drain region of the second transistor, where a controlling portion, which turns the switch in accordance with intensity of light received by the photodiode, is included.

According to the present invention, the photoelectric conversion layer has a p-type semiconductor layer, an i-type semiconductor layer, and an n-type semiconductor layer.

According to the present invention, the transistor is a thin film transistor.

According to the present invention, the transistor has a source region, a drain region, a channel formation region, a gate insulating film, and a gate electrode.

According to a photoelectric conversion device of the present invention, a photoelectric current, which is generated from weak light by a photodiode, can be outputted with amplification by an amplifier circuit, and a photoelectric current, which is obtained by detecting light having illuminance of a certain level or more, can be outputted without amplification. Thus, an output current can be lowered once, the range of an absolute value of an output current can be narrowed, and a voltage value for one gray-scale can be increased. Accordingly, there is an advantage that a detectable range of light intensity is widened.

BRIEF DESCRIPTION OF DRAWINGS

In the accompanying drawings:

FIGS. 17A to 17F are views showing a manufacturing process of a photoelectric conversion device of the present invention;

BEST MODE FOR CARRYING OUT THE INVENTION

Figure 1:
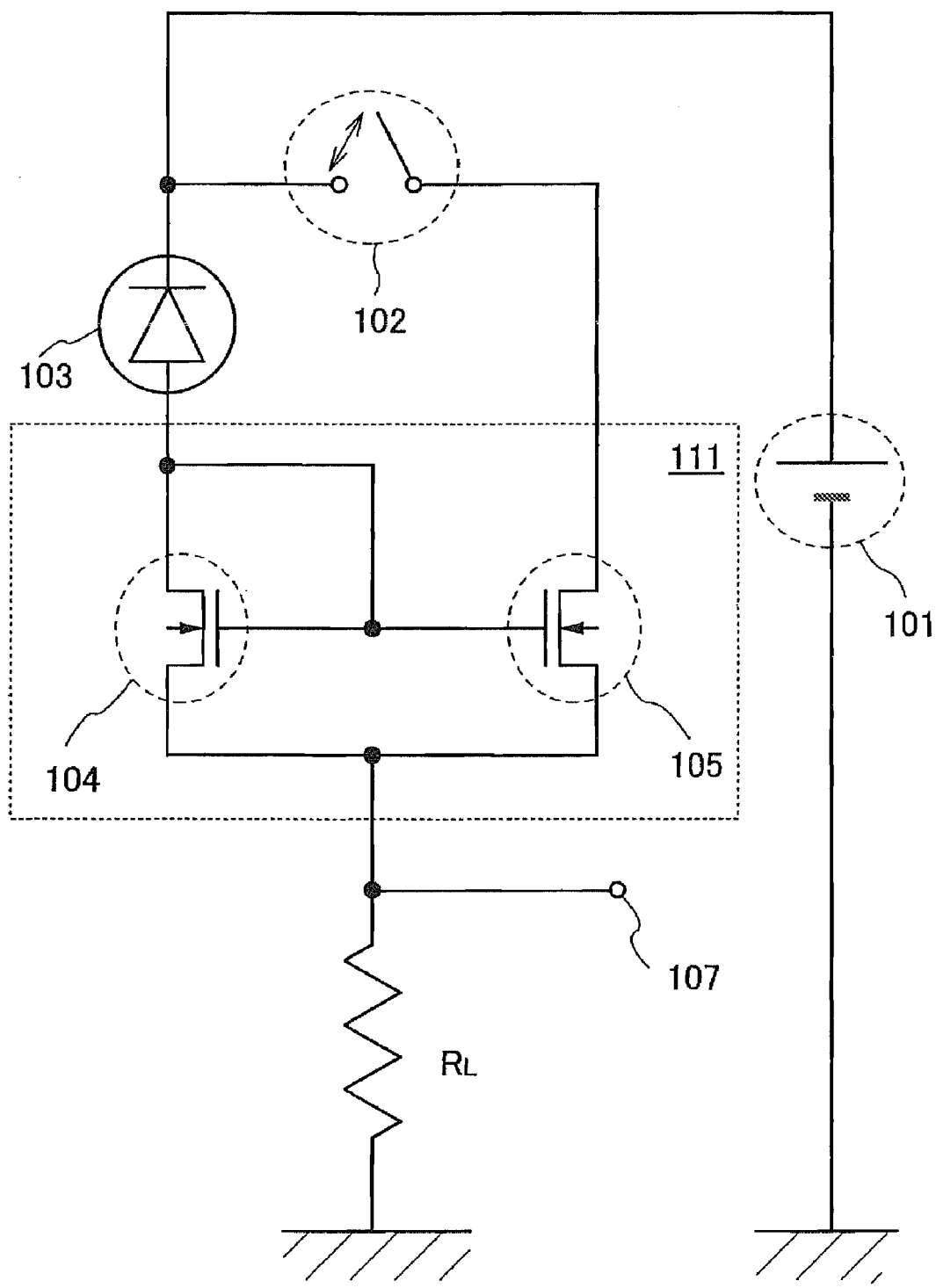
FIG. 1 is a circuit diagram of a photoelectric conversion device of the present invention.

This embodiment mode will be explained with reference to FIG. 1, FIG. 2, FIG. 3, FIG. 4, FIG. 5, and FIGS. 6A and 6B.

However, the present invention is not limited to the following explanation, and it is to be easily understood that various changes and modifications in modes and details thereof will be apparent to those skilled in the art. Therefore, the present invention is not construed as being limited to descriptions of the embodiments explained below. It is to be noted that, in embodiment of the present invention which will be explained below, the same portions are denoted by the same reference numerals through different drawings.

As shown in FIG. 1, a semiconductor device of this embodiment mode has a power supply (bias supply) 101, a switch 102, a photodiode 103, a current mirror circuit 111 including transistors 104 and 105, an output terminal 107, and a connection resistance $R_L$. In this embodiment, a thin film transistor (TFT) is used as the transistors 104 and 105, and the TFTs 104 and 105 are formed by an n-channel TFT. A photoelectric current is extracted outside by the output terminal 107.

In FIG. 1, a gate electrode of the TFT 104 included in the current mirror circuit 111 is electrically connected to a gate electrode of the TFT 105, which is another TFT included in the current mirror circuit 111, and one terminal of the photodiode 103. One of a source region and a drain region of the TFT 104 is electrically connected to one terminal of the photodiode 103 and the gate electrode of the TFT 105. In addition, the other one of the source region and the drain region of the TFT 104 is electrically connected to one of a source region and a drain region of the TFT 105, the output terminal, and the connection resistance $R_L$.

The gate electrode of the TFT 105 is electrically connected to the gate electrode of the TFT 104 and the one of the source region and the drain region of the TFT 104. The one of source region and the drain region of the TFT 105 is electrically connected to the other of the source region and the drain region of the TFT 104, the output terminal, and the connection resistance $R_L$. The other one of the source region and the drain region of the TFT 105 is electrically connected to one terminal of the switch 102. The gate electrodes of the TFTs 104 and 105 are connected to each other; therefore, a common potential is applied thereto.

One terminal of the photodiode 103 is electrically connected to the one the source and the drain region of the TFT 104, the gate electrode of the TFT 104, and the gate electrode of the TFT 105. The other terminal of the photodiode 103 is connected to the other terminal of the switch 102 and the power supply 101.

The switch 102 is inserted in series between the photodiode 103 and the TFT 105. One terminal of the switch 102 is connected to the other one of the source and the drain region of the TFT 105, and the other terminal of the switch 102 is connected to the other terminal of the photodiode 103 and the power supply 101.

One terminal of each of the connection resistance $R_L$ and the power supply 101 is grounded.

Figure 2:
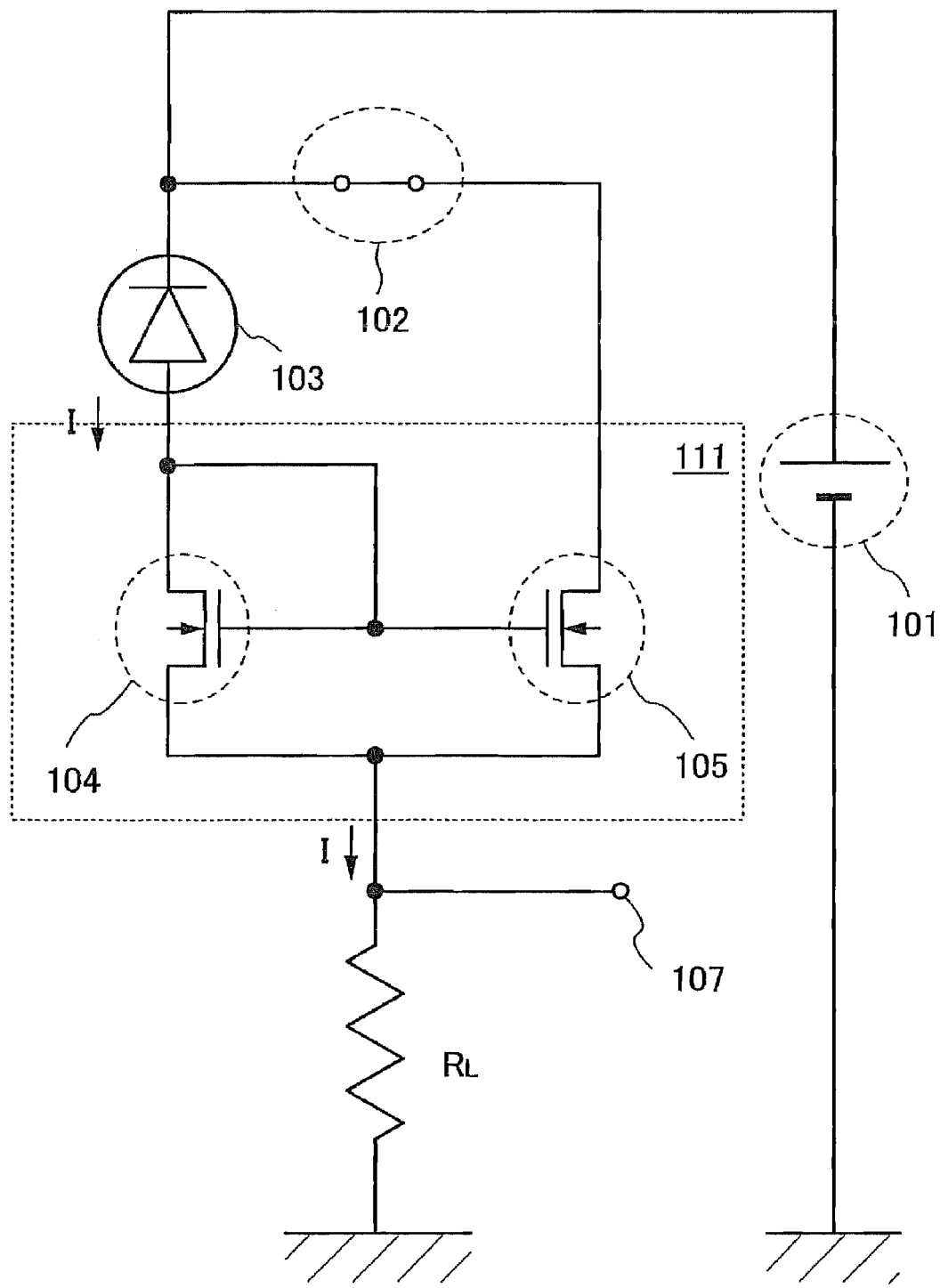
FIG. 2 is a circuit diagram of a photoelectric conversion device of the present invention.
Figure 3:
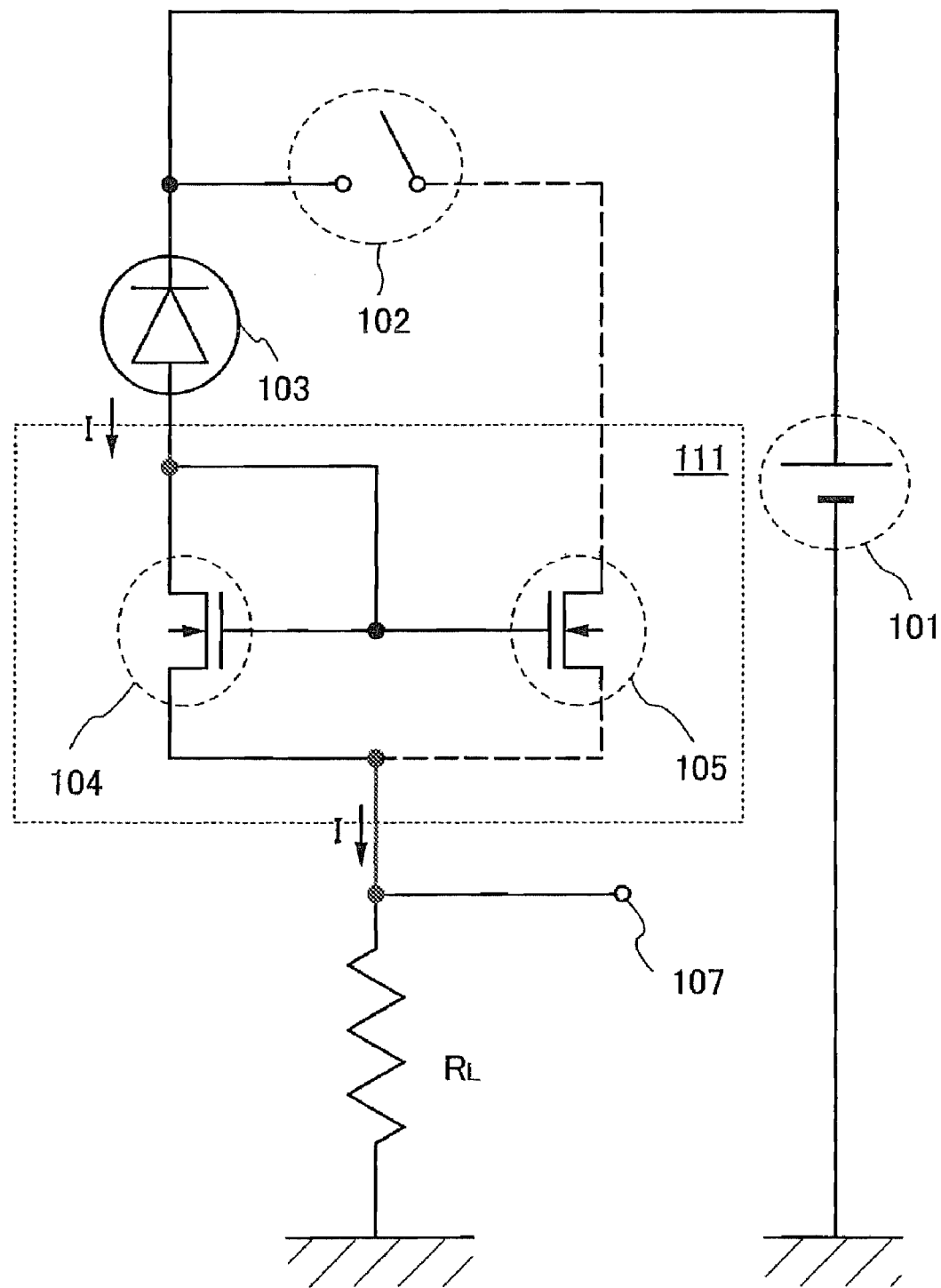
FIG. 3 is a circuit diagram of a photoelectric conversion device of the present invention.

FIG. 2 is a circuit diagram showing a state where the switch 102 in the FIG. 1 is turned on, and FIG. 3 is a circuit diagram showing a state where the switch 102 in the FIG. 1 is turned off. When intensity of entering light is low, the switch 102 is turned on as shown in FIG. 2 so that the photodiode 103 and the current mirror circuit 111 are brought into conduction. The current mirror circuit 111 serves to amplify an output value of the photodiode 103.

Alternatively, when intensity of entering light is high, the switch 102 is turned off as shown in FIG. 3 so that a photoelectric current does not flow in the TFT 105. With such a structure, the current mirror circuit 111 does not serve to amplify a photoelectric current, and the TFT 104 serves as a resistance.

Figure 31:
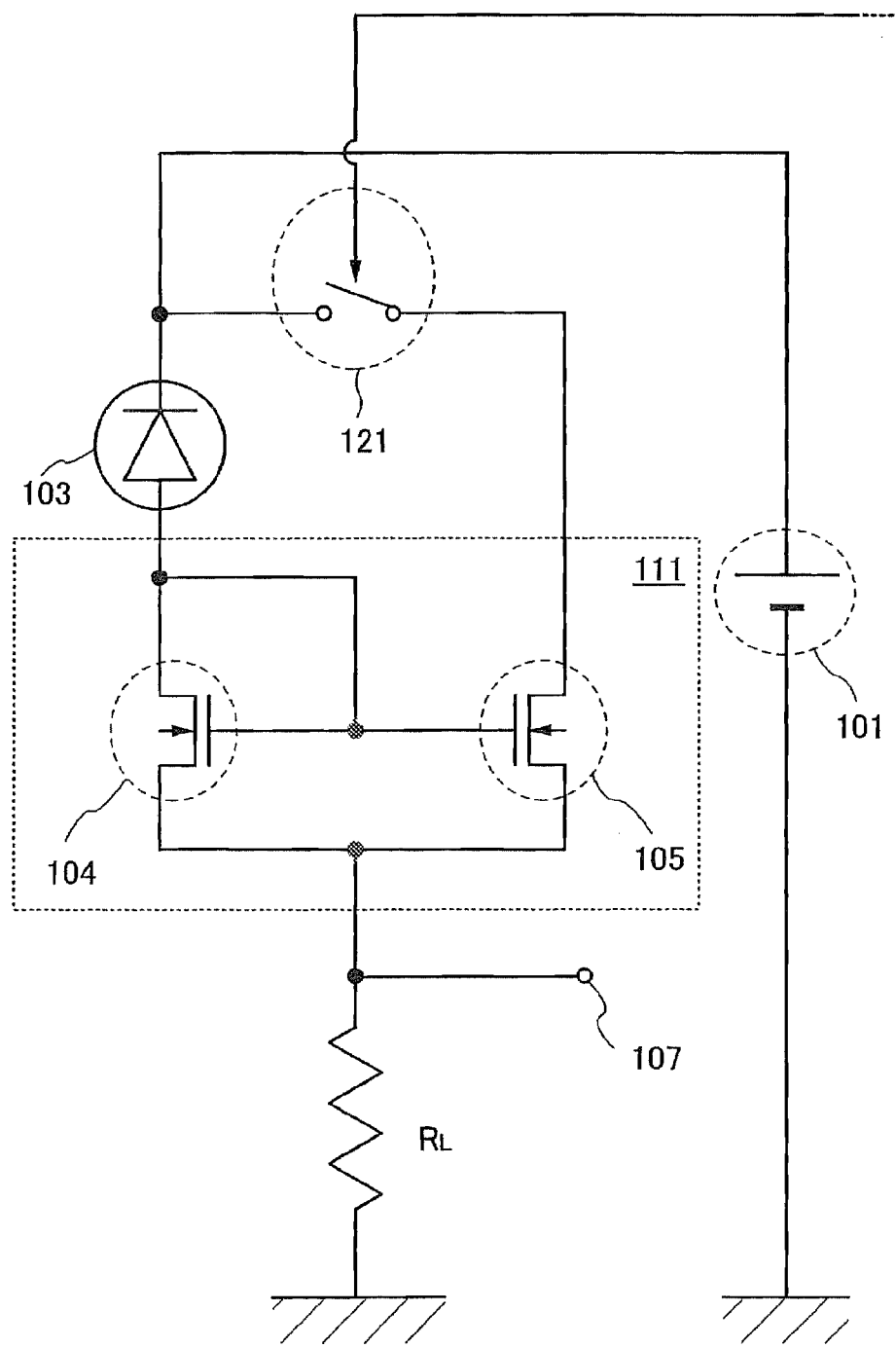
FIG. 31 is a circuit diagram of a photoelectric conversion device of the present invention.
Figure 32:
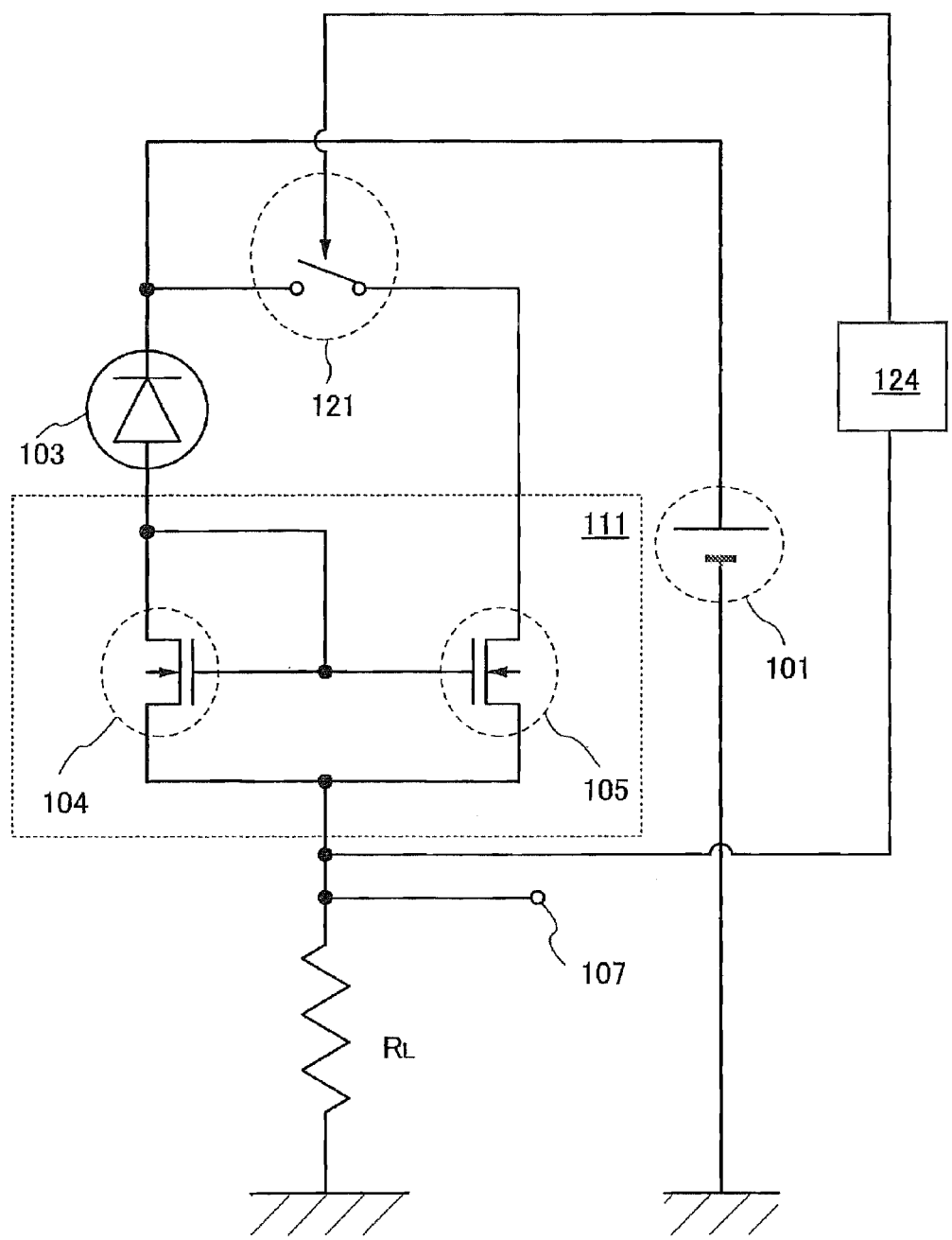
FIG. 32 is a circuit diagram of a photoelectric conversion device of the present invention.
Figure 33:
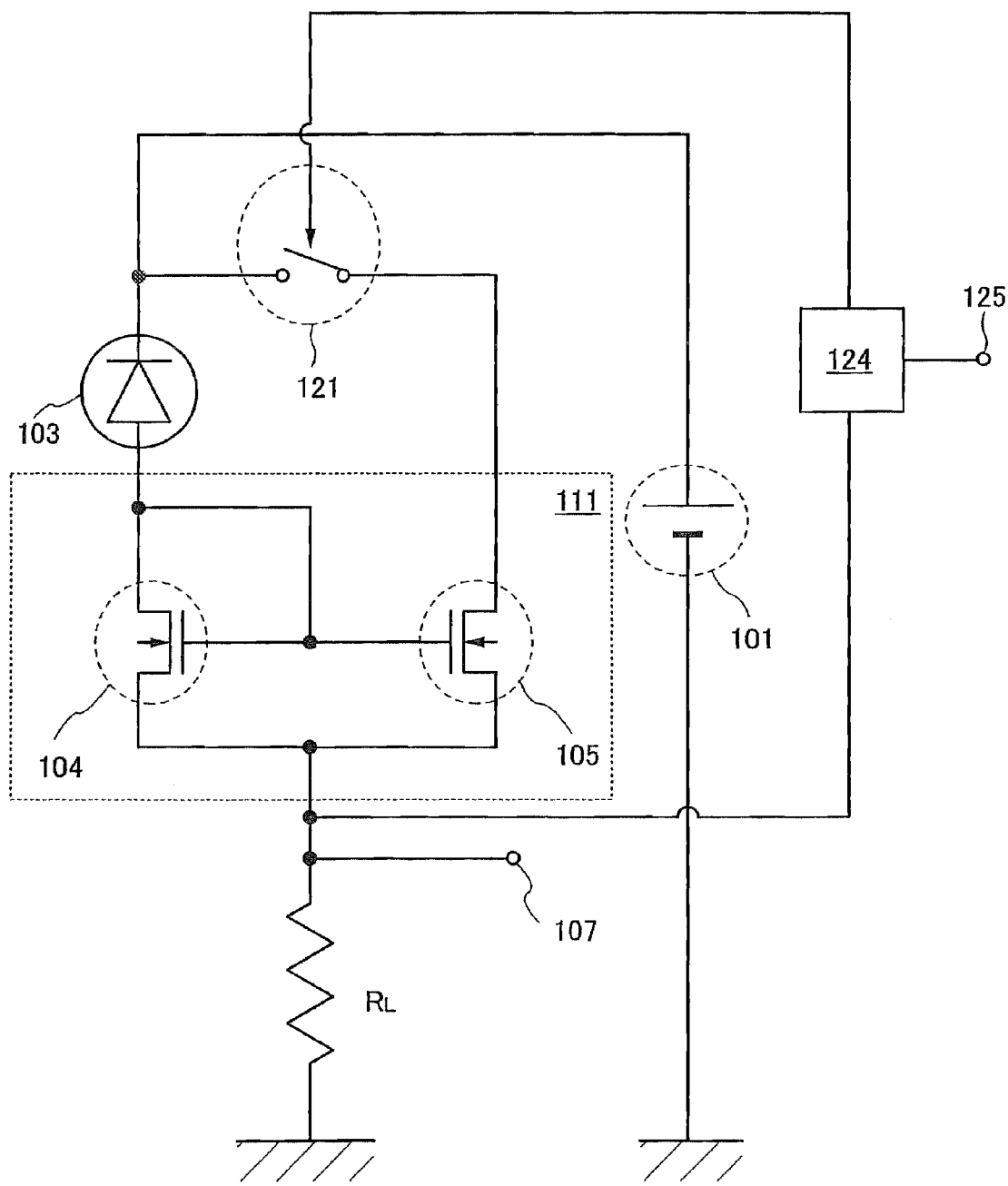
FIG. 33 is a circuit diagram of a photoelectric conversion device of the present invention.

FIG. 31 shows a circuit diagram in a case where the switch 102 in FIG. 1 is switched by a signal from outside, FIG. 32 shows a circuit diagram in a case where the switch 102 in FIG. 1 is switched based on judgment from an external controlling portion, and FIG. 33 shows a circuit diagram in a case of outputting a signal representing whether the switch is switched or not in FIG. 32.

In a structure of FIG. 31, the switch 102 is switched not by switching with the use of the amount of light but by providing a switch 121 for inputting a signal from outside to switch to the current mirror circuit 111.

In a structure of FIG. 32, the switching with the use of the amount of light is judged by an external controlling portion 124, and on the basis of the judgment, the switch 121 is switched by an external input. In addition, a signal representing whether the switch is switched or not may be outputted from an external terminal 125 in order to make an external circuit recognize the operation, as a structure of FIG. 33. A chip or the like may be used for the external controlling portion 124.

Figure 4:
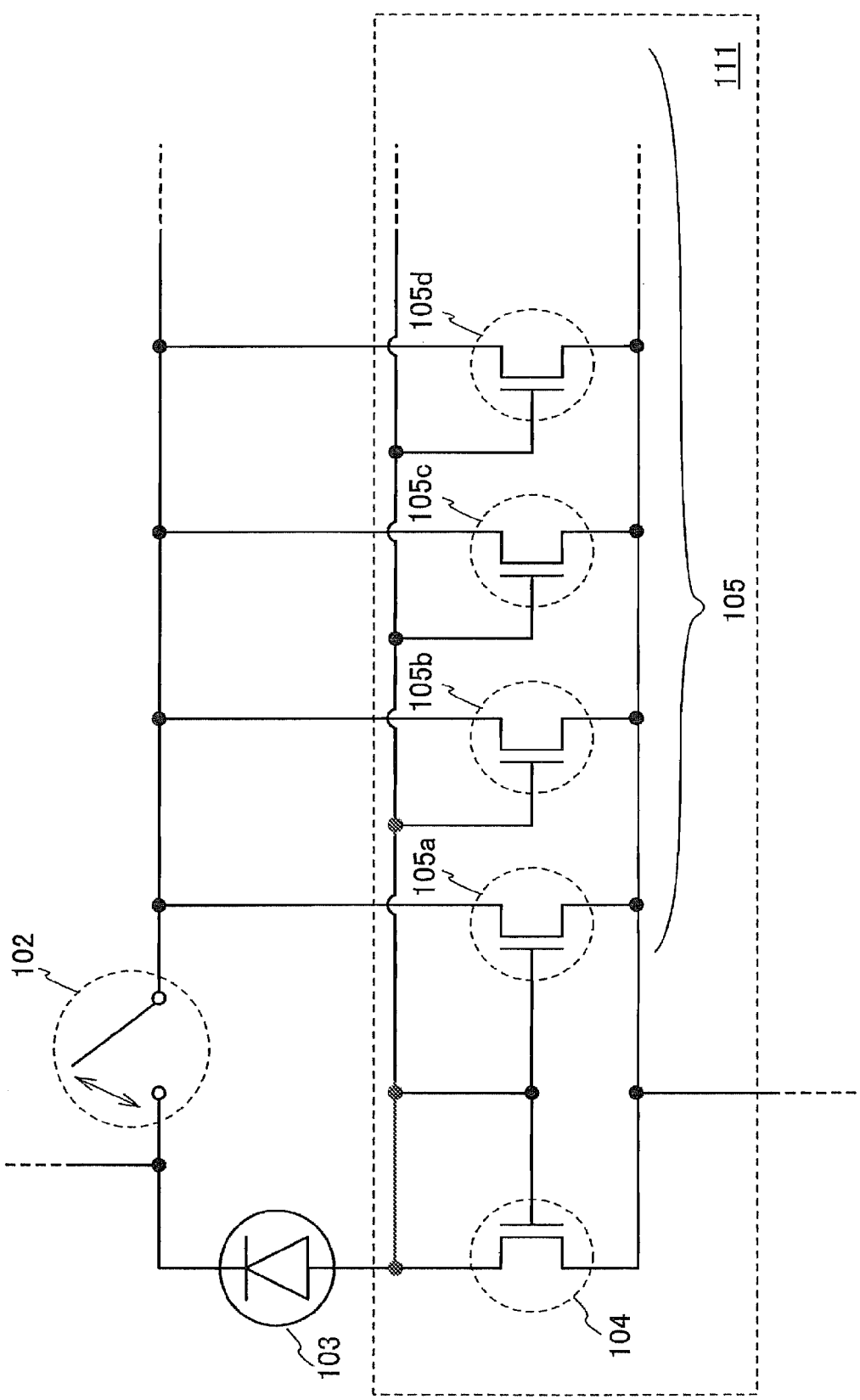
FIG. 4 is a circuit diagram of a photoelectric conversion device of the present invention.

Although two TFTs are illustrated in FIG. 1, a piece of the n-channel TFT 104 and n pieces of the n-channel TFT 105 may be provided in order to increase the output value by n times (refer to FIG. 4). For example, if the output value is desired to be up to 100 times, a piece of the n-channel TFT 104 and 100 pieces of the n-channel TFT 105 may be arranged. It is to be noted that the same reference numerals as those in FIG. 1 are used for the same portions in FIG. 4. In FIG. 4, the n-channel TFT 105 includes n pieces of n-channel TFTs 105a, 105b, 105c, 105d, . . . . In this manner, a photoelectric current generated in the photodiode 103 is amplified by n times and outputted.

Further, in a circuit structure as shown in FIG. 4, an amplification factor can be changed in stages by providing and switching a plurality of switches. In other words, part of or all amplifier circuits are disconnected to change an amplification factor of a photoelectric current in stages. For example, 100 groups each including 100 pieces of n-channel TFTs 105, namely 10000 pieces of TFTs, may be formed and a switch may be provided for each group so that an amplification factor may be switched to 10000 times, 1000 times, 100 times, or 1 times.

Although FIG. 1 is an equivalent circuit diagram using an n-channel 1 for the current minor circuit 111, only a p-channel may be used instead of an n-channel TFT.

Figure 5:
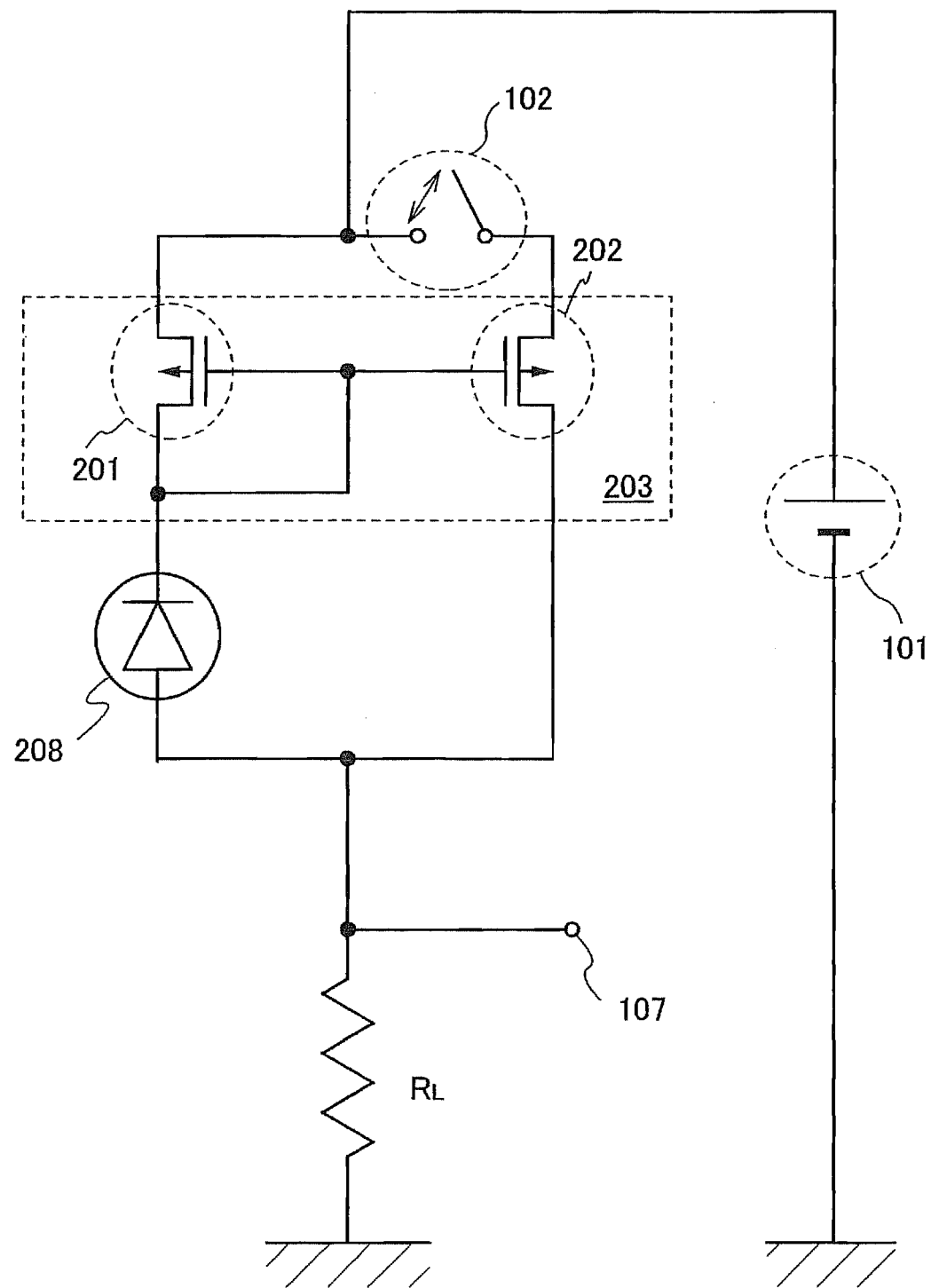
FIG. 5 is a circuit diagram of a photoelectric conversion device of the present invention.

In a case where the amplifier circuit is formed using a p-channel TFT, an equivalent circuit diagram shown in FIG. 5 is employed. The same reference numerals as those in FIG. 1 are used for the same portions in FIG. 5. As shown in FIG. 5, a photodiode 208 and a current mirror circuit 203 including p-channel TFTs 201 and 202 may be connected to each other.

Figure 6A:
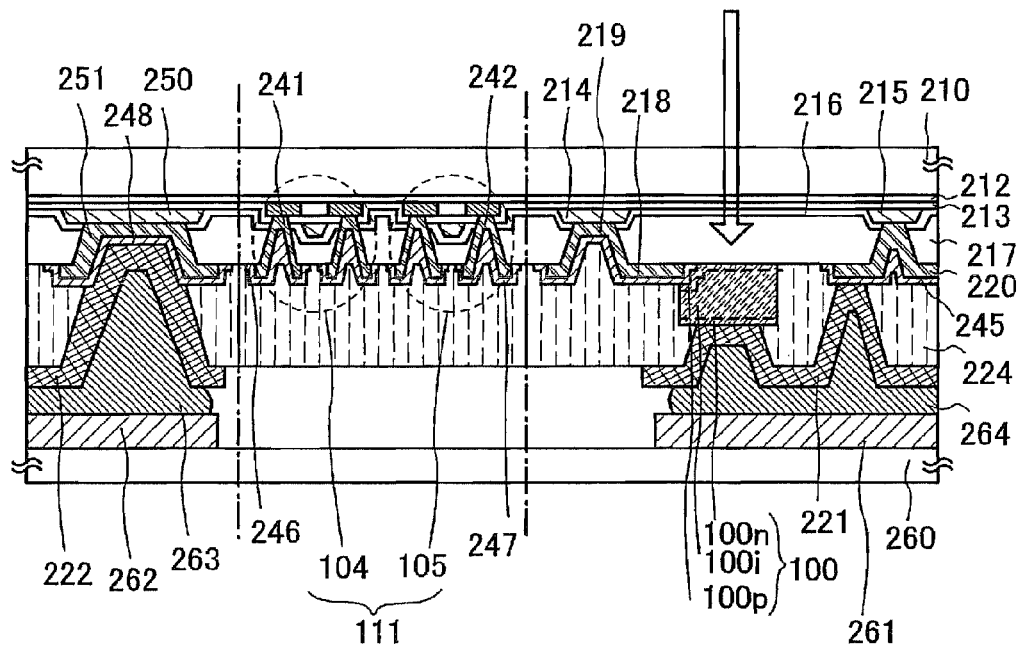
FIGS. 6A and 6B are cross-sectional views of a photoelectric conversion device of the present invention.
Figure 6B:
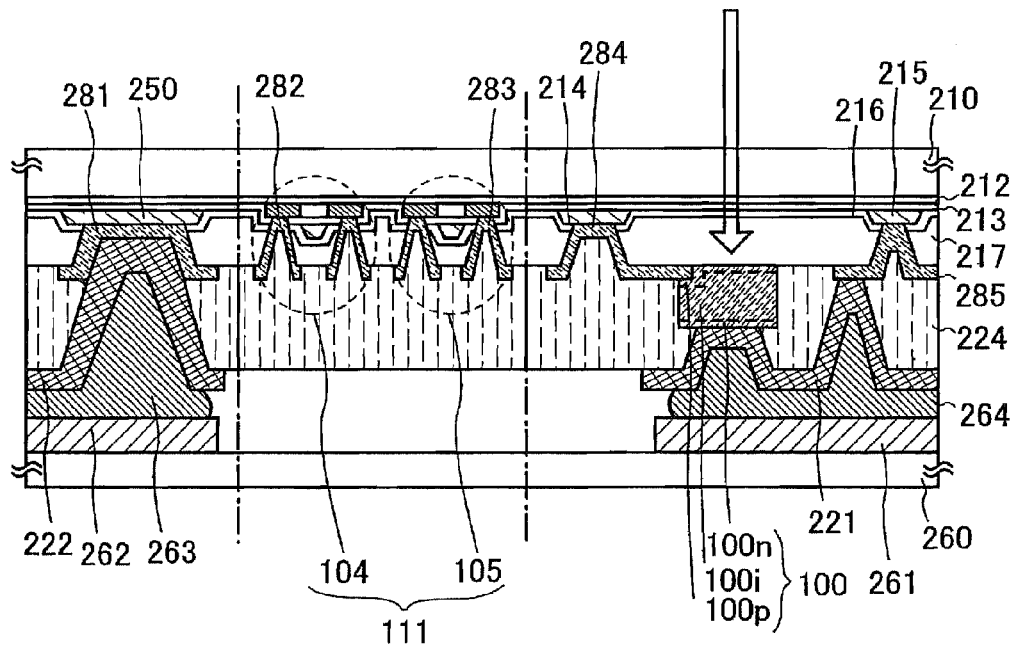

FIGS. 6A and 6B are cross-sectional views of the current mirror circuit 111 including the photodiode 103 and the TFTs 104 and 105 in FIG. 1.

In FIG. 6A, reference numeral 210 denotes a substrate; 212, a base insulating film; and 213, a gate insulating film. Light to be received passes through the substrate 210, the base insulating film 212, and the gate insulating film 213; therefore, a material having a high light-transmitting property is desirably used for all materials thereof.

The photodiode 103 has a wiring 219, a protective electrode 218, a photoelectric conversion layer 100, and a terminal electrode 221.

The photoelectric conversion layer 100 has a first semiconductor layer having one conductivity type, a second semiconductor layer, and a third semiconductor layer having one conductivity type opposite to the first semiconductor layer. In this embodiment mode, a p-type semiconductor layer 100p is formed as the first semiconductor layer; an intrinsic (i-type) semiconductor layer 100i, as the second semiconductor layer; and an n-type semiconductor layer 100n, as the third semiconductor layer.

As the p-type semiconductor layer 100p, an amorphous silicon film containing an impurity element belonging to Group 13, for example boron (B), may be formed by a plasma CVD method.

After the p-type semiconductor layer 100p is formed, the semiconductor layer 100i which does not include an impurity imparting conductivity type (referred to as intrinsic semiconductor layer or i-type semiconductor layer) and the n-type semiconductor layer 100n are formed in this order. Accordingly, the photoelectric conversion layer 100 having the p-type semiconductor layer 100p, the i-type semiconductor layer 100i, and the n-type semiconductor layer 100n is formed.

It is to be noted that, in this specification, the i-type semiconductor layer denotes a semiconductor layer with the concentration of an impurity imparting p-type or n-type conductivity contained in the semiconductor layer of $1 \times 10^{20}$ cm$^{-3}$ cm or less, with the concentration of oxygen and nitrogen of $5 \times 10^{19}$ cm$^{-3}$ or less, and with photoconductivity of 1000 times or more with respect to dark conductivity. Boron (B) of 10 to 1000 ppm may be added to the i-type semiconductor layer.

As the i-type semiconductor layer 100i, an amorphous silicon film may be formed by, for example, a plasma CVD method. As the n-type semiconductor layer 100n, an amorphous silicon film containing an impurity element belonging to Group 15, for example phosphorus (P), may be formed, or an impurity element belonging to Group 15 may be introduced after forming an amorphous silicon film.

As the p-type semiconductor layer 100p, the intrinsic semiconductor layer 100i, and the n-type semiconductor layer 100n, a semiamorphous semiconductor film may be used as well as an amorphous semiconductor film.

The semiamorphous semiconductor film is a film containing a semiconductor with an intermediate structure between an amorphous semiconductor and a semiconductor film having a crystal structure (including a single crystal structure and a polycrystalline structure). The semiamorphous semiconductor film is a semiconductor film having a third condition that is stable in term of free energy and is a crystalline substance having a short-range order and lattice distortion. A crystal grain thereof can be dispersed in the non-single crystal semiconductor film by setting a grain size thereof to be 0.5 to 20 nm. Raman spectrum thereof is shifted toward lower wave number than 520 cm$^{-1}$. The diffraction peaks of (111) and (220), which are thought to be derived from a Si crystal lattice, are observed in the semiamorphous semiconductor film by X-ray diffraction. The semiamorphous semiconductor film contains hydrogen or halogen of at least 1 atomic % or more as a material for terminating a dangling bond. In this specification, such a semiconductor film is referred to as a semiamorphous semiconductor (SAS) film for the sake of convenience. The lattice distortion are further extended by adding a rare gas element such as helium, argon, krypton, and neon so that the favorable semiamorphous semiconductor film with improved stability can be obtained. It is to be noted that a microcrystal semiconductor film is also included in a semiamorphous semiconductor film.

An SAS film can be obtained by glow discharge decomposition of a gas containing silicon. $SiH_4$ is a typical gas containing silicon, and additionally, $Si_2H_6$, $SiH_2Cl_2$, $SiHCl_3$, $SiCl_4$, $SiF_4$, or the like can be used. An SAS film can be easily formed by using the gas containing silicon diluted with hydrogen or gas in which one or more of rare gas elements selected from helium, argon, krypton, and neon is/are added to hydrogen. The gas containing silicon is preferably diluted with a 2 to 1000 fold dilution factor. In addition, a carbide gas such as $CH_4$ or $C_2H_6$; a germanide gas such as $GeH_4$ and $GeF_4$; $F_2$; and the like may be mixed into the gas containing silicon to adjust the width of an energy band at 1.5 to 2.4 eV or 0.9 to 1.1 eV.

In this embodiment mode, the first semiconductor layer is the p-type semiconductor layer 100p; the second semiconductor layer, the intrinsic (i-type) semiconductor layer 100i; and the third semiconductor layer, the n-type semiconductor layer 100n. However, stacking order thereof may be reversed. In other words, a structure may be employed, in which the n-type semiconductor layer is formed as the first semiconductor layer; the i-type semiconductor layer, as the second semiconductor layer; and the p-type semiconductor layer, as the third semiconductor layer.

Although a PIN photodiode is used as the photodiode 103 in this embodiment mode, a PN photodiode, an avalanche photodiode, or a Schottky photodiode may be used. In addition, germanium (Ge), GaAsP, InGaAs/InP, or the like may also be used as well as silicon.

Further, the wiring 219, a connection electrode 220, a terminal electrode 251, a source or drain electrode 241 of the TFT 104, and a source or drain electrode 242 of the TFT 105 each have a stacked structure of a refractory metal film and a low resistance metal film (aluminum alloy, pure aluminum, or the like). Here, a three-layer structure, in which a titanium film (Ti film), an aluminum film (Al film), and a Ti film are stacked in this order, is employed for the wiring 219 and the source or drain electrode 241 and 242.

Furthermore, the protective electrode 218, a protective electrode 245, a protective electrode 248, a protective electrode 246, and a protective electrode 247 are formed so as to cover the wiring 219, the connection electrode 220, the terminal electrode 251, the source or drain electrode 241 of the TFT 104, and the source or drain electrode 242 of the TFT 105, respectively.

In etching the photoelectric conversion layer 100, the wiring 219 is protected by the protective electrode 218 covering the wiring 219. A material for the protective electrode 218 is preferably a conductive material of which etching rate is lower than the photoelectric conversion layer 100 with respect to an etching gas (or an etchant) used for etching the photoelectric conversion layer 100. Additionally, a material for the protective electrode 218 is preferably a conductive material which does not react with the photoelectric conversion layer 100 to be an alloy. The protective electrodes 245, 248, 246, and 247 may also be formed with the same material and the same manufacturing process as the protective electrode 218.

Alternatively, a structure may be employed, in which the protective electrodes 218, 245, 248, 246, and 247 are not provided over the wiring 219, the connection electrode 220, and the terminal electrode 251. FIG. 6B shows a visible light sensor having such a structure. In FIG. 6B, a wiring 284, a connection electrode 285, a terminal electrode 281, a source or drain electrode 282 of a TFT 104, and a source or drain electrode 283 of a TFT 105 are made of a single-layer conductive film, and as such a conductive film, a titanium film (Ti film) is preferable. Instead of the titanium film, a single-layer film made of an element selected from tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), and platinum (Pt), or an alloy material or a compound material containing the above element as its main component, or a single-layer film made of nitride thereof, for example, titanium nitride, tungsten nitride, tantalum nitride, or molybdenum nitride can be used. The number of deposition can be reduced in the manufacturing process by forming the wiring 284, the connection electrode 285, the terminal electrode 281, the source or drain electrode 282 of the TFT 104, and the source or drain electrode 283 of the TFT 105 with a single-layer film.

In addition, in FIGS. 6A and 6B, an example of a top gate TFT in which the n-channel 104 and 105 each include one channel formation region (referred to as "single gate structure" in this specification) is shown; however, a structure including a plurality of channel formation regions may also be employed to reduce variation in ON current value. Further, each of the n-channel TFTs 104 and 105 may be provided with a low-concentration drain (Lightly Doped Drain (LDD)) region to reduce the OFF current value. The LDD region is a region to which an impurity element is added to form a low-concentration region between the channel formation region and a source or drain region that is formed by adding an impurity element to form a high-concentration region. When such an LDD region is provided, there is an effect that an electric field in the vicinity of a drain region is alleviated, thereby preventing deterioration due to hot carrier injection. In addition, in order to prevent deterioration in ON current value due to a hot carrier, the n-channel TFTs 104 and 105 may have a structure in which an LDD region overlaps with a gate electrode with a gate insulating film interposed therebetween (referred to as "GOLD (Gate-drain Overlapped LDD) structure" in this specification).

In the case of employing the GOLD structure, the effect of preventing deterioration due to hot carrier injection by alleviating an electric field in the vicinity of a drain region is more achieved than a case where the LDD region does not overlap with the gate electrode. It is effective to employ such a GOLD structure to prevent a deterioration phenomenon because electric field intensity in the vicinity of a drain region is alleviated, thereby preventing hot carrier injection.

The TFTs 104 and 105 included in the current mirror circuit 111 may be a bottom gate TFT, and for example, an inverted staggered TFT may be used as well as a top gate TFT. In this case, it is desirable that a gate electrode have a light-transmitting property so as not to disturb light to be received.

A wiring 214 is a wiring to be connected to the wiring 219 and extended above the channel formation region of the TFT 105 of the amplifier circuit to serve as a gate electrode.

Further, a wiring 215 is a wiring to be connected to the n-type semiconductor layer 100n and is connected to a drain wiring (also referred to as drain electrode) or a source wiring (also referred to as source electrode) of the TFT 104. Reference numeral 216 denotes an insulating film; 217, an insulating film; and 220, a connection electrode. Light to be received passes through the insulating film 216 and 217; therefore, a material having a high light-transmitting property is desirably used for all materials thereof. It is to be noted that a silicon oxide (SiOx) film formed by a CVD method is preferably used for the insulating film 217. When the silicon oxide film formed by a CVD method is used for the insulating film 217, fixing intensity is enhanced.

A terminal electrode 250 is formed in the same step as that of the wirings 214 and 215, and a terminal electrode 251 is formed in the same step as the wirings 219 and the connection electrode 220.

The terminal electrode 221 is connected to the n-type semiconductor layer 100n and is mounted on an electrode 261 of a substrate 260 by solder 264. A terminal electrode 222 is formed in the same step as the terminal electrode 221 and is mounted on an electrode 262 of the substrate 260 by solder 263.

In FIGS. 6A and 6B, light enters the photoelectric conversion layer 100 from a substrate 210 side as indicated by an arrow in the drawing, thereby generating a photoelectric current. Accordingly, light can be detected.

However, although not shown, light enters not only from a direction indicated by the arrow but also from a side opposite to the substrate 210, namely a substrate 260 side. Entering light passes through a sealing layer 224 and is reflected by an electrode or a wiring each having a light shielding property to go into the photoelectric conversion layer 100. Accordingly, a photoelectric current can also be generated.

Embodiment 1

This embodiment will be explained with reference to FIGS. 6A and 6B, FIGS. 7A to 7D, FIGS. 8A to 8D, and FIGS. 9A to 9C. It is to be noted that the same reference numerals as those explained in "BEST MODE FOR CARRYING OUT THE INVENTION" are used.

First, an element is formed over a substrate (a first substrate 210). Here, AN 100 that is one of glass substrates is used as the substrate 210.

Subsequently, a silicon oxide film containing nitrogen which serves as a base insulating film 212 (100 nm thick) is formed by a plasma CVD method, and a semiconductor film such as an amorphous silicon film containing hydrogen (54 nm thick) is stacked thereover without being exposed to atmospheric air. In addition, a silicon oxide film, a silicon nitride film, and a silicon oxide film containing nitrogen may be stacked to form the base insulating film 212. For example, a silicon nitride film containing oxygen having a thickness of 50 nm, and further, a silicon oxide film containing nitrogen having a thickness of 100 nm may be stacked to form the base insulating film 212. It is to be noted that the silicon oxide film containing nitrogen or the silicon nitride film serves as a blocking layer for preventing diffusion of an impurity such as alkali metal from a glass substrate.

Then, the amorphous silicon film is crystallized by a solid-phase growth method, a laser crystallization method, a crystallization method using a catalyst metal, or the like to form a semiconductor film having a crystal structure (a crystalline semiconductor film), for example, a polycrystalline silicon film. Here, a polycrystalline silicon film is obtained by a crystallization method using a catalyst element. A solution containing nickel of 10 ppm by weight is applied over a surface of the amorphous silicon film by a spinner. It is to be noted that a nickel element may be dispersed over the entire surface by a sputtering method instead of applying by a spinner. Then, heat treatment is conducted for crystallization to form a semiconductor film having a crystal structure (here, a polycrystalline silicon film). Here, a polycrystalline silicon film is obtained by heat treatment for crystallization (at 550° C. for 4 hours) after the heat treatment (at 500° C. for one hour).

Next, an oxide film over the surface of the polycrystalline silicon film is removed by a dilute hydrofluoric acid or the like. Thereafter, irradiation of a laser beam for raising a degree of crystallization and repairing a defect left in a crystal grain is performed.

It is to be noted that the following laser irradiation method may be employed in a case where a crystalline semiconductor film is obtained by crystallizing an amorphous silicon film by a laser crystallization method or in a case where laser irradiation is conducted to repair a defect left in a crystal grain after obtaining a semiconductor film having a crystal structure.

A continuous wave laser beam (CW laser beam) or a pulsed wave laser beam (pulsed laser beam) can be used for the laser irradiation. As the laser beam that can be used here, a beam emitted from one or more of a gas laser such as an Ar laser, a Kr laser, or an excimer laser; a laser using, as a medium, single crystalline YAG YVO$_4$, forsterite (Mg$_2$SiO$_4$), YAlO$_3$, or GdVO$_4$ or polycrystalline (ceramic) YAG, Y$_2$O$_3$, YVO$_4$, YAlO$_3$, or GdVO$_4$ doped with one or more of Nd, Yb, Cr, Ti, Ho, Er, Tm, and Ta as a dopant; a glass laser; a ruby laser; an alexandrite laser; a Ti:sapphire laser; a copper vapor laser; and a gold vapor laser, can be used. A crystal with a large grain size can be obtained by irradiation of a laser beam having a fundamental wave of such lasers or one of second, third, and fourth harmonic of the fundamental wave. For instance, the second harmonic (532 nm) or the third harmonic (355 nm) of an Nd:YVO$_4$ laser (fundamental wave of 1,064 nm) can be used. In this case, the power density of approximately 0.01 to 100 MW/cm$^2$ (preferably, 0.1 to 10 MW/cm$^2$) is required for a laser. The scanning speed is set to approximately 10 to 2000 cm/sec for the irradiation.

It is to be noted that, a laser using, as a medium, single crystalline YAC, YVO$_4$, forsterite (Mg$_2$SiO$_4$), YAlO$_3$, or GdVO$_4$ or polycrystalline (ceramic) YAG, Y$_2$O$_3$, YVO$_4$, YAlO$_3$, or GdVO$_4$ doped with one or more of Nd, Yb, Cr, Ti, Ho, Er, Tm, and Ta as a dopant; an Ar ion laser; a Kr ion laser; or a Ti:sapphire laser can be continuously oscillated. Further, pulse oscillation thereof can be performed with a repetition rate of 10 MHz or more by carrying out Q switch operation or mode synchronization. When a laser beam is oscillated with a repetition rate of 10 MHz or more, a semiconductor film is irradiated with a next pulse during the semiconductor film is melted by the laser beam and solidified. Therefore, unlike in a case of using a pulsed laser with a low repetition rate, a solid-liquid interface can be continuously moved in the semiconductor film so that crystal grains, which continuously grow toward a scanning direction, can be obtained.

When ceramic (polycrystal) is used as a medium, the medium can be formed to have a free shape in a short time at low cost. When a single crystal is used, a columnar medium with several mm in diameter and several tens of mm in length is usually used. In the case of using the ceramic, a medium bigger than the case of using the single crystal can be formed.

A concentration of a dopant such as Nd or Yb in a medium, which directly contributes to light emission, cannot be changed largely in both cases of the single crystal and the polycrystal; therefore, there is a limitation to some extent in improvement in output of a laser by increasing the concentration. However, in the case of the ceramic, the size of a medium can be significantly increased as compared with the case of the single crystal; therefore, drastic improvement in output of a laser can be expected.

Further, in the case of the ceramic, a medium with a parallel six-hedron shape or a cuboid shape can be easily formed. In a case of using a medium having such a shape, when oscillated light is made to travel in a zigzag inside the medium, a long path of the oscillated light can be obtained. Therefore, amplitude is increased and a laser beam can be oscillated at high output. Furthermore, a cross-sectional shape of a laser beam, which is emitted from a medium having such a shape, is a quadrangular shape; therefore, as compared with a laser beam with a circular shape, the laser beam with the quadrangular shape in cross section have an advantage to be shaped into a linear beam. By shaping a laser beam emitted in the above described manner using an optical system, a linear beam with 1 mm or less in length of a short side and several mm to several m in length of a long side can be easily obtained. In addition, when a medium is uniformly irradiated with excited light, a linear beam is emitted with an uniform energy distribution in a long side direction.

When a semiconductor film is irradiated with such a linear beam, an entire surface of the semiconductor film can be uniformly annealed. In a case where uniform annealing is required from one end to the other end of the linear beam, an ingenuity in which slits are disposed on the both ends of the linear beam so as to shield an attenuated portion of energy from light, or the like is required.

In a case where the laser irradiation is conducted in atmospheric air or an oxygen atmosphere, an oxide film is formed over the surface by the irradiation of a laser beam.

Then, in addition to the oxide film formed by the laser beam irradiation, a barrier layer made of an oxide film having a thickness of 1 to 5 nm in total is formed by treating the surface with ozone water for 120 seconds. The barrier layer is formed in order to remove a catalyst element, which is added for crystallization, such as nickel (Ni) from the film. Although the barrier layer is formed by using ozone water here, a barrier layer may also be formed by depositing an oxide film having a thickness of approximately 1 to 10 nm by using a method of oxidizing a surface of a semiconductor film having a crystal structure by UV-ray irradiation in an oxygen atmosphere; a method of oxidizing a surface of a semiconductor film having a crystal structure by oxygen plasma treatment; a plasma CVD method; a sputtering method; an evaporation method; or the like. In addition, before forming the barrier layer, the oxide film formed by laser beam irradiation may be removed.

Then, over the barrier layer, an amorphous silicon film containing an argon element is formed to have a thickness of 10 nm to 400 nm, for example 100 nm here, by a sputtering method to serve as a gettering site. Here, the amorphous silicon film containing an argon element is formed in an atmosphere containing argon using a silicon target. When a plasma CVD method is used to form the amorphous silicon film containing an argon element, the deposition condition is as follows: a flow ratio of monosilane to argon ($SiH_4$:Ar) is set to be 1:99; deposition pressure is set to be 6.665 Pa; the RF power density is set to be 0.087 W/cm$^2$; and a deposition temperature is set to be 350° C.

Thereafter, a furnace heated to 650° C. is used for heat treatment for three minutes to remove a catalyst element (gettering). By this treatment, the catalyst element concentration in the semiconductor film having a crystal structure is reduced. A lamp annealing apparatus may also be used instead of the furnace.

Subsequently, the amorphous silicon film containing an argon element, which is a gettering site, is selectively removed with the barrier layer as an etching stopper, and then, the barrier layer is selectively removed by dilute hydrofluoric acid. It is to be noted that there is a tendency that nickel is likely to move to a region with a high oxygen concentration in gettering, and thus, it is desirable that the barrier layer made of the oxide film be removed after gettering.

It is to be noted that, in the case where crystallization of a semiconductor film using a catalytic element is not performed, the above described steps such as the formation of the barrier layer, the formation of the gettering site, the heat treatment for gettering, the removal of the gettering site, and the removal of the barrier layer are not required.

Figure 7A:
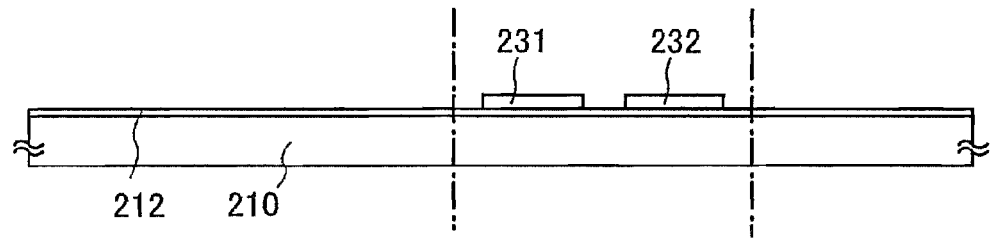
FIGS. 7A to 7D are views showing a manufacturing process of a photoelectric conversion device of the present invention.

Then, after a thin oxide film is formed with ozone water over the surface of the obtained semiconductor film having a crystal structure (such as a crystalline silicon film), a mask made of resist is formed by using a first photomask, and etching treatment is conducted to obtain a desired shape, thereby forming semiconductor films 231 and 232 separated in island shapes (referred to as "island-like semiconductor region" in this specification) (refer to FIG. 7A). After forming the island-like semiconductor regions, the mask made of resist is removed.

Subsequently, if necessary, doping of the very small amount of an impurity element (boron or phosphorus) is performed to control the threshold value of a TFT. Here, ion doping is used, in which diborane ($B_2H_6$) is not separated by mass but excited by plasma.

Next, the oxide film is removed with an etchant containing hydrofluoric acid, and at the same time, the surfaces of the island-like semiconductor regions 231 and 232 are washed. Thereafter, an insulating film containing silicon as its main component, which serves as a gate insulating film 213, is formed. Here, a silicon oxide film containing nitrogen (composition ratio: Si=32%, O=59%, N=7%, H=2%) is formed to have a thickness of 115 nm by a plasma CVD method.

Figure 7B:
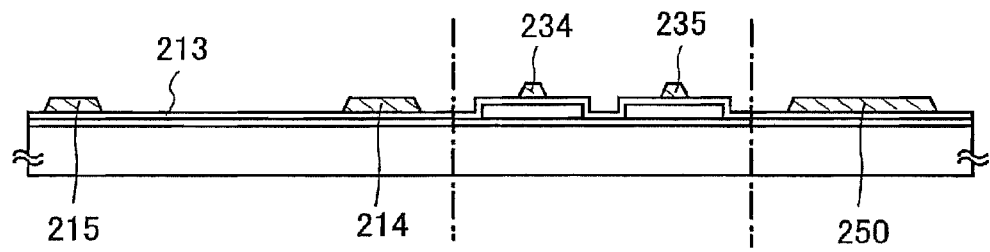
Figure 7C:
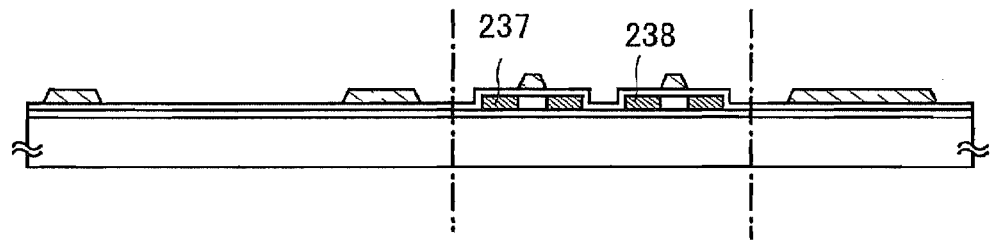

Then, after a metal film is formed over the gate insulating film 213, a second photomask is used to form gate electrodes 234 and 235, wirings 214 and 215, and a terminal electrode 250 (refer to FIG. 7B). For example, as the metal film, a film which is formed by stacking tantalum nitride (TaN) and tungsten (W) to be 30 nm and 370 nm, respectively, is used.

In addition to the above described materials, as the gate electrodes 234 and 235, the wirings 214 and 215, and the terminal electrode 250, a single-layer film made of an element selected from titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), platinum (Pt), aluminum (Al), gold (Au), silver (Ag), or copper (Cu), or an alloy material or a compound material containing the above element as its main component; or a single-layer film made of nitride thereof such as titanium nitride, tungsten nitride, tantalum nitride, or molybdenum nitride can be used.

Then, an impurity imparting one conductivity type is introduced to the island-like semiconductor regions 231 and 232 to form a source region or a drain region 237 of a TFT 105, or a source region or a drain region 238 of a TFT 104. An n-channel TFT is formed in this embodiment; therefore, n-type impurity, for example phosphorus (P) or arsenic (As), is introduced to the island-like semiconductor regions 231 and 232 (refer to FIG. 7C).

Subsequently, after a first interlayer insulating film including a silicon oxide film (not shown) is formed to have a thickness of 50 nm by a CVD method, a step for activation treatment of an impurity element added to each island-like semiconductor region is conducted. The activation step is conducted by a rapid thermal annealing method (RTA method) using a lamp light source, a method of irradiation of a YAG laser or an excimer laser from the back side, heat treatment using a furnace, or a method which is a combination of any of the foregoing methods.

Next, a second interlayer insulating film 216 including a silicon nitride film containing hydrogen and oxygen is formed to have a thickness of, for example, 10 nm.

Figure 7D:
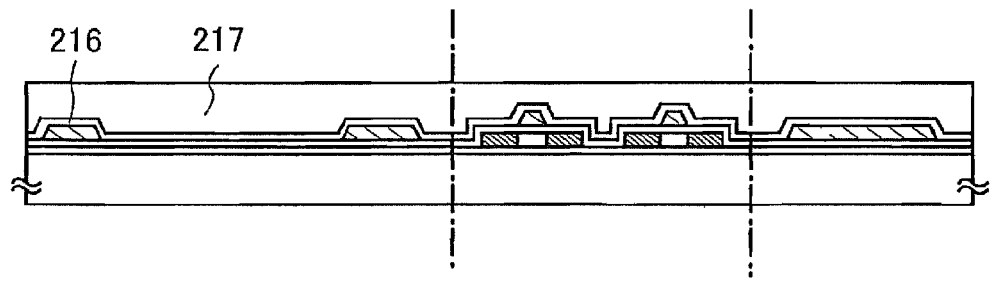

Subsequently, a third interlayer insulating film 217 made of an insulator material is formed over the second interlayer insulating film 216 (refer to FIG. 7D). An insulating film obtained by a CVD method can be used for the third interlayer insulating film 217. In this embodiment, in order to improve adhesiveness, a silicon oxide film containing nitrogen is formed to have a thickness of 900 nm as the third interlayer insulating film 217.

Then, heat treatment (heat treatment at 300 to 550° C. for 1 to 12 hours, for example, at 410° C. for one hour in a nitrogen atmosphere) is conducted to hydrogenate the island-like semiconductor films. This step is conducted to terminate a dangling bond in the island-like semiconductor films by hydrogen contained in the second interlayer insulating film 216. The island-like semiconductor films can be hydrogenated regardless of whether or not the gate insulating film 213 is formed.

In addition, as the third interlayer insulating film 217, an insulating film using siloxane and a stacked structure thereof can also be used. Siloxane is composed by a skeleton structure of a bond of silicon (Si) and oxygen (O). As a substituent, a compound containing at least hydrogen (such as an alkyl group or an aromatic hydrocarbon) is used. Fluorine may also be used as the substituent. Moreover, a compound containing at least hydrogen and fluorine may be used as the substituent.

When an insulating film using siloxane and a stacked structure thereof are used as the third interlayer insulating film 217, after fowling the second interlayer insulating film 216, heat treatment for hydrogenating the island-like semiconductor films can be conducted, and then, the third interlayer insulating film 217 can be formed.

Then, a mask made of resist is formed by using a third photomask, and the first interlayer insulating film, the second interlayer insulating film 216, and the third interlayer insulating film 217, or the gate insulating film 213 are selectively etched to form a contact hole. Then, the mask made of resist is removed.

It is to be noted that the third interlayer insulating film 217 may be formed if necessary. When the third interlayer insulating film 217 is not formed, after forming the second interlayer insulating film 216, the first interlayer insulating film, the second interlayer insulating film 216, and the gate insulating film 213 are selectively etched to form a contact hole.

Subsequently, after forming a metal stacked film by a sputtering method, a mask made of resist is formed by using a fourth photomask, and then, the metal film is selectively etched to form a wiring 219, a connection electrode 220, a terminal electrode 251, a source or drain electrode 241 of the TFT 104, and a source or drain electrode 242 of the TFT 105. Then, the mask made of resist is removed. It is to be noted that the metal film of this embodiment has a stacked structure of three layers of a Ti film having a thickness of 100 nm, an Al film containing the small amount of Si having a thickness of 350 nm, and a Ti film having a thickness of 100 nm.

Figure 8A:
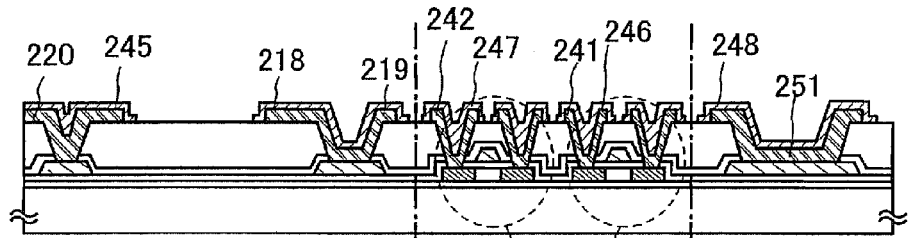
FIGS. 8A to 8D are views showing a manufacturing process of a photoelectric conversion device of the present invention.

Then, after a conductive metal film (such as titanium (Ti) or molybdenum (Mo)) is formed, which is not likely to react with a photoelectric conversion layer, which is to be formed later (typically, amorphous silicon), to be an alloy, a mask made of resist is formed by using a fifth photomask, and the conductive metal film is selectively etched to form a protective electrode 218 covering the wiring 219 (refer to FIG. 8A). A Ti film having a thickness of 200 nm obtained by a sputtering method is used here. Similarly, the connection electrode 220, the terminal electrode 251, the source or drain electrode 241 of the TFT 104, and the source or drain electrode 242 of the TFT 105 are also covered with the conductive metal film to form a protective electrode 245, a protective electrode 248, a protective electrode 246, and a protective electrode 247, respectively. Therefore, the conductive metal film also covers a side face where an Al film which is a second layer in these electrodes is exposed, thereby preventing diffusion of an aluminum atom into the photoelectric conversion layer.

However, protective electrodes may not be formed in a case where the wiring 219, the connection electrode 220, the terminal electrode 251, the source or drain electrode 241 of the TFT 104, and the source or drain electrode 242 of the TFT 105 are formed by a single-layer conductive film, namely a case where, instead of the electrode or wiring, a wiring 284, a connection electrode 285, a terminal electrode 281, a source or drain electrode 282 of the TFT 104, and a source or drain electrode 283 of the TFT 105 are formed as shown in FIG. 6B.

Figure 8B:
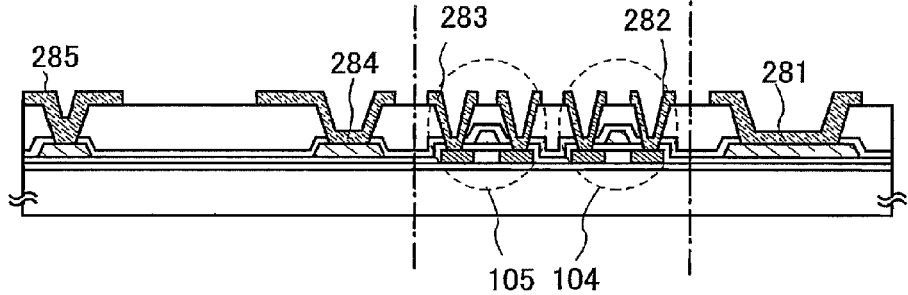

FIG. 8B shows such a structure. In a case where a wiring 284, a connection electrode 285, a terminal electrode 281, a source or drain electrode 282 of a TFT 104, and a source or drain electrode 283 of a TFT 105 are made of a single-layer conductive film, a titanium film (Ti film) is preferable in terms of heat resistance, conductivity, and the like. Instead of the titanium film, a single-layer film made of an element selected from tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), and platinum (Pt), or an alloy material or a compound material containing the above element as its main component, or a single-layer film made of nitride thereof, for example, titanium nitride, tungsten nitride, tantalum nitride, or molybdenum nitride can be used. The number of deposition can be reduced in the manufacturing process by forming the wiring 284, the connection electrode 285, the terminal electrode 281, the source or drain electrode 282 of the TFT 104, and the source or drain electrode 283 of the TFT 105 with a single-layer film.

Next, a photoelectric conversion layer 100 including a p-type semiconductor layer 100p, an i-type semiconductor layer 100i, and an n-type semiconductor layer 100n is formed over the third interlayer insulating film 217.

The p-type semiconductor layer 100p may be formed by forming an amorphous silicon film containing an impurity element belonging to Group 13, for example, boron (B) by a plasma CVD method.

The wiring 219 and the protective electrode 218 are electrically connected to a lowest layer in the photoelectric conversion layer 100, in this embodiment, the p-type semiconductor layer 100p.

Although not shown, in a case where the wiring 284, the connection electrode 285, the terminal electrode 281, the source or drain electrode 282 of the 104, and the source or drain electrode 283 of the TFT 105 are formed with a single-layer conductive film without forming protective electrodes as shown in FIG. 8B, the lowest layer in the photoelectric conversion layer 100 is in contact with the wiring 284 over the wiring 284.

After forming the p-type semiconductor layer 100p, the i-type semiconductor layer 100i and the n-type semiconductor layer 100n are further formed in this order. Accordingly, the photoelectric conversion layer 100 including the p-type semiconductor layer 100p, the i-type semiconductor layer 100i, and the n-type semiconductor layer 100n is formed.

As the i-type semiconductor layer 100i, an amorphous silicon film may be formed by, for example, a CVD method. As the n-type semiconductor layer 100n, an amorphous silicon film including an impurity element belonging to Group 15, such as phosphorus (P) may be formed, or after an amorphous silicon film is formed, an impurity element belonging to Group 15 may be introduced.

As the p-type semiconductor layer 100p, the intrinsic semiconductor layer 100i, and the n-type semiconductor layer 100n, a semiamorphous semiconductor film may be used as well as the amorphous semiconductor film.

Figure 8C:
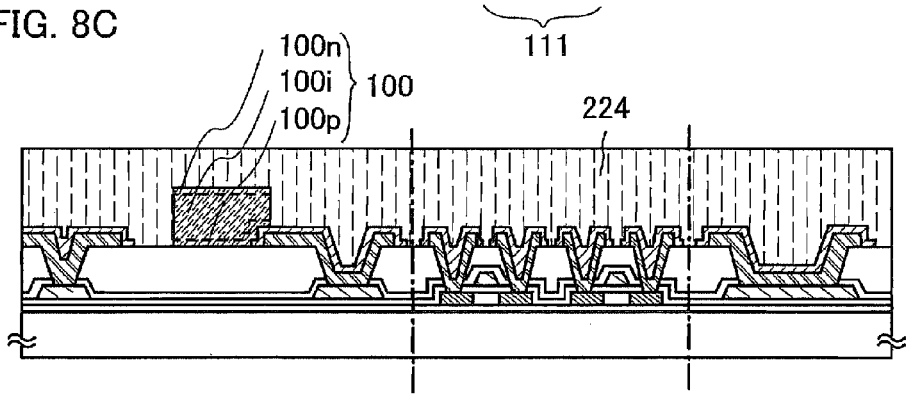

Then, a sealing layer 224 made of an insulator material (for example, an inorganic insulating film containing silicon) is formed to have a thickness of 1 to 30 pin over the entire surface, and a state of FIG. 8C is obtained. Here, a silicon oxide film containing nitrogen having a thickness of 1 μm is formed by a CVD method as the insulator material film. It is intended that adhesiveness be improved by using the insulating film formed by a CVD method.

Next, after the sealing layer 224 is etched to provide an opening, terminal electrodes 221 and 222 are formed by a sputtering method. The terminal electrodes 221 and 222 are made of a stacked film of a titanium film (Ti film, 100 nm), a nickel film (Ni film, 300 nm), and a gold film (Au film, 50 nm). The fixing intensity of the terminal electrodes 221 and 222 obtained as described above is more than 5N, which is sufficient fixing intensity for a terminal electrode.

Figure 8D:
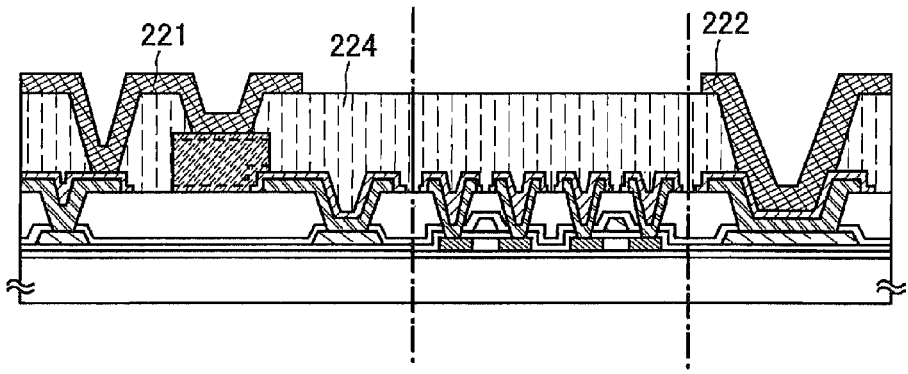

Through the above described steps, the terminal electrodes 221 and 222 that can be connected with solder are formed, and a structure shown in FIG. 8D is obtained.

Subsequently, a plurality of light sensor chips is cut out by cutting the substrate into individual pieces. A large number of light sensor chips (2 mm×1.5 mm) can be manufactured from one large-area substrate (for example, 600 cm×720 cm).

Figure 9A:
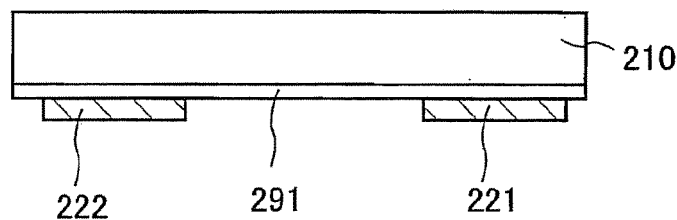
FIGS. 9A to 9C are views showing a manufacturing process of a photoelectric conversion device of the present invention.
Figure 9B:
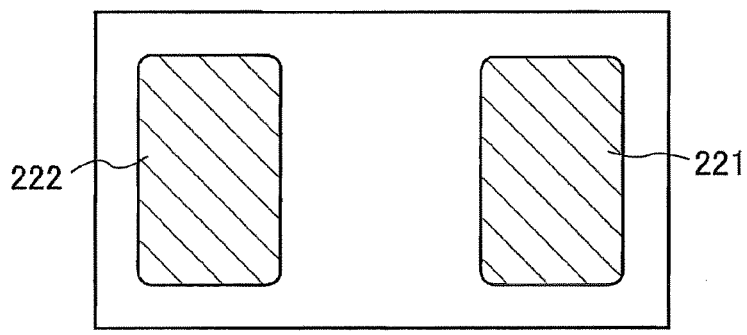
Figure 9C:
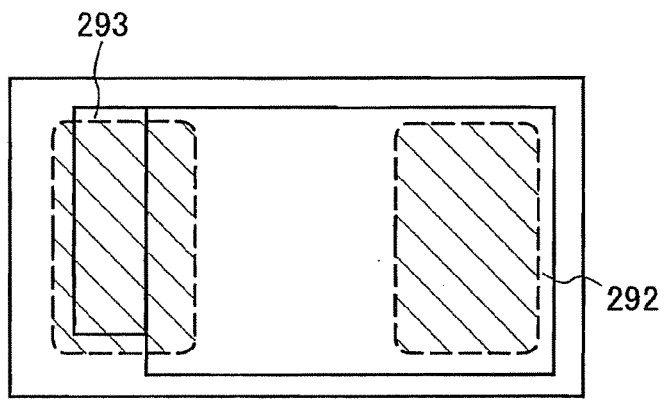

A cross-sectional view of one light sensor chip (2 mm×1.5 mm) that is cut out is shown in FIG. 9A, a bottom view thereof is shown in FIG. 9B, and a top view thereof is shown in FIG. 9C. In FIGS. 9A to 9C, the same reference numerals as in FIGS. 6A to 6C, FIGS. 7A to 7C, and FIGS. 8A to 8D are used for the same portions. It is to be noted that, in FIG. 9A, a thickness of the substrate 210, an element formation region 291, the terminal electrodes 221 and 222 in total is 0.8±0.05 mm.

In addition, in order to make the total thickness of the light sensor chip thinner, a plurality of light sensor chips may be cut out by cutting the substrate into individual pieces using a dicer after the substrate 210 is ground and thinned by CMP treatment or the like.

In FIG. 9B, the electrode size of one of the terminal electrodes 221 and 222 is 0.6 mm×1.1 mm, and the electrode interval is 0.4 mm. In addition, in FIG. 9C, the area of a light receiving portion 292 is 1.57 mm$^2$. Further, an amplifier circuit portion 293 is provided with approximately 100 TFTs.

Finally, the obtained light sensor chip is mounted on the mounting side of the substrate 260. Solder 264 and 263 are used for connecting the terminal electrode 221 to the electrode 261, and the terminal electrode 222 to the electrode 262, respectively. The solder is formed in advance by a screen printing method or the like over the electrodes 261 and 262 of the substrate 260, and the solder and the terminal electrode are made in an abutted state to conduct mounting by reflow soldering treatment. The reflow soldering treatment is conducted, for example, at approximately 255 to 265° C. for about 10 seconds in an inert gas atmosphere. Further, as well as the solder, a bump made of metal (such as gold or silver), a bump made of a conductive resin, or the like can be used. In addition, lead-free solder may also be used for mounting in consideration of an environmental problem.

It is to be noted that this embodiment can be combined with any descriptions of Embodiment Mode.

Embodiment 2

In this embodiment, an example in which an amplifier circuit is made of a p-channel TFT will be explained with reference to FIG. 5 and FIGS. 10A and 10B. It is to be noted that the same portions as those in Embodiment Mode and Embodiment 1 are denoted by the same reference numerals, and the same portions may be formed on the basis of the manufacturing process described in Embodiment Mode and Embodiment 1.

In a case where an amplifier circuit, for example, a current mirror circuit 203 is made of p-channel TFTs 201 and 202, a p-type impurity, for example, boron (B) may be substituted for the impurity imparting one conductivity type to the island-like semiconductor region in Embodiment Mode and Embodiment 1.

Figure 10A:
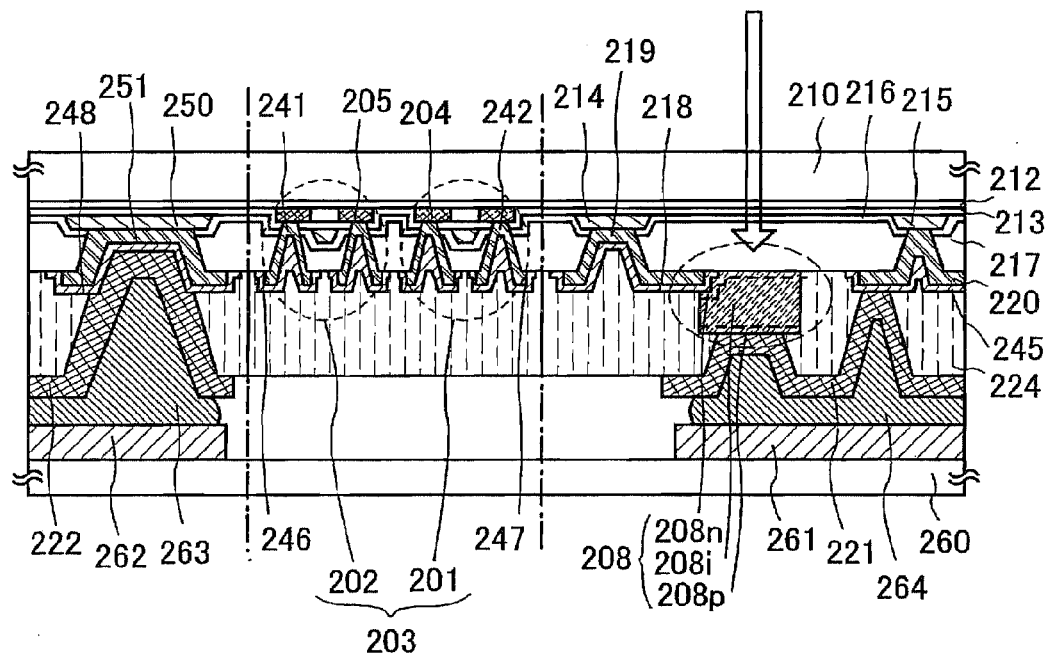
FIGS. 10A and 10B are views showing a manufacturing process of a photoelectric conversion device of the present invention.
Figure 10B:
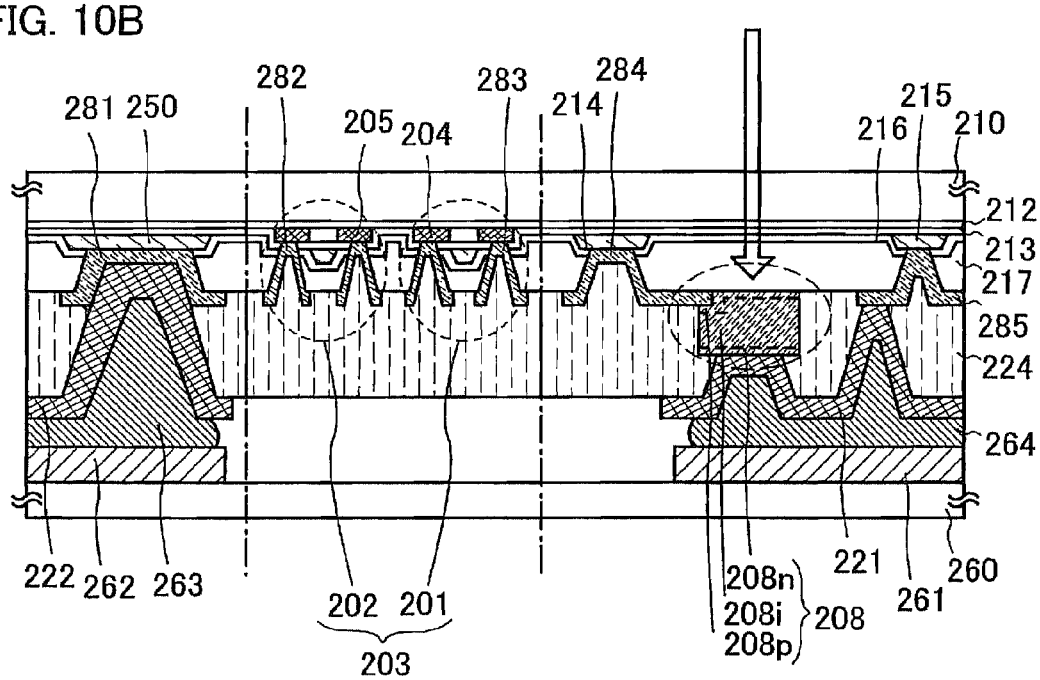

An equivalent circuit diagram of a light sensor of this embodiment in which the current mirror circuit 203 is made of the p-channel TFTs 201 and 202 is shown in FIG. 5, and cross-sectional views thereof are shown in FIGS. 10A and 10B.

In FIG. 5 and FIG. 10A, terminal electrodes 221 and 222 are connected to a photoelectric conversion layer 208 and the p-channel TFTs 201 and 202, respectively. The p-channel TFT 201 is electrically connected to an electrode at an anode side of the photoelectric conversion layer 208. After an n-type semiconductor layer 208n, an i-type semiconductor layer 208i, and a p-type semiconductor layer 208p are sequentially stacked over a second electrode (electrode at an anode side) which is connected to the p-channel TFT 201, a first electrode (electrode at a cathode side) may be formed; accordingly, the photoelectric conversion layer 204 is formed.

In addition, a photoelectric conversion layer in which the stacking order is reversed may also be used. After the p-type semiconductor layer, the i-type semiconductor layer, and the n-type semiconductor layer are sequentially stacked over the first electrode (electrode at the cathode side), the second electrode (electrode at the anode side) which is connected to the p-channel TFT 201 may be formed and the terminal electrode at the cathode side which is connected to the first electrode may also be formed.

As shown in FIG. 10A, a p-type impurity, for example, boron (B) is introduced to island-like semiconductor regions of the p-channel TFTs 201 and 202. A source or drain region 204 is formed in the p-channel TFT 201, and a source or drain region 205 is formed in the p-channel TFT 202.

As shown in FIG. 10B, instead of a wiring 219 and a protective electrode 218 thereof; a connection electrode 220 and a protective electrode 245 thereof; a terminal electrode 251 and a protective electrode 248 thereof; a source or drain electrode 242 of the TFT 201 and a protective electrode 247 thereof; and a source or drain electrode 241 of the TFT 202 and a protective electrode 246 thereof, each wiring and electrode may be formed by using a single-layer conductive film. Accordingly, a wiring 284, a connection electrode 285, a terminal electrode 281, a source or drain electrode 283 of the TFT 201, and a source or drain electrode 282 of the TFT 202 are formed.

It is to be noted that that this embodiment can be combined with any description in Embodiment Mode and Embodiment 1.

Embodiment 3

In this embodiment, an example of a light sensor in which an amplifier circuit is formed by using a bottom gate TFT and a manufacturing method thereof will be explained with reference to FIGS. 11A to 11E, FIGS. 12A to 12D, and FIGS. 13A and 13B. It is to be noted that the same portions as those in Embodiment Mode and Embodiments 1 and 2 are denoted by the same reference numerals.

Figure 11A:
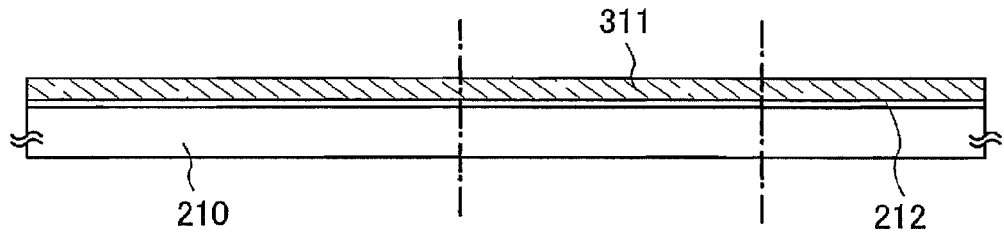
FIGS. 11A to 11E are views showing a manufacturing process of a photoelectric conversion device of the present invention.

First, a base insulating film 212 and a metal film 311 are formed over a substrate 210 (refer to FIG. 11A). As the metal film 311, in this embodiment, a film in which tantalum nitride (TaN) having a thickness of 30 nm and tungsten (W) having a thickness of 370 nm are stacked is used, for example.

In addition, as the metal film 311, as well as the above film, a single-layer film made of an element selected from titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), platinum (Pt), aluminum (Al), gold (Au), silver (Ag), or copper (Cu), or an alloy material or a compound material containing the above element as its main component; or a single-layer film made of nitride thereof such as titanium nitride, tungsten nitride, tantalum nitride, or molybdenum nitride can be used.

It is to be noted that the metal film 311 may be formed directly on the substrate 210 without forming the base insulating film 212 over the substrate 210.

Figure 11B:
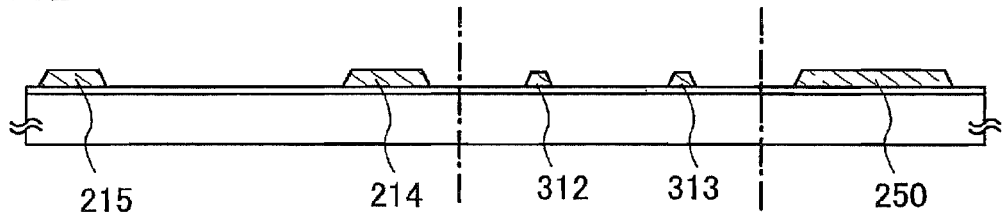
Figure 11C:
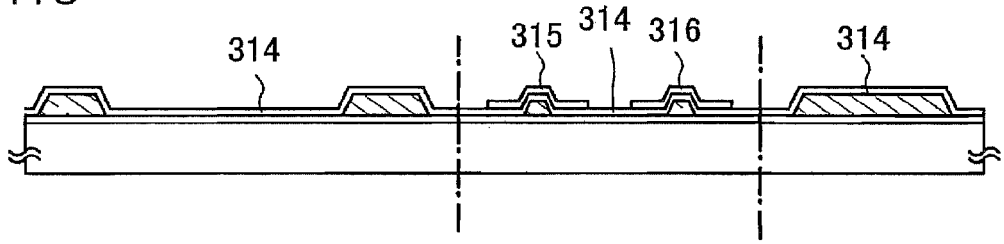

Next, the metal film 311 is used to form gate electrodes 312 and 313, wirings 214 and 215, and a terminal electrode 250 (refer to FIG. 11B).

Subsequently, a gate insulating film 314, which covers the gate electrodes 312 and 313, the wirings 214 and 215, and the terminal electrode 250, is formed. In this embodiment, the gate insulating film 314 is formed by using an insulating film containing silicon as its main component, for example, a silicon oxide film containing nitrogen (composition ratio: Si=32%, O=59%, N=7%, H=2%) having a thickness of 115 nm by a plasma CVD method.

Next, island-like semiconductor regions 315 and 316 are formed over the gate insulating film 314. The island-like semiconductor regions 315 and 316 may be formed by the similar material and manufacturing process to those of the island-like semiconductor regions 231 and 232 described in Embodiment 2 (refer to FIG. 11C).

Figure 11D:
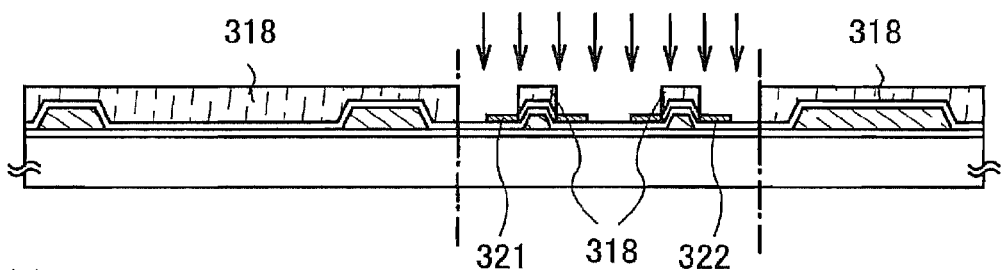

After the island-like semiconductor regions 315 and 316 are formed, a mask 318 is formed covering portions except for regions which subsequently become a source or drain region 321 of a TFT 301 and a source or drain region 322 of a TFT 302 to introduce an impurity imparting one conductivity type (refer to FIG. 11D). As the one conductivity type impurity, in a case of forming an n-channel TFT, phosphorus (P) or arsenic (As) may be used as an n-type impurity, whereas in a case of forming a p-channel TFT, boron (B) may be used as a p-type impurity. In this embodiment, phosphorus (P) which is an n-type impurity is introduced to the island-like semiconductor regions 315 and 316 to form the source or drain region 321 of the TFT 301 and a channel formation region between the source region and drain region; and the source or drain region 322 of the TFT 302 and a channel formation region between the source region and the drain region.

Figure 11E:
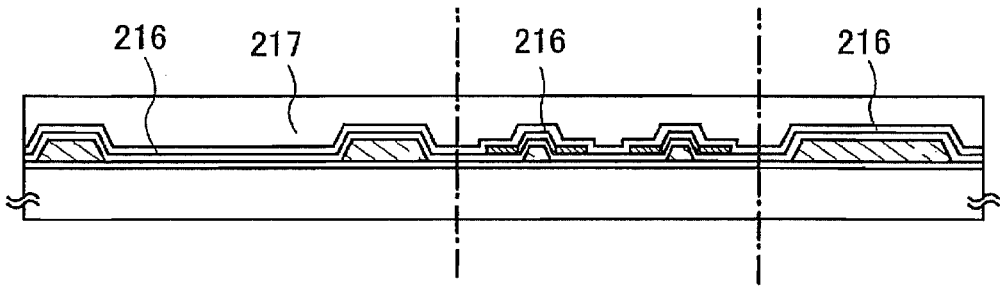

Next, the mask 318 is removed, and a first interlayer insulating film which is not shown, a second interlayer insulating film 216, and a third interlayer insulating film 217 are formed (refer to FIG. 11E). A material and a manufacturing process of the first interlayer insulating film, the second interlayer insulating film 216, and the third interlayer insulating film 217 may be based on the description in Embodiment 2.

Contact holes are formed in the first interlayer insulating film, the second interlayer insulating film 216, and the third interlayer insulating film 217, and a metal film is formed, and further, the metal film is selectively etched to form a wiring 219, a connection electrode 220, a terminal electrode 251, a source or drain electrode 331 of the TFT 301, and a source or drain electrode 332 of the TFT 302. Then, the mask made of resist is removed. It is to be noted that the metal film in this embodiment is a film in which three layers of a Ti film having a thickness of 100 nm, an Al film containing a very small amount of Si having a thickness of 350 nm, and a Ti film having a thickness of 100 nm are stacked.

Further, a protective electrode 218, a protective electrode 245, a protective electrode 248, a protective electrode 336, and a protective electrode 337 are formed so as to cover the wiring 219, the connection electrode 220, the terminal electrode 251, the source or drain electrode 331 of the TFT 301, and the source or drain electrode 332 of the TFT 302, respectively.

Figure 12A:
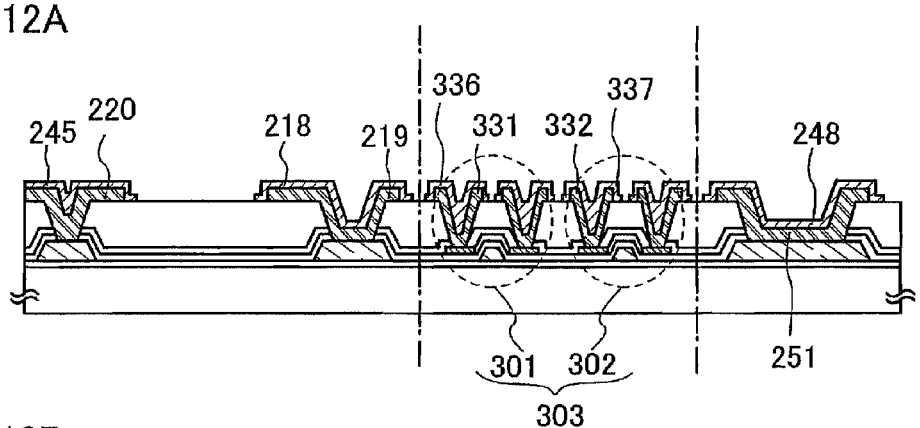
FIGS. 12A and 12D are views showing a manufacturing process of a photoelectric conversion device of the present invention.
Figure 12B:
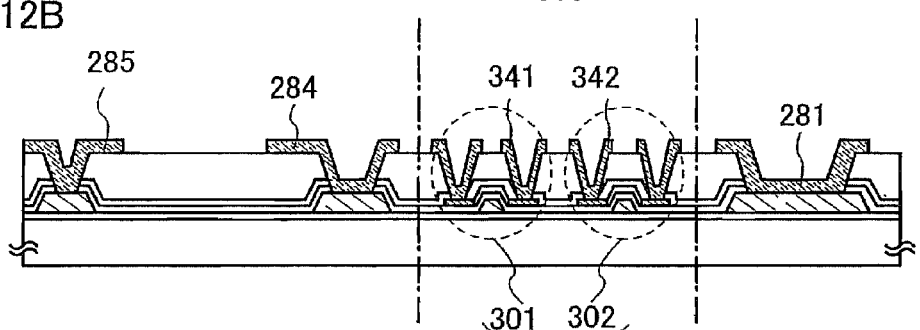

In addition, instead of the wiring 219 and the protective electrode 218 thereof; the connection electrode 220 and the protective electrode 245 thereof; the terminal electrode 251 and the protective electrode 248 thereof; the source or drain electrode 331 of the TFT 301 and the protective electrode 336 thereof; and the source or drain electrode 332 of the TFT 302 and the protective electrode 337 thereof, each wiring and electrode may be formed by using a single-layer conductive film. As shown in FIG. 12B, a wiring 284, a connection electrode 285, a terminal electrode 281, a source or drain electrode 341 of the TFT 301, and a source or drain electrode 342 of the TFT 302 are formed.

Through the above described steps, bottom gate TFTs 301 and 302 can be manufactured.

Figure 12C:
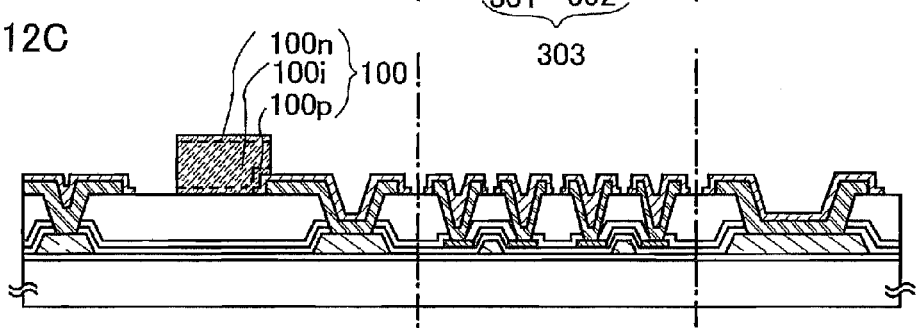

Subsequently, a photoelectric conversion layer 100 including a p-type semiconductor layer 100p, an i-type semiconductor layer 100i, and an n-type semiconductor layer 100n is formed over the third interlayer insulating film 217 (FIG. 12C). Embodiment Mode and Embodiment 1 may be referred to for a material, a manufacturing process, or the like of the photoelectric conversion layer 100.

Figure 12D:
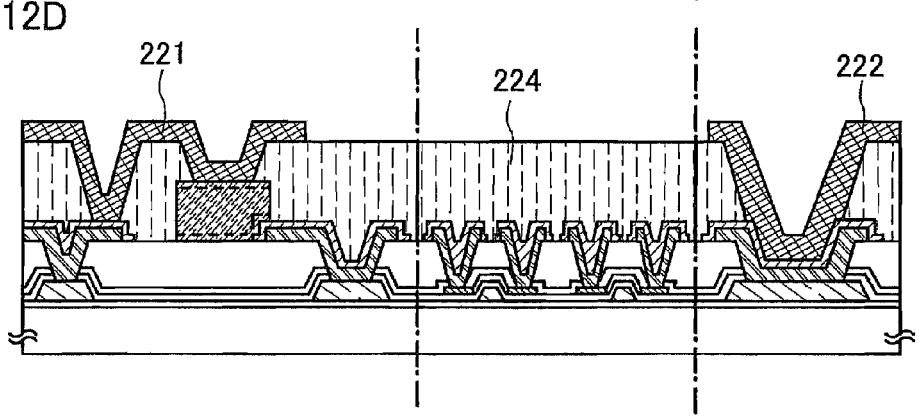

Next, a sealing layer 224 and terminal electrodes 221 and 222 are formed (refer to FIG. 12D). The terminal electrode 221 is connected to the n-type semiconductor layer 100n, and the terminal electrode 222 is formed by the same process as the terminal electrode 221.

Moreover, a substrate 260 having electrodes 261 and 262 is mounted by solder 263 and 264. It is to be noted that the electrode 261 over the substrate 260 is mounted on the terminal electrode 221 by the solder 264. In addition, the electrode 262 over the substrate 260 is mounted on the terminal electrode 222 by the solder 263 (refer to FIG. 13A).

Figure 13A:
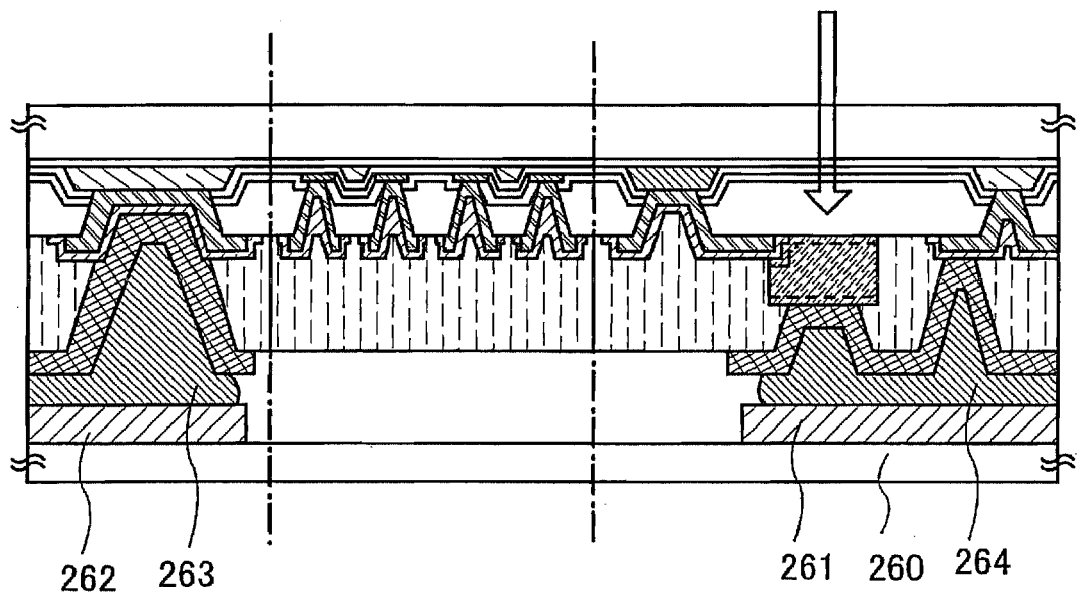
FIGS. 13A and 13B are cross-sectional views of a photoelectric conversion device of the present invention.
Figure 13B:
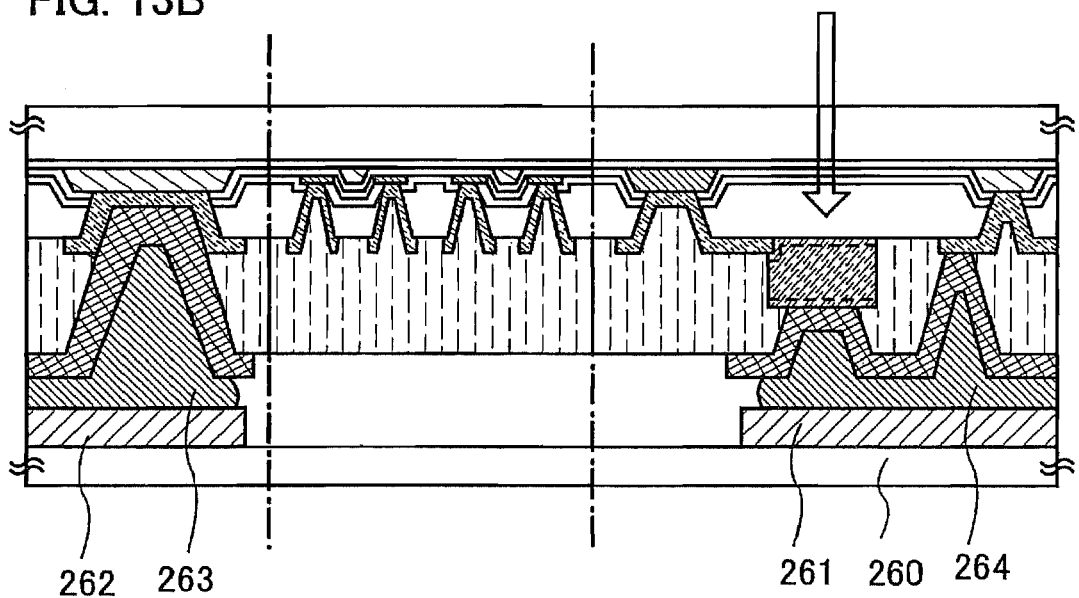
Figure 14:
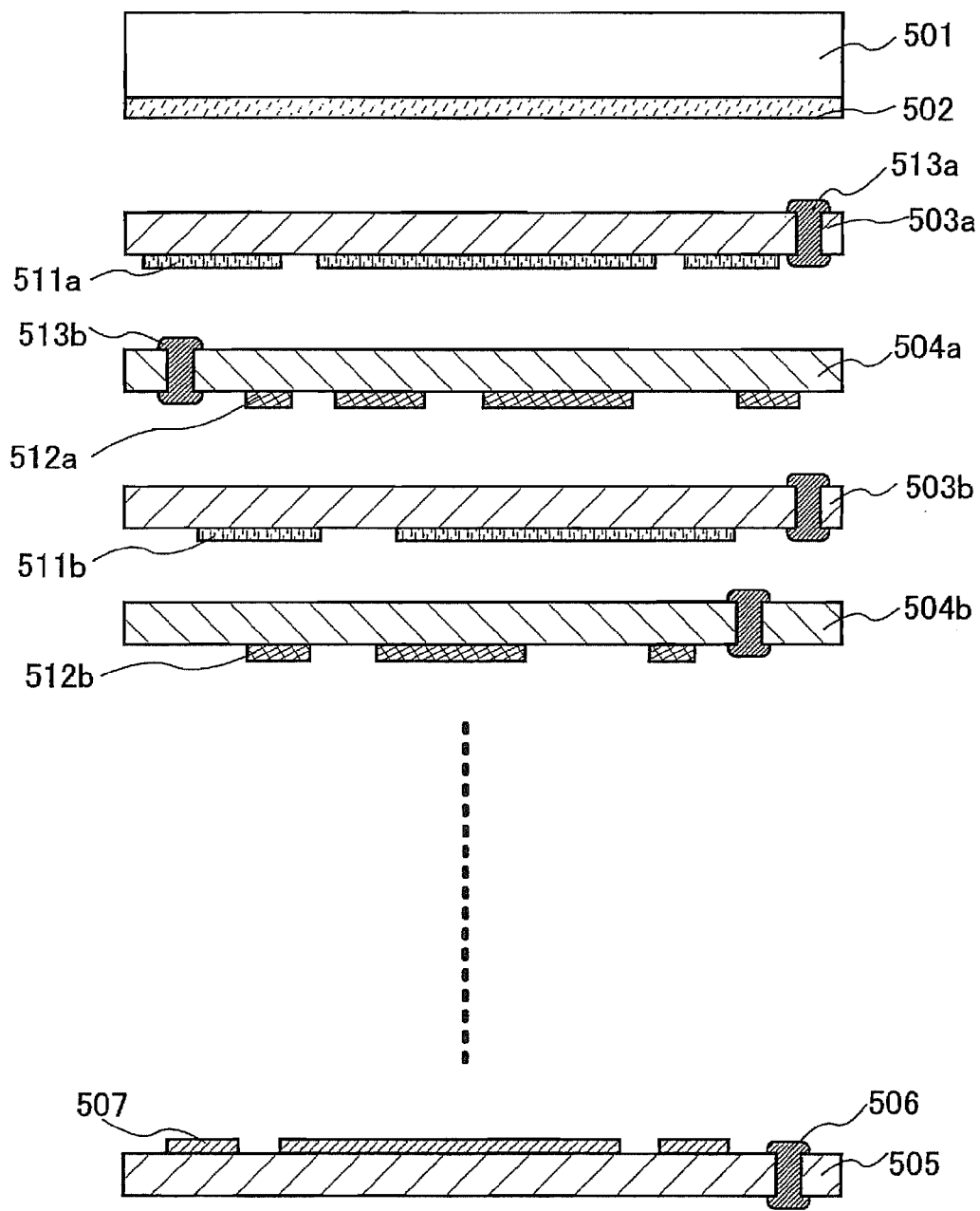
FIG. 14 is a view showing a manufacturing process of a photoelectric conversion device of the present invention.
Figure 15:
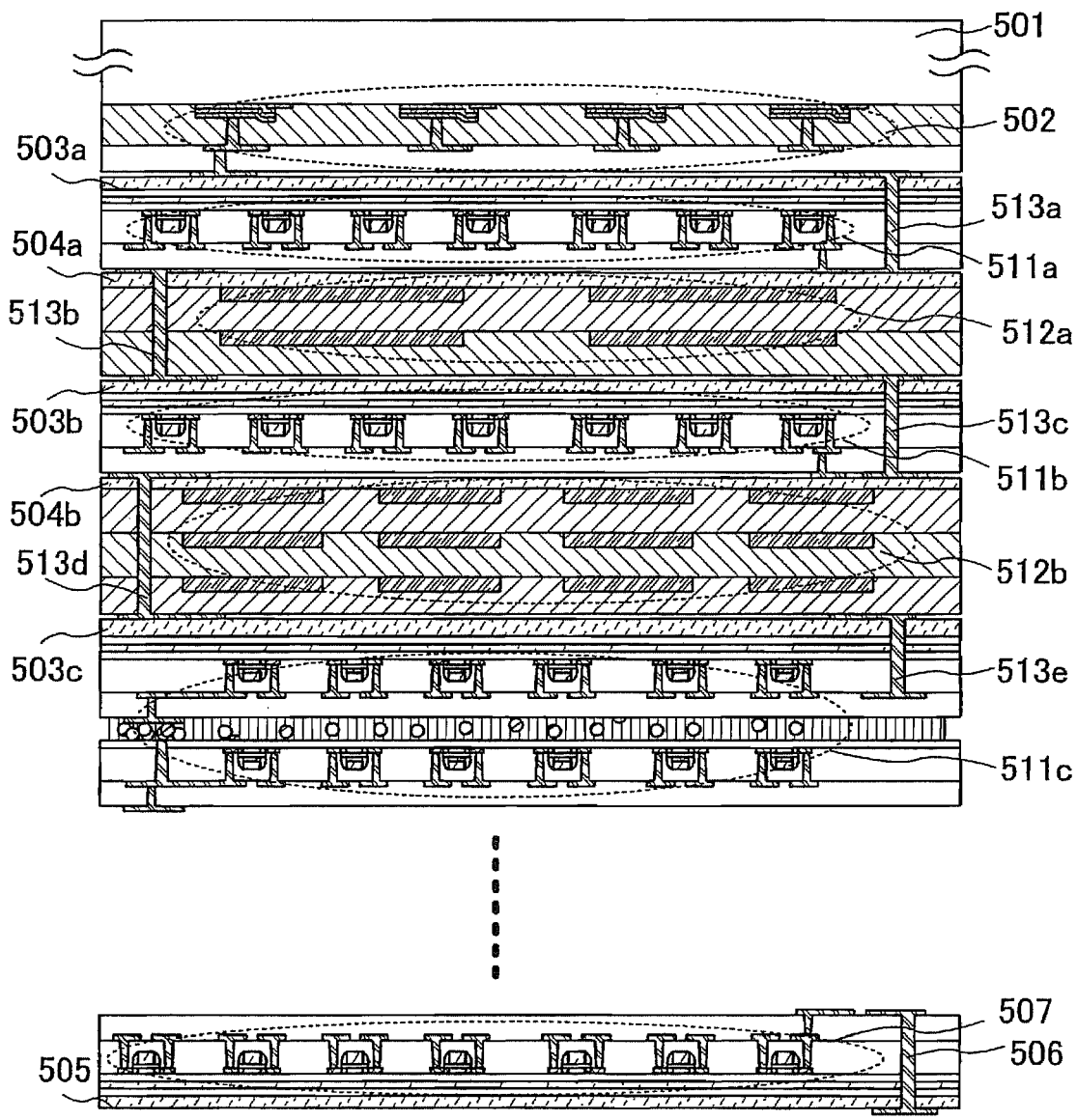
FIG. 15 is a view showing a manufacturing process of a photoelectric conversion device of the present invention.

It is to be noted that FIG. 13B shows an example in which the substrate 260 having the electrodes 261 and 262 is mounted on the structure shown in FIG. 12C.

It is to be noted that this embodiment can be combined with any description in Embodiment Mode and Embodiments 1 and 2.

Embodiment 4

In this embodiment, a semiconductor device having a photoelectric conversion element, a passive element formed by using a thick film circuit element, and an active element formed by using a thin film circuit element will be explained with reference to FIG. 14, FIG. 15, FIGS. 16A to 16E, FIGS. 17A to 17F, FIGS. 18A and 18B, FIGS. 19A to 19C, FIGS. 20A and 20B, FIGS. 21A to 21C, FIGS. 22A to 22C, FIGS. 23A to 23C, FIGS. 24A and 24B, and FIGS. 25A to 25C.

A semiconductor device shown in FIG. 14, FIG. 15, and FIGS. 16A to 16E is manufactured by combining a photoelectric conversion element substrate 501, a thin film circuit element substrate 503 (503a, 503b . . . ), and a thick film circuit element substrate 504 (504a, 504b . . . ). It is to be noted that a thick film element denotes an element formed by a screen printing method, an ink-jet method, or the like.

A photoelectric conversion region 502 having a plurality of photoelectric conversion elements 521 is formed over the photoelectric conversion element substrate 501. The photoelectric conversion region 502 is electrically connected to another substrate with a terminal electrode 562. As the photoelectric conversion elements 521, the photo diode 103 described in Embodiment 1 or the photoelectric conversion device described in Embodiment 2 and 3 can be used.

Thin film circuits 511 (511a, 511b, 511c . . . ) including a plurality of thin film circuit elements 522 are formed in a plurality of the thin film circuit element substrates 503, respectively. The thin film circuit 511 is a circuit including an element formed by a thin film such as a thin film transistor (TFT) circuit, a thin film diode, or the like. The current mirror circuit 111 or the switch 102 shown in FIG. 1 may be formed by this thin film circuit 511. In addition, the thin film circuit 511 is electrically connected to another substrate with a connection electrode 513 (in this embodiment, 513a, 513c, and 513e).

Figure 16A:
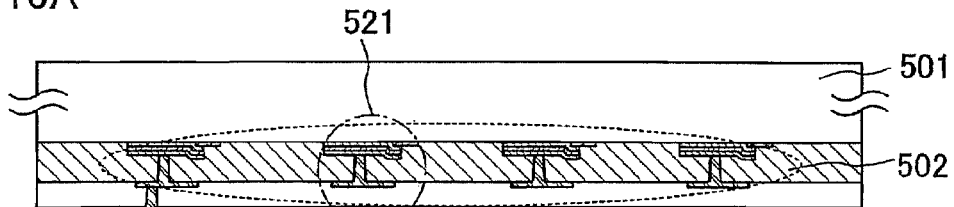
FIGS. 16A to 16E are views showing a manufacturing process of a photoelectric conversion device of the present invention.
Figure 16B:
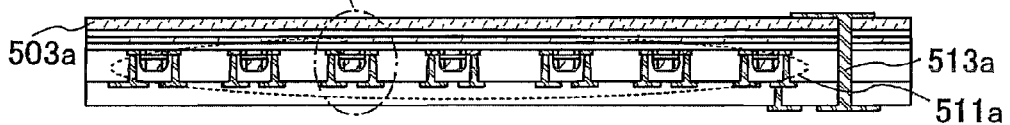
Figure 16C:
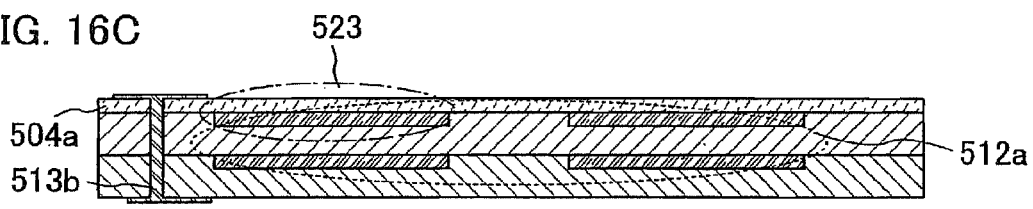
Figure 16D:
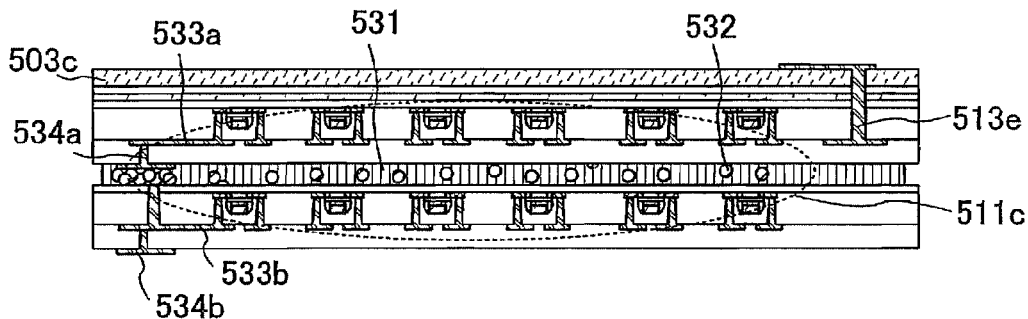

Further, the thin film circuits 511 may be stacked over one substrate. An example thereof is shown in FIG. 16D. The thin film circuit 511c, in this embodiment a TFT circuit, is formed over the thin film circuit element substrate 503c. An electrode 533a connected to a TFT formed on a side (lower layer) close to the substrate 503c is electrically connected to a conductive particle 532 dispersed in an anisotropic conductive adhesive material 531 through a connection electrode 534a. In addition, an electrode 533b connected to a TFT formed on a side (upper layer) far from the substrate 503c is also electrically connected to the conductive particle 532 dispersed in the anisotropic conductive adhesive material 531. Thus, the TFT in the lower layer and the TFT in the upper layer are electrically connected to each other. In addition, the electrode 533b is connected to a connection electrode 534b, and accordingly, the thin film circuit element substrate 503c is electrically connected to another substrate. Further, the connection electrode 513e, which is electrically connected to the TFT in the lower layer, passes through a rear surface of the substrate 503c. Accordingly, the thin film circuit 511c is electrically connected to another substrate.

Thick film circuits 512 (512a, 512b . . . ) each having a thick film circuit element 523 are formed over a plurality of the thick film circuit element substrates 504, respectively. The thick film circuit 512 is a circuit including a thick film element such as a coil, a condenser, or a resistance and may be formed by a screen printing method, an ink-jet method, or the like using a conductive paste or the like. The thick film circuit 512 is electrically connected to another substrate through a connection electrode 513 (in this embodiment, 513b and 513d).

Figure 16E:
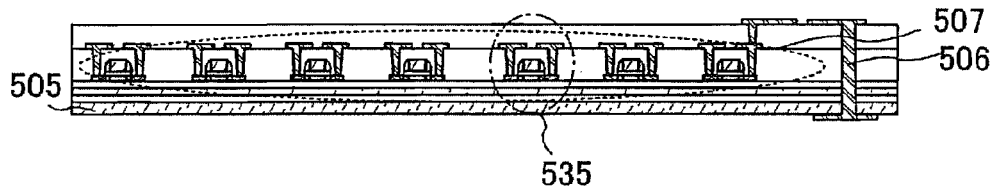

In addition, a terminal substrate 505 including a terminal element circuit 507 is formed at the farthest edge of the semiconductor device (refer to FIG. 16E). A terminal electrode 506 is formed over both surfaces of the substrate by a printing method or the like through a through hole provided in the terminal substrate 505. The terminal element circuit 507 formed over the terminal substrate 505 may be a photoelectric conversion element, a thin film circuit element, or a thick film circuit element. However, in a case of forming a photoelectric conversion element, a substrate having a light-transmitting property is used for the terminal substrate 505. In this embodiment, a thin film circuit element having a TFT 535 is formed.

A film, ceramic, or the like may be used for the substrates 501, 503, and 504, and an element may be directly formed over the substrate or may be formed over another substrate and then peeled and attached. However, in a case of the photoelectric conversion element substrate 501, light is necessary to enter the photoelectric conversion element 521; therefore, a substrate having a light-transmitting property is used. Although the connection electrode is formed in order to electrically connect each substrate, the connection electrode is formed in such a way that a through hole (contact hole) passing through the substrate is formed first by laser irradiation, and then, the connection electrode is formed over a front surface and a rear surface of the substrate through the through hole. Therefore, each substrate is necessary to be made of a material in which the through hole can be formed by laser irradiation.

Hereinafter, a detailed manufacturing method of a photoelectric conversion element of this embodiment will be explained. First, a base insulating film 552 is formed over a substrate 501, and a conductive film 553 is formed over the base insulating film 552 (refer to FIG. 17A).

Figure 17A:
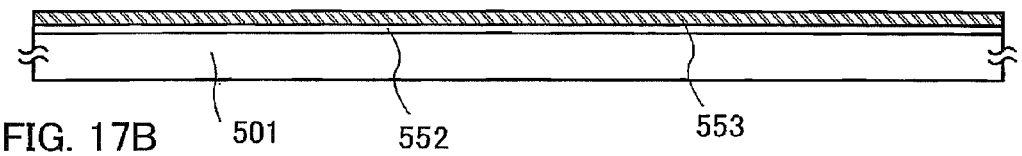
Figure 17B:
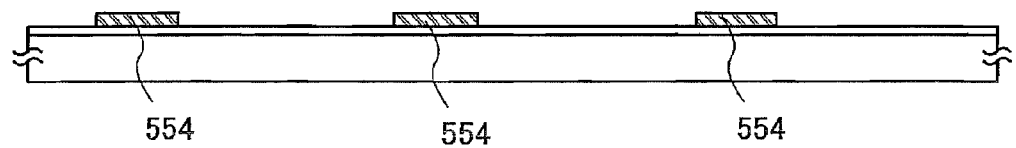
Figure 17C:
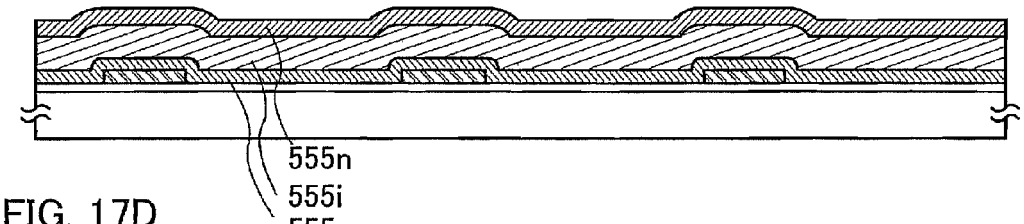

Next, a lower electrode 554 of a photoelectric conversion element is formed using the conductive film 553 (refer to FIG. 17B).

A semiconductor film having first conductivity type, an intrinsic semiconductor film, and a semiconductor film having conductivity type opposite to the first conductivity type are formed over the lower electrode 554. In this embodiment, a p-type semiconductor film 555p, an intrinsic semiconductor film 555i, and an n-type semiconductor film 555n are formed in this order (refer to FIG. 17C).

Figure 17D:
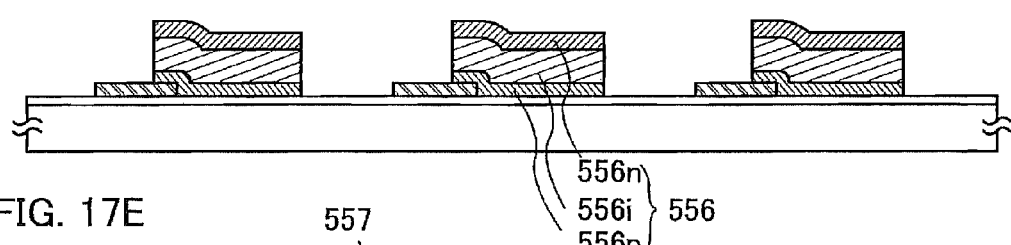
Figure 17D:
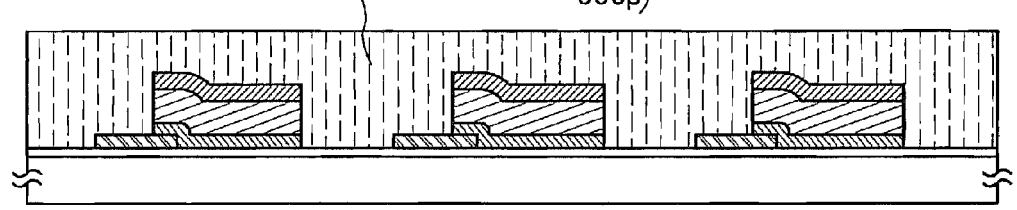
Figure 17D:
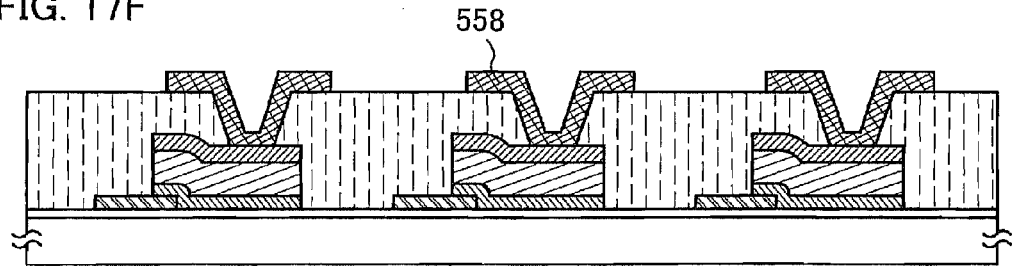

Then, a p-type semiconductor layer 556p, an intrinsic semiconductor layer 556i, and an n-type semiconductor layer 556n of a photoelectric conversion layer 556 are formed using the p-type semiconductor film 555p, the intrinsic semiconductor film 555i, and the n-type semiconductor film 555n (refer to FIG. 17D).

And then, an insulating film 557 is formed to cover the base insulating film 552, the lower electrode 554, and the photoelectric conversion layer 556 (refer to FIG. 17E).

Further, a contact hole is provided in the insulating film 557, and an upper electrode 558 to be in contact with the uppermost layer of the photoelectric conversion layer, in this embodiment the n-type semiconductor layer 556n, is formed (refer to FIG. 17F).

Figure 18A:
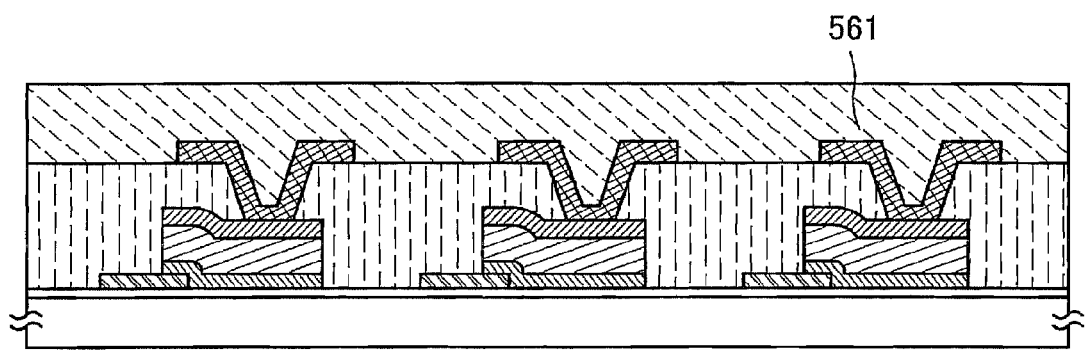
FIGS. 18A and 18B are views showing a manufacturing process of a photoelectric conversion device of the present invention.
Figure 18B:
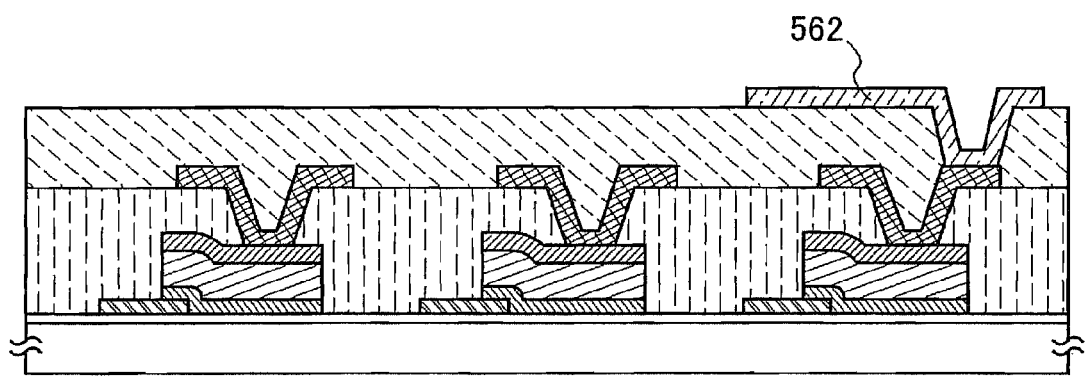

Subsequently, a protective film 561 is formed (refer to FIG. 18A), a contact hole is provided in the protective film 561, and a terminal electrode 562 is formed to be electrically connected to the upper electrode 558 (refer to FIG. 18B). The terminal electrode 562 is an electrode which is used for electrical connection to another substrate.

It is to be noted that detailed explanation of a material or the like for the base insulating film 552, the lower electrode 554, the photoelectric conversion layer 556, the insulating film 557, and the upper electrode 558 is not made here, and Embodiment Mode and Embodiments 1 to 3 may be referred to.

Next, a detailed manufacturing method of a TFT circuit substrate of this embodiment will be explained. In this embodiment, an example of an electrically isolated TFT as a semiconductor element is illustrated; however, a semiconductor element used for an integrated circuit is not limited thereto, and any kind of circuit elements can be used. For example, a memory element, a diode, a photoelectric conversion element, a resistance element, a coil, a capacitor element, an inductor, and the like can be typically given, in addition to a TFT.

Figure 19A:
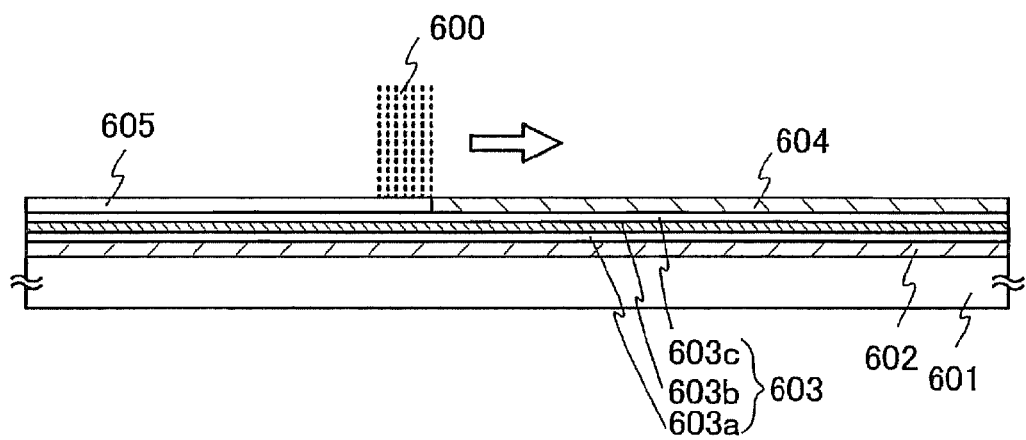
FIGS. 19A to 19C are views showing a manufacturing process of a photoelectric conversion device of the present invention.

First, as shown in FIG. 19A, a peeling layer 602 is formed over a substrate (first substrate) 601 having heat resistance by a sputtering method. A glass substrate such as barium borosilicate glass or alumino borosilicate glass, a quartz substrate, a ceramic substrate, or the like can be used as the first substrate 601 because the substrate 601 is peeled in a step to be performed later. In addition, a metal substrate including a stainless steel substrate or a semiconductor substrate with an insulating film formed over its surface may be used. Although there is a tendency that a flexible substrate, which is made of a synthetic resin such as plastic, is generally inferior to the substrates described above in the heat resistance, the flexible substrate can be used when the substrate can resist the heat temperature in the manufacturing process.

The peeling layer 602 can be made of a layer containing silicon such as amorphous silicon, polycrystalline silicon, single crystal silicon, or microcrystal silicon (including semiamorphous silicon) as its main component. The peeling layer 602 can be formed by a sputtering method, a low pressure CVD method, a plasma CVD method, or the like. In this embodiment, the peeling layer 602 is made of amorphous silicon in approximately 50 nm thick by a low pressure CVD method. The material of the peeling layer 602 is not limited to silicon, and a material that can be selectively etched off may be used. It is preferable that the peeling layer 602 has a thickness of 50 to 60 nm. When the peeling layer 602 is made of semiamorphous silicon, it may be formed to have a thickness of 30 to 50 nm.

Next, a base film 603 is formed over the peeling layer 602. The base film 603 is provided in order to prevent alkali metal such as Na or alkaline earth metal in the first substrate 601 from diffusing into the semiconductor film. The alkali metal or the alkaline earth metal has an adverse effect on the characteristic of a semiconductor element such as a TFT when it is in the semiconductor. Another purpose for providing the base film 603 is to protect the semiconductor element in the following process of peeling the semiconductor element. The base film 603 may be a single-layer insulating film or may include a plurality of insulating films. Accordingly, the base film 603 is made of an insulating film such as silicon oxide, silicon nitride, or silicon nitride oxide which can suppress the diffusion of alkali metal or alkaline earth metal into the semiconductor film.

In this embodiment, the base film 603 is formed by stacking a SiON film having a thickness of 100 nm, a SiNO film having a thickness of 50 nm, and a SiON film having a thickness of 100 nm in this order. However, the material, the thickness, and the number of the stacked layers of each film are not limited thereto. For example, a siloxane-based resin having a thickness of 0.5 to 3 μm may be formed by a spin coating method, a slit coating method, a droplet discharge method, or the like instead of the SiON film in the lower layer. A silicon nitride film ($SiN_x$, $Si_3N_4$, or the like) may be used instead of the SiNO film in the middle layer. A $SiO_2$ film may be used instead of the SiON film in the upper layer. The thickness of each film is desirably 0.05 to 3 μm, and the thickness may be freely selected from the range.

Alternatively, a lower layer 603a of the base film 603 which is closest to the peeling layer 602 may be made of the SiON film or the $SiO_2$ film, a middle layer 603b may be made of a siloxane-based resin, and an upper layer 603c may be made of the $SiO_2$ film.

The silicon oxide film can be formed by a thermal CVD method, a plasma CVD method, a normal-pressure CVD method, a bias ECRCVD method, or the like with a mixed gas of $SiH_4$ and $O_2$ or a mixed gas of TEOS (tetraethoxysilane) and $O_2$, and the like. The silicon nitride film can be formed by a plasma CVD method with a mixed gas of $SiH_4$ and $NH_3$ typically. The silicon oxynitride film (SiOxNy: x>y) and the silicon nitride oxide film (SiNxOy: x>y) can be formed by a plasma CVD method with a mixed gas of $SiH_4$ and $N_2O$ typically.

Next, a semiconductor film 604 is formed over the base film 603. It is desirable to form the semiconductor film 604 without being exposed to atmospheric air after forming the base film 603. The semiconductor film 604 may have a thickness of 20 to 200 nm (desirably 40 to 170 nm, preferably 50 to 150 nm). The semiconductor film 604 may be an amorphous semiconductor, a semiamorphous semiconductor, or a polycrystalline semiconductor. Silicon germanium can also be used as well as silicon. In the case of using silicon germanium, the concentration of germanium is preferably approximately 0.01 to 4.5 atomic %.

The amorphous semiconductor can be obtained by glow discharge decomposition of a gas containing silicon. $SiH_4$ and $Si_2H_6$ are given as a typical gas containing silicon. This gas containing silicon may be diluted with hydrogen or with hydrogen and helium.

The semiamorphous semiconductor is a film containing a semiconductor with an intermediate structure between an amorphous semiconductor and a semiconductor having a crystal structure (including a single crystal structure and a polycrystalline structure). The semiamorphous semiconductor is a semiconductor film having a third condition that is stable in term of free energy, and is a crystalline substance having a short-range order and lattice distortion. A crystal grain thereof can be dispersed in the non-single crystal semiconductor by setting a grain size thereof to be 0.5 to 20 nm. Raman spectrum thereof is shifted toward lower wave number than 520 $cm^{-1}$. The diffraction peaks of (111) and (220), which are thought to be derived from a Si crystal lattice, are observed in the semiamorphous semiconductor by X-ray diffraction. The semiamorphous semiconductor contains hydrogen or halogen of at least 1 atomic % or more as a material for terminating a dangling bond. Such a semiconductor is referred to as a semiamorphous semiconductor (SAS) for the sake of convenience. The lattice distortion is further extended by adding a rare gas element such as helium, argon, krypton, and neon so that the favorable semiamorphous semiconductor with improved stability can be obtained.

An SAS can be obtained by glow discharge decomposition of a gas containing silicon. $SiH_4$ is a typical gas containing silicon, and additionally, $Si_2H_6$, $SiH_2Cl_2$, $SiHCl_3$, $SiCl_4$, $SiF_4$, or the like can be used. An SAS can be easily formed by using the gas containing silicon diluted with hydrogen or gas in which one or more of rare gas elements selected from helium, argon, krypton, and neon is/are added to hydrogen. The gas containing silicon is preferably diluted with a 2 to 1000 fold dilution factor. In addition, a carbide gas such as $CH_4$ or $C_2H_6$; a germanium gas such as $GeH_4$ and $GeF_4$; $F_2$; and the like may be mixed into the gas containing silicon to adjust the width of an energy band at 1.5 to 2.4 eV or 0.9 to 1.1 eV.

In the case of using the gas in which $H_2$ is added to $SiH_4$, or the gas in which $F_2$ is added to $SiH_4$, by manufacturing a WI using the formed semiamorphous semiconductor, the sub-threshold coefficient (S value) of the TFT can be 0.35 V/sec or less, typically, from 0.25 to 0.09 V/sec, and the mobility can be 10 $cm^2$/Vsec. For example, when 19-stages ring oscillator is formed by a TFT using the semiamorphous semiconductor, a property in which an oscillation frequency is 1 MH or more, preferably, 100 MHz or more, in power voltage ranging from 3 to 5 V, can be obtained. Further, in the power voltage ranging from 3 to 5 V, delay time per stage of an inverter can be 26 ns, preferably, 0.26 ns or less.

As shown in FIG. 19A, the semiconductor film 604 is crystallized using a laser beam 600. However, a crystallization method using a catalyst element and a laser crystallization method using a laser may be combined.

Thermal annealing at 500° C. for one hour is preferably conducted to the semiconductor film to increase resistance of the semiconductor film with respect to the laser before laser crystallization. A crystal with a large grain size can be obtained by irradiation of laser light having one of second, third, and fourth harmonic of a fundamental wave from a continuous solid-state laser. For example, typically, it is preferable to use the second harmonic (532 nm) or the third harmonic (355 nm) of an Nd:YVO$_4$ laser (fundamental wave 1064 nm). Specifically, the laser light emitted from the continuous wave YVO$_4$ laser is converted into the harmonic by a non-linear optical element to obtain laser light having the output of 10 W. It is preferable to shape the laser light into a rectangular shape or an elliptical shape on an irradiated surface through an optical system to irradiate the semiconductor film. The power density of approximately 0.01 to 100 MW/cm$^2$ (preferably, 0.1 to 10 MW/cm$^2$) is required for the laser. The scanning speed is set to approximately 10 to 200 cm/sec for the irradiation.

A known continuous wave gas laser or solid-state laser can be used as the laser. As the gas laser, there are an Ar laser, a Kr laser, and the like. As the solid-state laser, there are a YAG laser, a YVO$_4$ laser, a YLF laser, a YAlO$_3$ laser, a Y$_2$O$_3$ laser, a glass laser, a ruby laser, an alexandrite laser, or a Ti:sapphire laser, and the like.

Moreover, a pulsed laser light may be employed to conduct laser crystallization. In this case, the pulse repetition rate is set to 10 MHz or more. This frequency band is extremely higher than the frequency band of several tens of Hz to several hundreds of Hz, which is used usually. It is said that it takes several tens to several hundreds of nsec to completely solidify the semiconductor film after the semiconductor film is irradiated with the pulsed laser light. When the pulsed laser light has the above described frequency band, the semiconductor film can be irradiated with a next pulse during the semiconductor film is melted by the laser beam and solidified. Therefore, a solid-liquid interface can be continuously moved in the semiconductor film so that crystal grains, which continuously grow toward a scanning direction, can be obtained. Specifically, it is possible to form an aggregation of contained crystal grains each of which has a width of approximately 10 to 30 μm in the scanning direction and a width of approximately 1 to 5 μm in a direction perpendicular to the scanning direction. It is also possible to form a semiconductor film having almost no crystal grain boundaries at least in the channel direction of the TFT by forming a crystal grain of a single crystal that is long extended along the scanning direction.

The irradiation of the laser light may be conducted in an inert gas atmosphere such as a rare gas or nitrogen. This enables the roughness of a semiconductor surface to be suppressed by the irradiation of the laser light and variations in threshold value generated by variations in an interface state density to be suppressed.

Figure 19B:
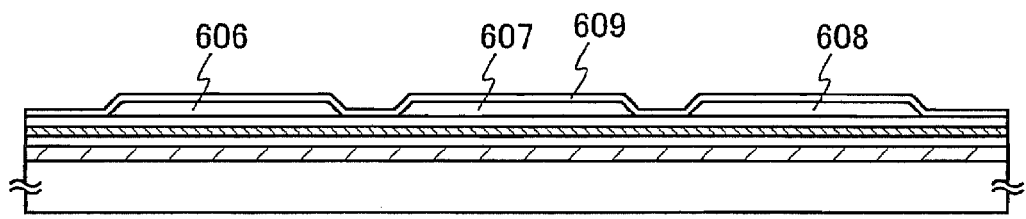

Next, as shown in FIG. 19B, island-like semiconductor films 606, 607, and 608 are made of a crystallized semiconductor film 605. Then, a gate insulating film 609 is formed so as to cover the island-like semiconductor films 606 to 608. The gate insulating film 609 may be a single layer or a stacked layer formed by including silicon nitride, silicon oxide, silicon nitride oxide, or silicon oxynitride by a plasma CVD method, a sputtering method, or the like. In the case of the stacked layer, for example, the gate insulating film 609 is preferably formed by stacking a silicon oxide film, a silicon nitride film, and a silicon oxide film over the substrate side.

After forming the gate insulating film 609, heat treatment may be performed in an atmosphere containing hydrogen of 3 to 100% at a temperature of 300 to 450° C. for 1 to 12 hours in order to hydrogenate the island-like semiconductor films 606 to 608. As another means for the hydrogenation, plasma hydrogenation (using hydrogen that is excited by plasma) may be performed. In the hydrogenation process, a dangling bond can be terminated by using the thermally excited hydrogen. After attaching the semiconductor element to a flexible second substrate in the following process, a defect may be formed in the semiconductor film by bending the second substrate. However, even in this case, the defect can be terminated by the hydrogen in the semiconductor film when the concentration of hydrogen in the semiconductor film is set to $1\times10^{19}$ to $1\times10^{22}$ cm$^{-3}$, preferably $1\times10^{19}$ to $5\times10^{20}$ cm$^{-3}$ by the hydrogenation. Further, in order to terminate the defect, halogen may be included in the semiconductor film.

Figure 19C:
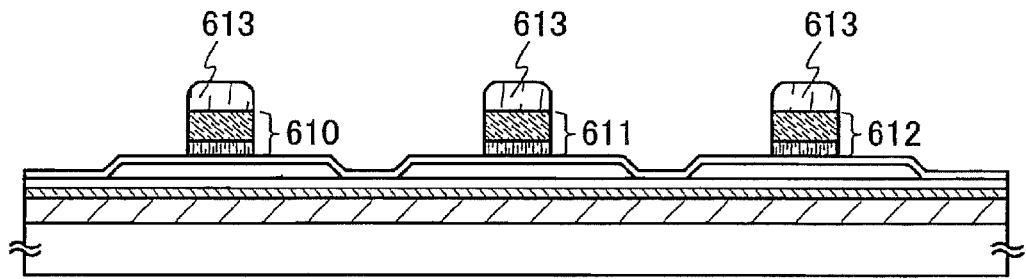

Next, as shown in FIG. 19C, gate electrodes 610 to 612 are formed. In this embodiment, the gate electrodes 610 to 612 are formed in such a way that Si and W are formed so as to be stacked by a sputtering method and then etching is performed by using a resist 613 as a mask. As a matter of course, the material, the structure, and the manufacturing method of the gate electrodes 610 to 612 are not limited thereto and may be selected appropriately. For example, the gate electrodes 610 to 612 may be a stacked structure including Si (silicon) doped with an impurity imparting n-type and NiSi (nickel silicide) or a stacked structure including TaN (tantalum nitride) and W (tungsten). Further, the gate electrodes 610 to 612 may be a single layer made of various kinds of conductive materials.

Instead of the resist mask, a mask made of SiOx, or the like may be used. In this case, an additional step is performed to form the mask (referred to as a hard mask) made of SiOx, SiON, or the like. However, loss in thickness of the mask in etching is fewer than the case of the resist mask; therefore, the gate electrodes 610 to 612 each having a desired width can be formed. Alternatively, the gate electrodes 610 to 612 may be selectively formed by a droplet discharging method without using the resist 613.

The conductive material can be selected from various materials in accordance with the function of the conductive film. When the gate electrode and an antenna are formed concurrently, the materials may be selected in consideration of their functions.

Although a mixed gas of $CF_4$, $Cl_2$ and $O_2$ or a gas of $Cl_2$ is used as an etching gas for forming the gate electrodes by etching, the etching gas is not limited thereto.

Figure 20A:
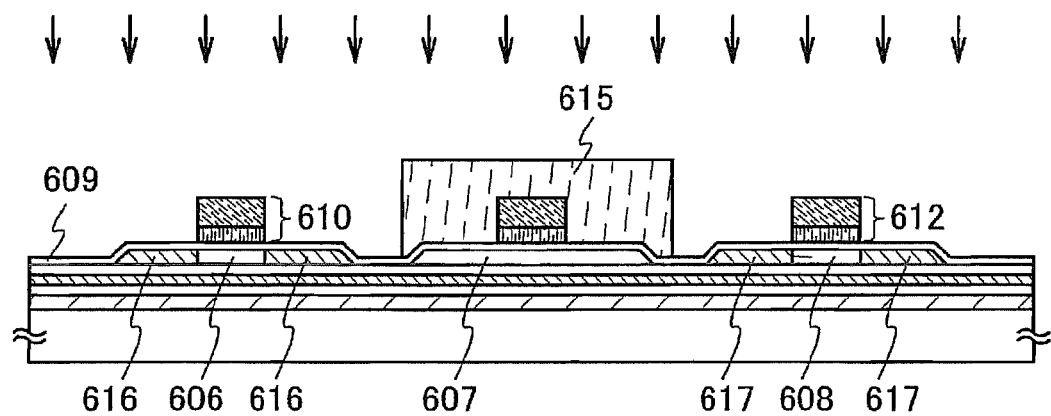
FIGS. 20A and 20B are views showing a manufacturing process of a photoelectric conversion device of the present invention.

Next, as shown in FIG. 20A, the island-like semiconductor film 607 to be a p-channel TFT is covered with a resist 615, and an impurity element imparting n-type conductivity (typically, P (phosphorus) or As (arsenic)) is doped to the island-like semiconductor films 606 and 608 to form a low-concentration region by using the gate electrodes 610 and 612 as masks (a first doping process). The first doping process is performed under the condition where the dose amount is $1 \times 10^{13}$ to $6 \times 10^{13}/cm^2$ and the accelerating voltage is 50 to 70 keV. However, the condition of the first doping process is not limited thereto. In the first doping process, the doping is performed through the gate insulating film 609, and pairs of low-concentration impurity regions 616 and 617 are formed in the island-like semiconductor films 606 and 608. Further, the first doping process may be performed without covering the island-like semiconductor film 607 to be the p-channel TFT with the resist.

Figure 20B:
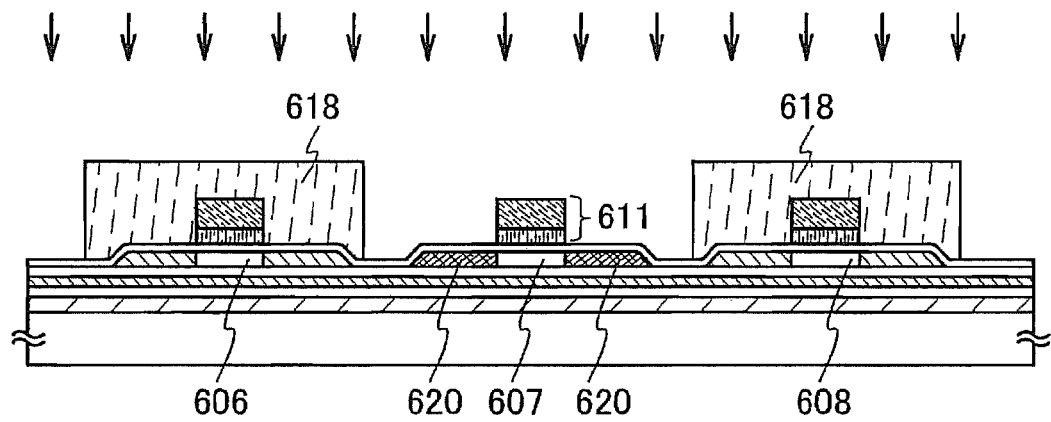

Next, as shown in FIG. 20B, after removing the resist 615 by ashing or the like, a resist 618 is newly formed so as to cover the island-like semiconductor films 606 and 608 to be n-channel TFTs. Then, an impurity element imparting p-type conductivity (typically, B (boron)) is doped to the island-like semiconductor film 607 to form a high-concentration region by using the gate electrode 611 as a mask (a second doping process). The second doping process is performed under the condition where the dose amount is $1 \times 10^{16}$ to $3 \times 10^{16}/cm^{-2}$ and the accelerating voltage is 20 to 40 keV. In the second doping process, the doping is performed through the gate insulating film 609, and a pair of p-type high-concentration impurity regions 620 is formed in the island-like semiconductor film 607.

Figure 21A:
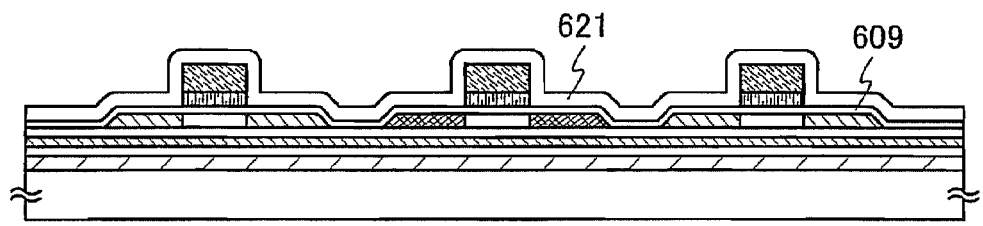
FIGS. 21A to 21C are views showing a manufacturing process of a photoelectric conversion device of the present invention.
Figure 21B:
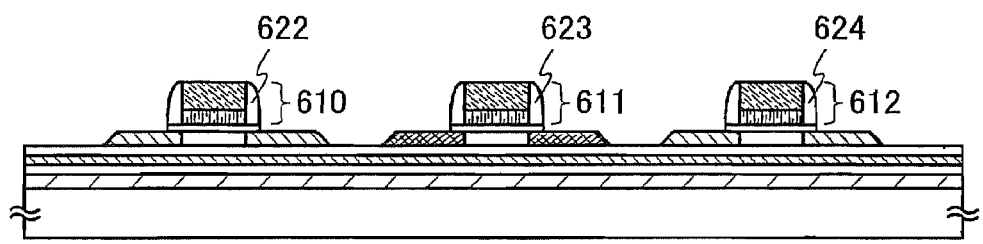

Next, as shown in FIG. 21A, after removing the resist 618 by ashing or the like, an insulating film 621 is formed so as to cover the gate insulating film 609 and the gate electrodes 610 to 612. In this embodiment, the insulating film 621 is made of a $SiO_2$ film having a thickness of 100 nm by a plasma CVD method. After that, the insulating film 621 and the gate insulating film 609 are partially etched by an etch-back method to form sidewalls 622 to 624 to be in contact with sides of the gate electrodes 610 to 612 in a self-aligned manner as shown in FIG. 21B. A mixed gas of $CHF_3$ and He is used as the etching gas. Further, a step of forming the sidewalls is not limited thereto.

When the insulating film 621 is formed, the insulating film 621 may be also formed at the rear surface of the substrate. In this case, the insulating film formed at the rear surface of the substrate may be selectively etched off by using a resist. Alternatively, when forming the sidewall in the etch-back method, the resist which is used may be partially removed concurrently with the insulating film 621 and the gate insulating film 609.

Figure 21C:
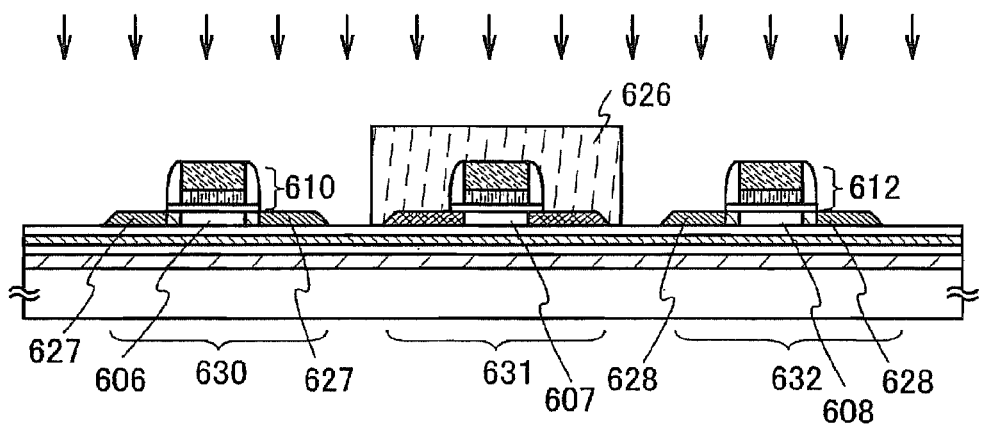

Next, as shown in FIG. 21C, a resist 626 is newly formed so as to cover the island-like semiconductor film 607 to be the p-channel TFT. Then, an impurity element imparting n-type conductivity (typically, P or As) is doped to form a high-concentration region by using the gate electrodes 610 and 612 and the sidewalls 622 and 624 as masks (a third doping process). The third doping process is performed under the condition where the dose amount is $1 \times 10^{13}$ to $5 \times 10^{15}/cm^2$ and the accelerating voltage is 60 to 100 keV. In the third doping process, the doping is performed through the gate insulating film 609, and a pair of n-type high-concentration impurity regions 627 and 628 are formed in the island-like semiconductor films 606 and 608.

Further, the sidewalls 622 and 624 are to serve as the masks in, subsequently, doping with a high-concentration impurity imparting n-type conductivity and forming a low-concentration impurity region or non-doped off-set region in a lower portion of the sidewalls 622 and 624. Therefore, in order to control the width of the low-concentration impurity region or the off-set region, the size of the sidewalls may be adjusted by appropriately changing the film formation condition and the condition of the etch-back method in forming the sidewall.

After removing the resist 626 by asking or the like, thermal activation of the impurity region may be performed. For example, after depositing a SiON film in 50 nm thick, heat treatment may be performed for 4 hours in a nitrogen atmosphere at 550° C. After a SiNx film including hydrogen is formed in 100 nm thick, heat treatment is performed thereto for 1 hour in a nitrogen atmosphere at 410° C. Accordingly, a defect in the polycrystalline semiconductor film can be restored. This treatment is, for example, to terminate the dangling bond in the polycrystalline semiconductor film and is referred to as a hydrogenation step or the like.

According to a series of the foregoing processes, an n-channel TFT 630, a p-channel TFT 631, and an n-channel TFT 632 are formed. When the size of the sidewall is adjusted by changing the condition of the etch-back method appropriately in the manufacturing process described above, a TFT having the channel length of 0.2 to 2 μm can be formed. Although the TFTs 630 to 632 have a top-gate structure in this embodiment, they may have a bottom-gate structure (inverted staggered structure).

After that, a passivation film may be formed to protect the TFTs 630 to 632. It is desirable that the passivation film be made of silicon nitride, silicon nitride oxide, aluminum nitride, aluminum oxide, silicon oxide, or the like which can prevent the penetration of alkali metal or alkaline earth metal into the TFTs 630 to 632. Specifically, for example, a SiON film having a thickness of approximately 600 nm can be used as the passivation film. In this case, the hydrogenation step may be performed after forming the SiON film. In this manner, insulating films of three layers of SiON, SiNx, and SiON are formed over the TFTs 630 to 632. However, the structure and the materials of these films are not limited thereto. With the above structure, since the TFTs 630 to 632 are covered with the base film 603 and the passivation film, it is possible to prevent the alkali metal such as Na or the alkaline earth metal from diffusing into the semiconductor film used for the semiconductor element. The alkali metal or the alkaline earth metal has an adverse effect on the characteristic of a semiconductor element when it is in the semiconductor.

Figure 22A:
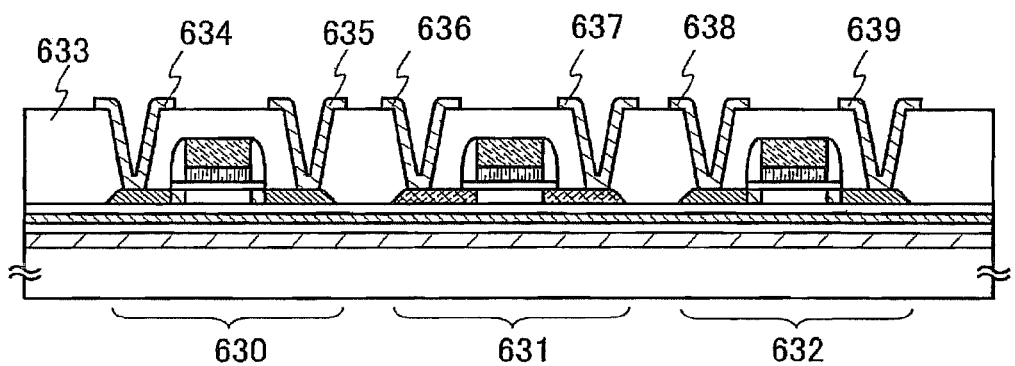
FIGS. 22A to 22C are views showing a manufacturing process of a photoelectric conversion device of the present invention.

Next, as shown in FIG. 22A, a first interlayer insulating film 633 is formed so as to cover the TFTs 630 to 632. The first interlayer insulating film 633 can be made of an organic resin having heat resistance such as polyimide, acrylic, or polyimide. Besides, a low dielectric constant material (low-k material), a resin including a Si—O—Si bond (hereinafter, referred to as a siloxane-based resin) formed by using a siloxane-based material as a starting material, or the like can be used. Siloxane is composed by a skeleton structure of a bond of silicon (Si) and oxygen (O). As a substituent, an organic group containing at least hydrogen (such as an alkyl group or an aromatic hydrocarbon) is used. Alternatively, a fluoro group may also be used as the substituent. Further alternatively, an organic group containing at least hydrogen and a fluoro group may be used as the substituent.

The first interlayer insulating film 633 can be formed by a spin coating method, a dipping method, a spray coating method, a droplet discharge method (an ink-jet method, a screen printing method, an offset printing method, or the like), a doctor knife method, a roll coating method, a curtain coating method, a knife coating method, or the like depending on the material. In addition, an inorganic material may be used, and in this case, silicon oxide, silicon nitride, silicon oxynitride, PSG (phosphorous glass), BPSG (phosphorous boron glass), an alumina film, or the like can be used. Further, the first interlayer insulating film 633 may be formed by stacking insulating films made of the above materials.

Figure 22B:
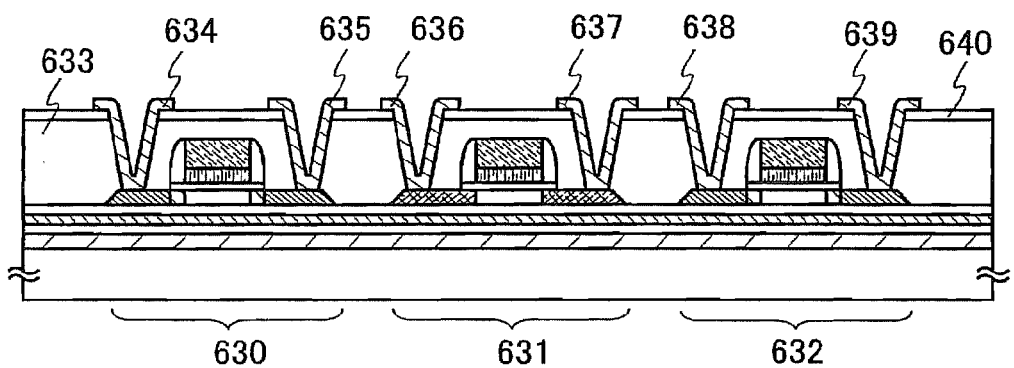

Further, a second interlayer insulating film 640 may be formed over the first interlayer insulating film 633. FIG. 22B shows an example of forming the second interlayer insulating film 640. The second interlayer insulating film 640 can be made of a film including carbon such as DLC (diamond-like carbon) or CN (carbon nitride), a silicon oxide film, a silicon nitride film, or a silicon nitride oxide film by a plasma CVD method, an atmospheric-pressure plasma CVD method, or the like. In addition, the second interlayer insulating film 640 may be made of a photosensitive or non-photosensitive organic material such as polyimide, acrylic, polyamide, resist, or benzocyclobutene, a siloxane-based resin, or the like.

A filler may be mixed into the first interlayer insulating film 633 or the second interlayer insulating film 640 in order to prevent the first interlayer insulating film 633 and the second interlayer insulating film 640 from being peeled and damaged due to the stress caused by the difference of the coefficient of thermal expansion between the conductive material or the like for constituting the wiring to be formed afterward and the first interlayer insulating film 633 or the second interlayer insulating film 640.

Next, as shown in FIG. 22B, contact holes are formed in the first interlayer insulating film 633, then, wirings 634 to 639 are formed to be connected to the TFTs 630 to 632. Although a mixed gas of $CHF_3$ and He is used, the etching gas, which is to be used for etching in opening the contact holes, is not limited thereto. In this embodiment, the wirings 634 to 639 are formed by a sputtering method to have a five-layer structure formed by stacking Ti, TiN, Al—Si, Ti, and TiN, and then, the wirings 634 to 639 are etched.

By mixing Si into Al, it is possible to prevent a hillock in baking the resist during the formation of the wirings. Cu may be mixed by approximately 0.5% instead of Si. When an Al—Si layer is sandwiched between Ti and TiN, the resistance against the hillock is improved further. It is desirable to use the hard mask described above which is made of SiON or the like in etching. The material and the forming method of the wirings are not limited thereto, and the above material used for the gate electrode may be used.

The wirings 634 and 635 are connected to the high-concentration impurity region 627 of the n-channel TFT 630, the wirings 636 and 637 are connected to the high-concentration impurity region 620 of the p-channel TFT 631, and the wirings 638 and 639 are connected to the high-concentration impurity region 628 of the n-channel TFT 632, respectively.

Figure 22C:
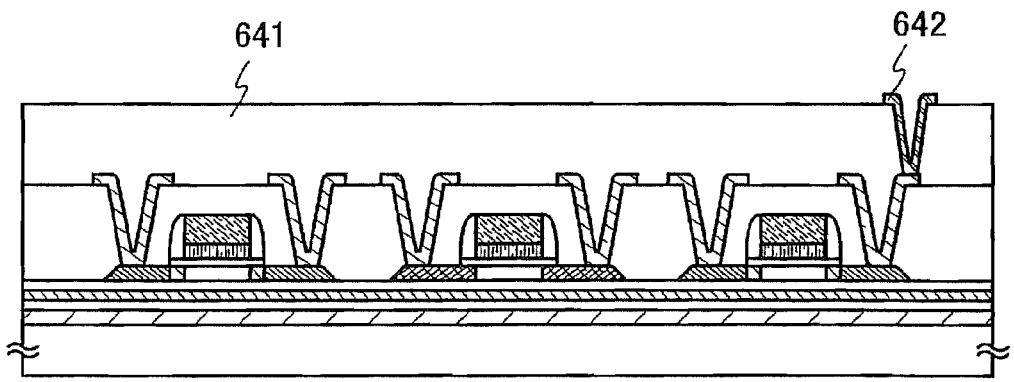

Next, as shown in FIG. 22C, a third interlayer insulating film 641 is formed over the first interlayer insulating film 633, or a third interlayer insulating film 641 is formed over the second interlayer insulating film 640 in a case of forming the second interlayer insulating film 640, so as to cover the wirings 634 to 639. The third interlayer insulating film 641 is formed so as to have an opening portion at a position where the wiring 639 is partially exposed. The third interlayer insulating film 641 can be formed using the same material as the first interlayer insulating film 633.

Then, an electrode 642 is formed over the third interlayer insulating film 641. The electrode 642 can be made of a conductive material having a metal or a metal compound of at least one selected from Ag, Au, Cu, Pd, Cr, Mo, Ti, Ta, W, Al, Fe, Co, Zn, Sn, and Ni. It is to be noted that the electrode 642 is necessary to be made of a material which is not etched in a subsequent step of etching the peeling layer. Therefore, the electrode 642 is made of a material which can obtain selectivity between the peeling layer 602 and the electrode 642. Further, the electrode 642 is connected to the wiring 639.

Figure 23A:
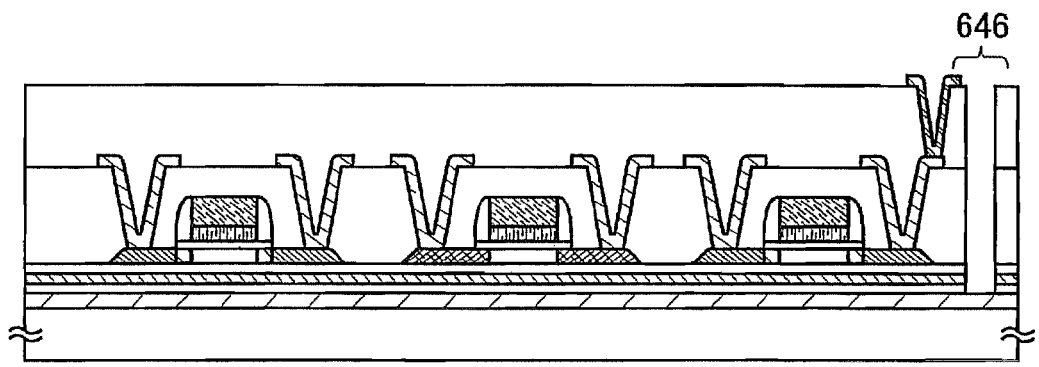
FIGS. 23A to 23C are views showing a manufacturing process of a photoelectric conversion device of the present invention.

Next, as shown in FIG. 23A, a groove 646 is formed in order to separate the element. The groove 646 may have the depth of such a degree that the peeling layer 602 is exposed. The groove 646 can be formed by a dicing method, a scribing method, or the like.

Figure 23B:
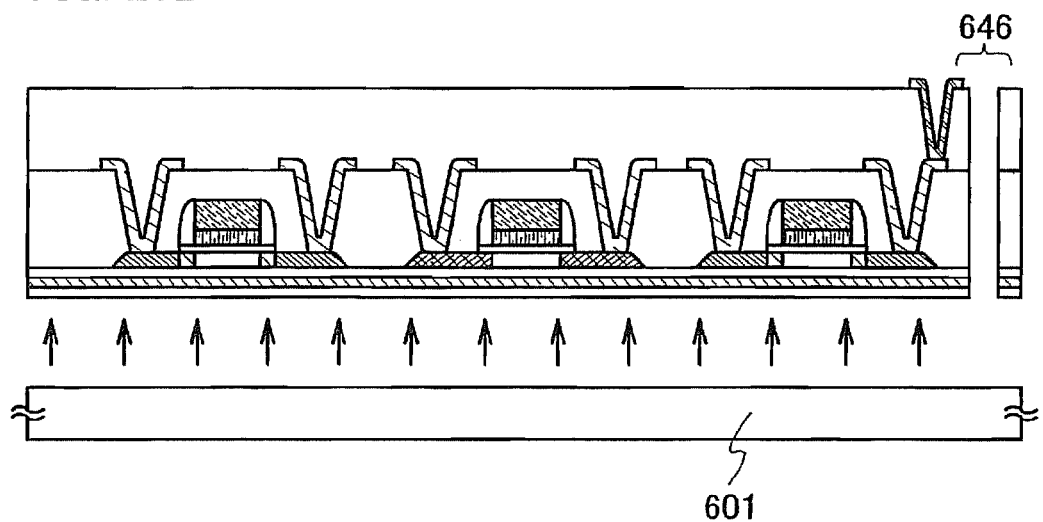

As shown in FIG. 23B, the peeling layer 602 is etched off. In this embodiment, halogen fluoride is used as an etching gas and the gas is introduced from the groove 646. In this embodiment, for example, $ClF_3$ (chlorine trifluoride) is used under the condition where the temperature is 350° C., the flow rate is 300 sccm, the pressure is 800 Pa, and the etching time is 3 hours. Alternatively, a gas in which nitrogen is mixed into the $ClF_3$ gas may be used. The peeling layer 602 can be selectively etched by using the halogen fluoride such as $ClF_3$ so that the first substrate 601 can be peeled from the TFTs 630 to 632. The halogen fluoride may be gas or liquid.

Figure 23C:
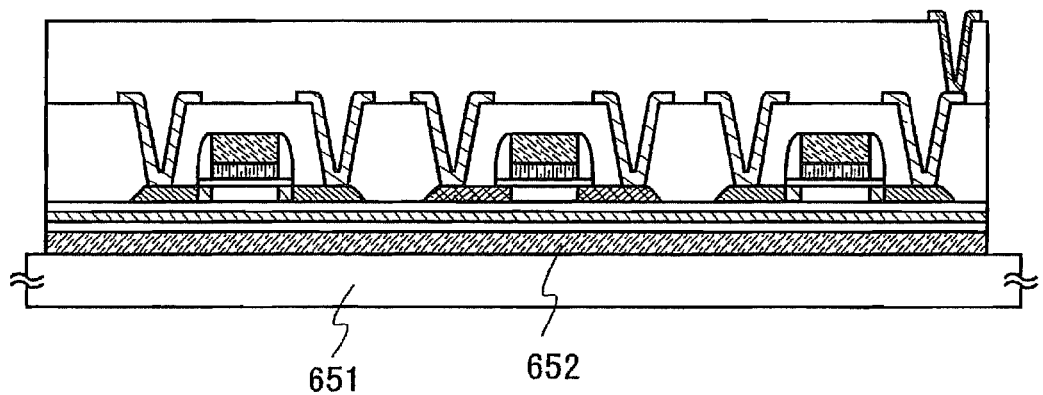

As shown in FIG. 23C, the TFTs 630 to 632 which are peeled are attached to a second substrate 651 by using an adhesive agent 652. The adhesive agent 652 is made of a material capable of attaching the second substrate 651 and the base film 603 to each other. For the adhesive agent 652, for example, various curable adhesive agents such as a reactive curable adhesive agent, a heat curable adhesive agent, a photo-curable adhesive agent such as an ultraviolet curable adhesive, and an anaerobic adhesive agent can be used.

In a case of using an organic resin for the adhesive agent 652 which is in contact with the base film 603 in order to obtain the flexibility of substrate, it is possible to prevent alkali metal such as Na or alkaline earth metal from diffusing into the semiconductor film from the organic resin by using a silicon nitride film or a silicon nitride film containing oxygen as the base film 603.

The second substrate 651 can be made of an organic material such as flexible paper or plastic. Alternatively, a flexible inorganic material may be used as the second substrate 651. The plastic substrate may be made of ARTON including poly-norbornene that has a polar group (manufactured by JSR). In addition, polyester typified by polyethylene terephthalate (PET), polyether sulfone (PES), polyethylene naphthalate (PEN), polycarbonate (PC), nylon, polyether etherketone (PEEK), polysulfone (PSF), polyether imide (PEI), polyarylate (PAR), polybutylene terephthalate (PBT), polyimide, an acrylonitrile-butadiene-styrene resin, polyvinyl chloride, polypropylene, polyvinyl acetate, an acrylic resin, and the like are given. It is desirable that the second substrate 651 have heat conductivity as high as approximately 2 to 30 W/mK in order to diffuse the heat generated in the integrated circuit.

When the second substrate 651 curves so as to have a curved surface drawn by the movement of a generating line such as a conical surface or a cylindrical surface, it is desirable to align the direction of the generating line to the moving direction of the carriers of the TFTs 630 to 632. With the above structure, even when the second substrate 651 is curved, it is possible to suppress an effect on characteristics of the TFTs 630 to 632 due to the curve. When the proportion of the area of the island-like semiconductor film in the integrated circuit is 1 to 30%, it is possible to further suppress the effect on the characteristics of the TFTs 630 to 632 due to the curve of the second substrate 651.

Figure 24A:
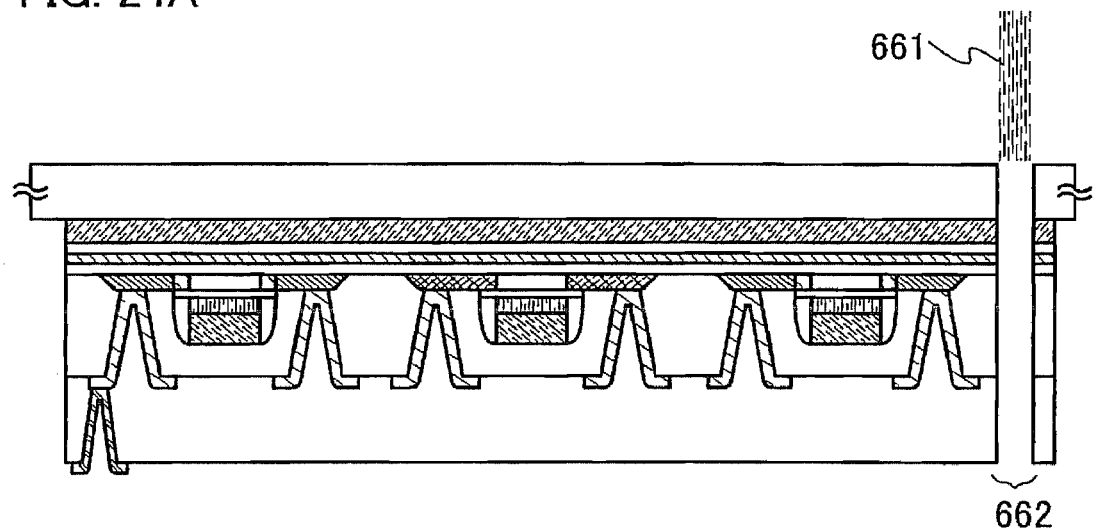
FIGS. 24A and 24B are views showing a manufacturing process of a photoelectric conversion device of the present invention.
Figure 24B:
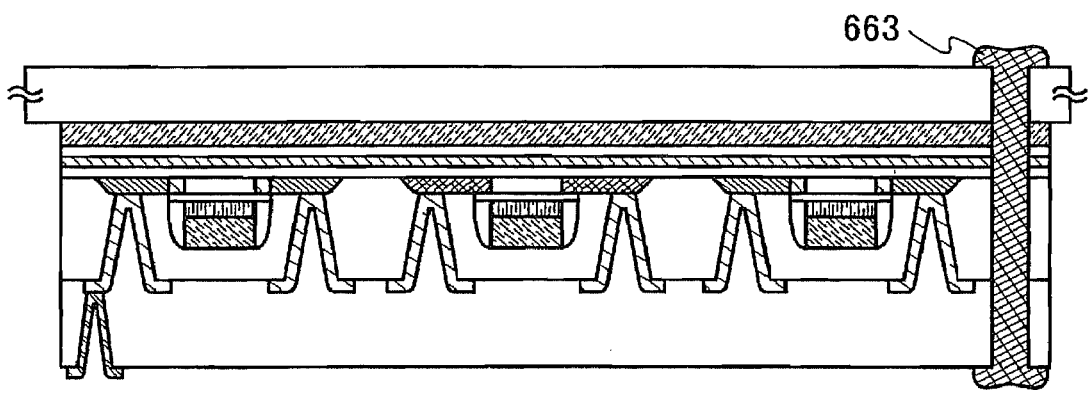

Then, the second substrate 651 is irradiated with a laser beam 661 (refer to FIG. 24A). By the irradiation of the laser beam 661, a contact hole 662 passing through the second substrate 651, the first interlayer insulating film 633, and the third interlayer insulating film 641 is formed.

And then, a connection electrode 663 to be connected to an external element through the contact hole 662 is formed. The connection electrode 663 may be formed by a screen printing method, an ink-jet method, or the like.

Figure 25A:
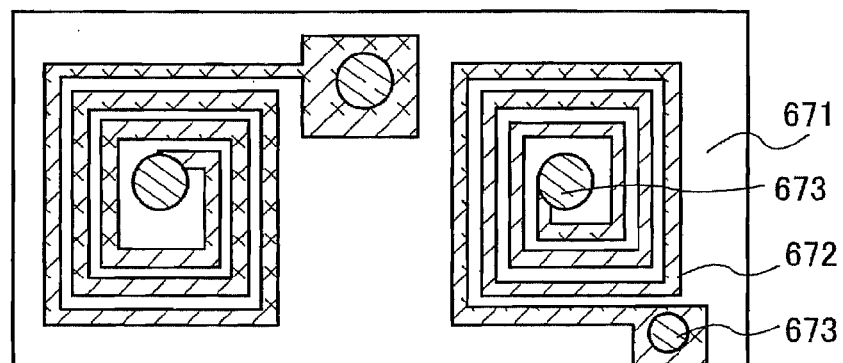
FIGS. 25A to 25C are views showing a manufacturing process of a photoelectric conversion device of the present invention.
Figure 25B:
Figure 25C:
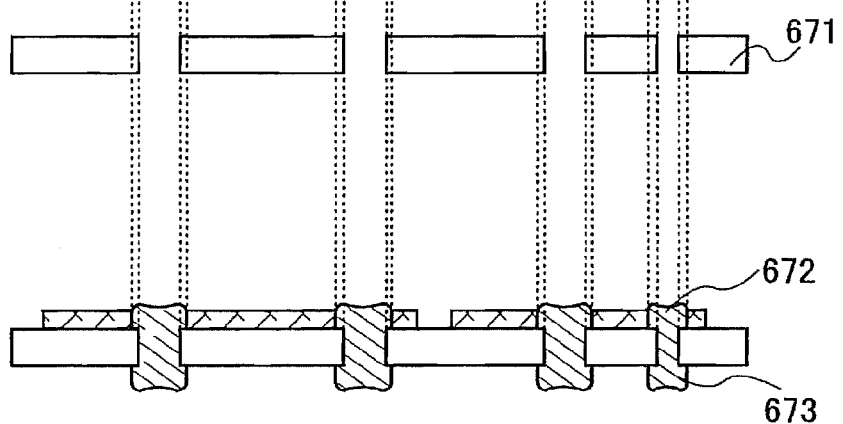

FIGS. 25A to 25C show an example of a substrate over which a thick film element circuit is formed. A thick film element formed by a screen printing method, an ink-jet method, or the like, for example, a coil 672 is formed over a substrate 671. A contact hole passing through the substrate 671 is formed at each end of the coil 672, and a connection electrode 673 is formed through the contact hole.

As described above, a structure shown in FIG. 1 can be manufactured by combining a photoelectric conversion element substrate and a thin film circuit substrate. By further combining a thick film circuit substrate, a device having a resistance, a capacitor, and the like concurrently can be manufactured.

Embodiment 5

In this embodiment, examples of various electronic devices will be explained, in which a photoelectric conversion device obtained by the present invention is incorporated. As electronic devices to which the present invention is applied, computers, displays, cellular phones, televisions, and the like are given. Specific examples of such electronic devices are shown in FIG. 26, FIGS. 27A and 27B, FIGS. 28A and 28B, and FIG. 29.

Figure 26:
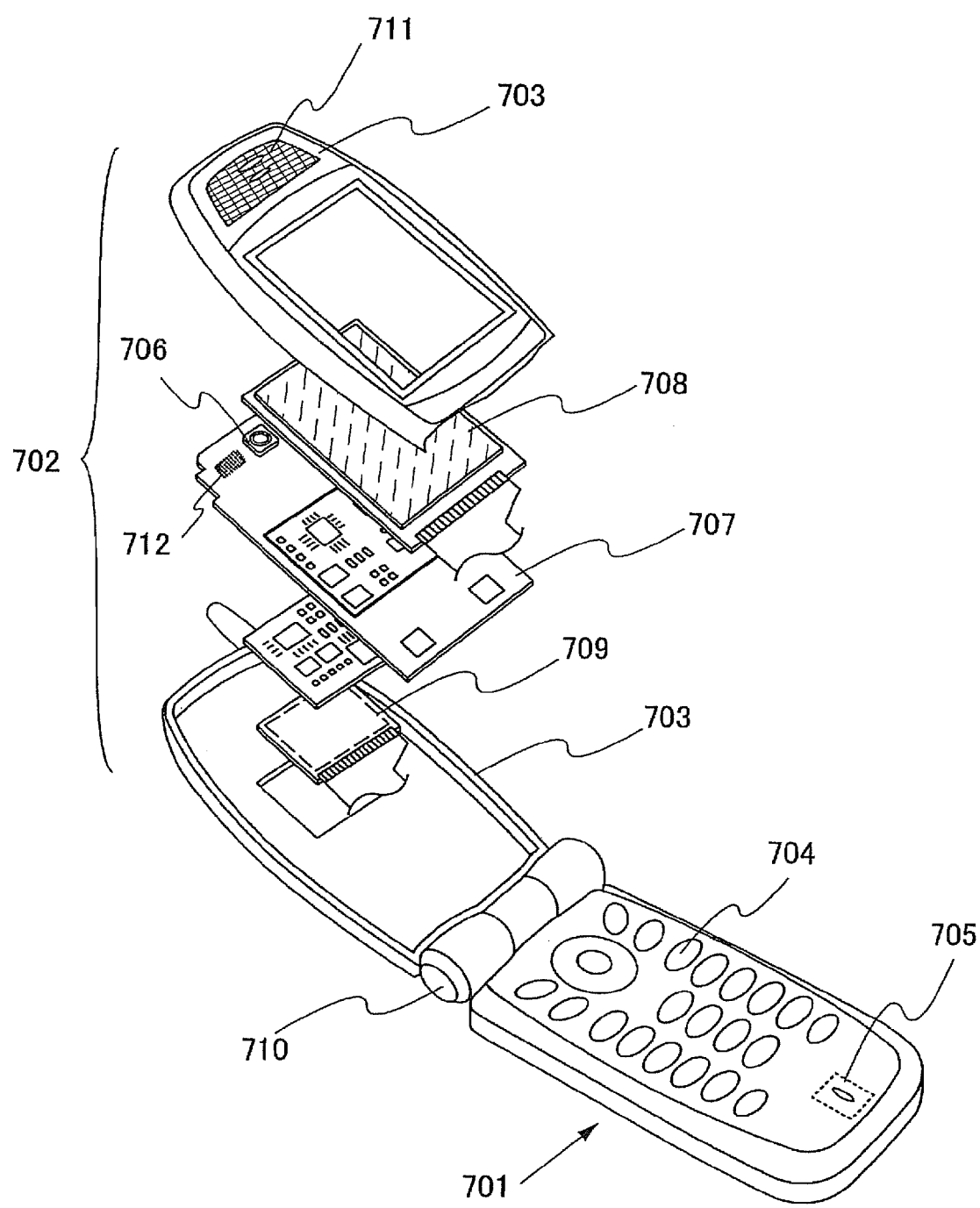
FIG. 26 is a view showing a device on which a photoelectric conversion device of the present invention is mounted.

FIG. 26 shows a cellular phone having a main body (A) 701, a main body (B) 702, a chassis 703, operation keys 704, a sound input portion 705, a sound output portion 706, a circuit board 707, a display panel (A) 708, a display panel (B) 709, a hinge 710, a light-transmitting material portion 711, and a photoelectric conversion element 712. The present invention can be applied to the photoelectric conversion element 712.

The photoelectric conversion element 712 detects light which have passed through the light-transmitting material portion 711 and controls luminance of the display panel (A) 708 and the display panel (B) 709 depending on the illuminance of the detected extraneous light or controls illumination of the operation keys 704 based on the illuminance obtained by the photoelectric conversion element 712. In this manner, current consumption of the cellular phone can be suppressed.

Figure 27A:
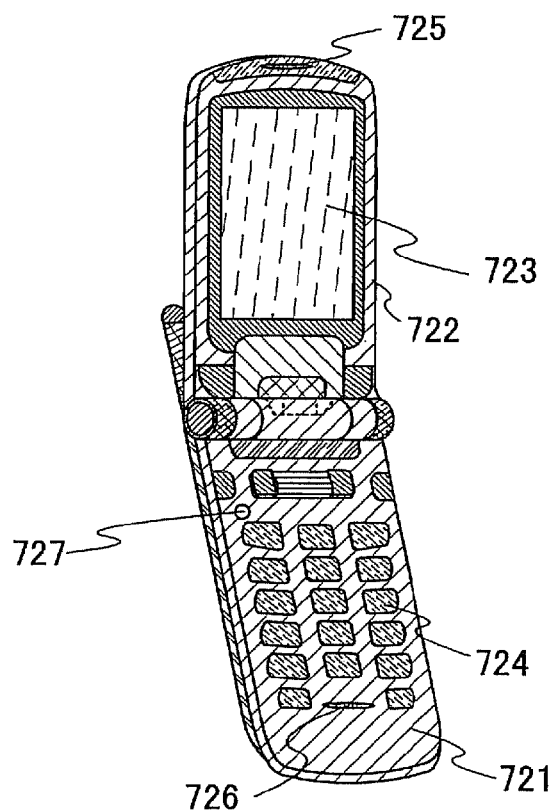
FIGS. 27A and 27B are views each showing a device on which a photoelectric conversion device of the present invention is mounted.
Figure 27B:
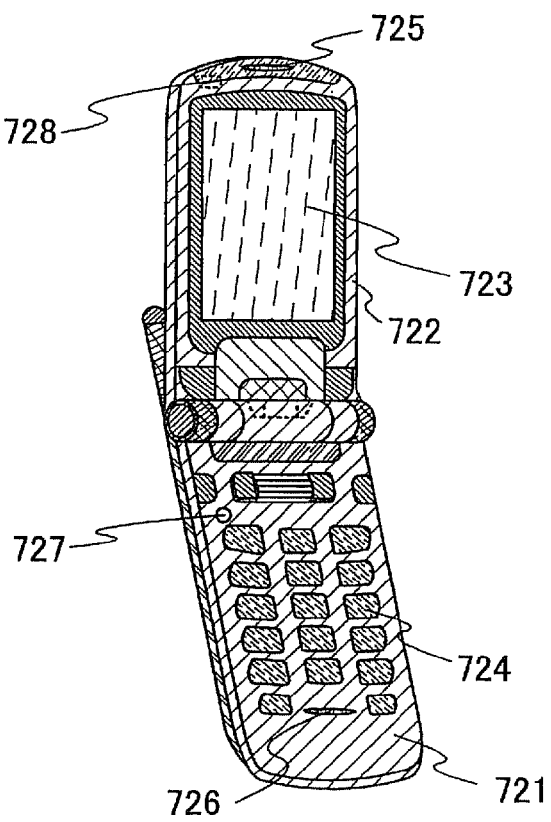

FIGS. 27A and 27B show other examples of a cellular phone. In FIGS. 27A and 27B, reference numeral 721 denotes a main body; 722, a chassis; 723, a display panel; 724, operation keys; 725, a sound output portion; 726, a sound input portion; and 727 and 728, photoelectric conversion elements.

In the cellular phone shown in FIG. 27A, luminance of the display panel 723 and the operation keys 724 can be controlled by detecting extraneous light by the photoelectric conversion element 727 provided in the main body 721.

Furthermore, in the cellular phone shown in FIG. 27B, a photoelectric conversion element 728 is provided inside the main body 721 in addition to the structure of FIG. 27A. By the photoelectric conversion element 728, luminance of a back light provided in the display panel 723 can also be detected.

Figure 28A:
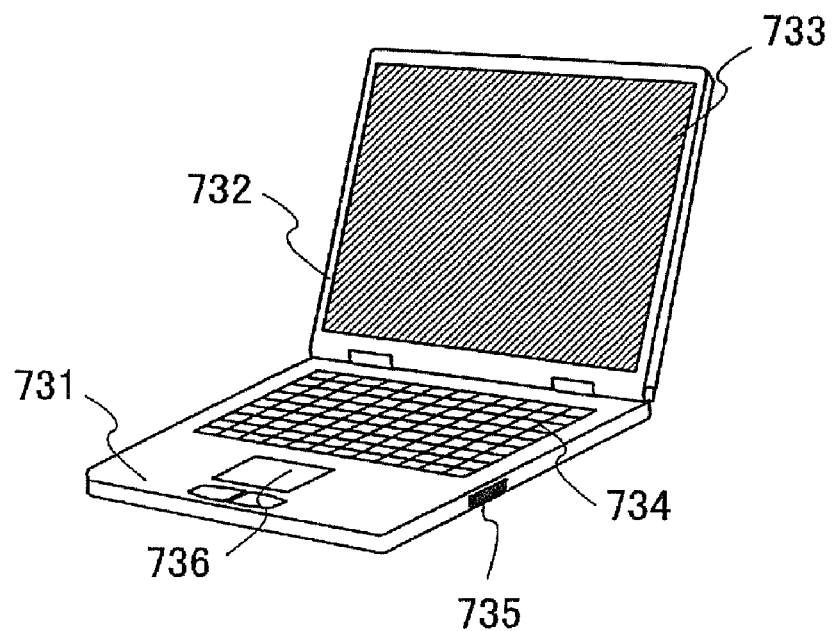
FIGS. 28A and 28B are views each showing a device on which a photoelectric conversion device of the present invention is mounted.

FIG. 28A shows a computer having a main body 731, a chassis 732, a display portion 733, a keyboard 734, an external connection port 735, a pointing mouse 736, and the like.

Figure 28B:
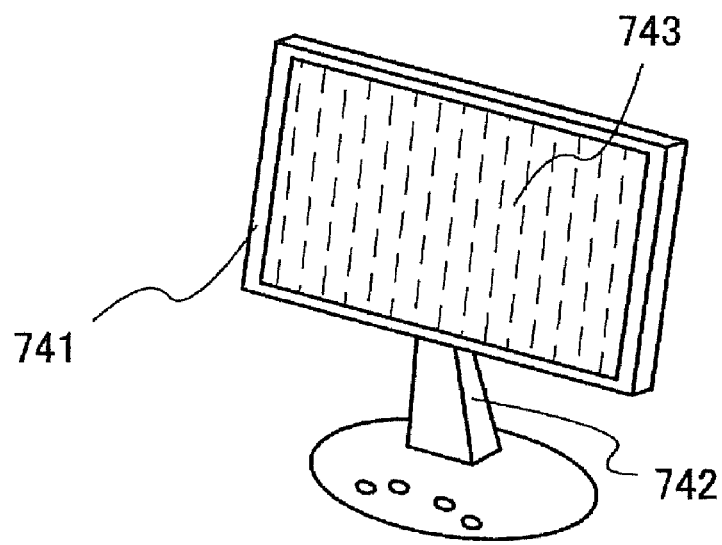

In addition, FIG. 28B shows a display device such as a television receiver. The display device includes a chassis 741, a support 742, a display portion 743, and the like.

Figure 29:
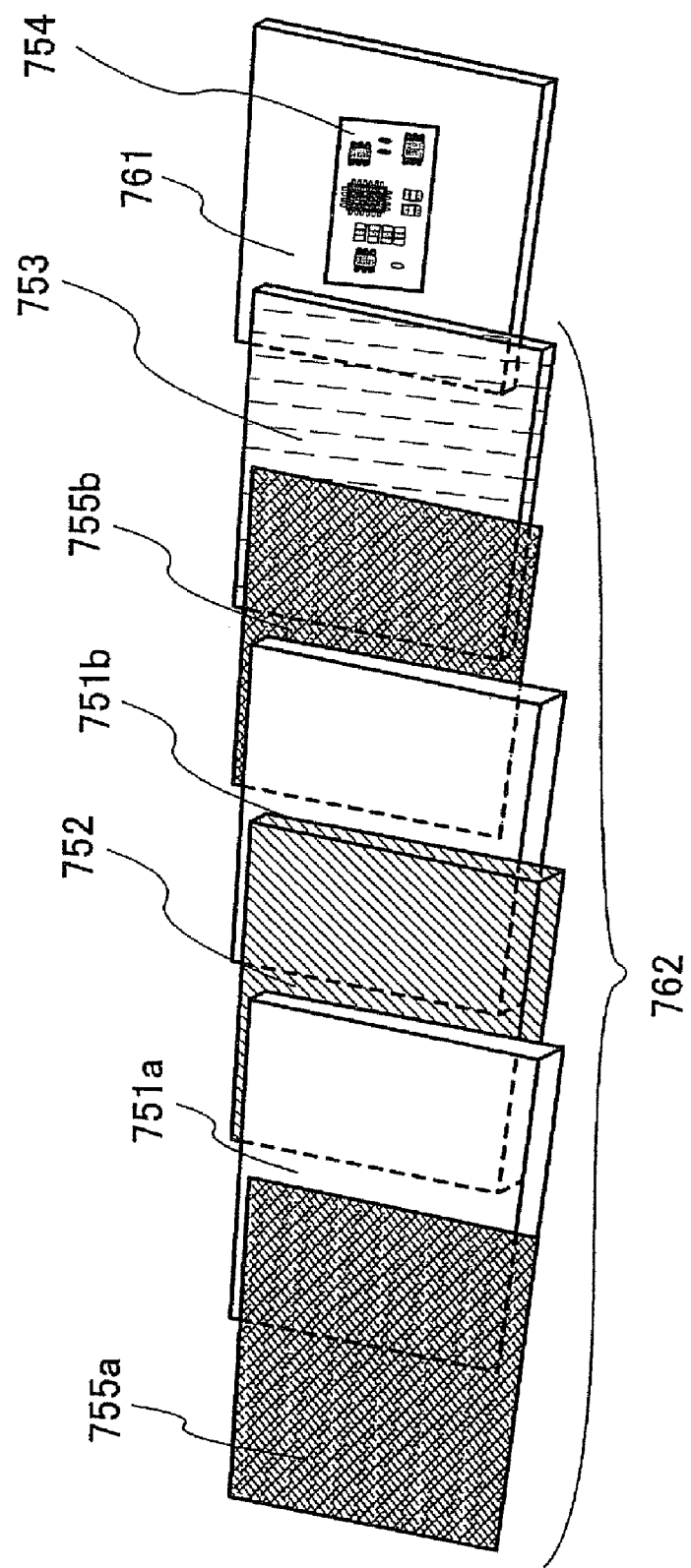
FIG. 29 is a view showing a device on which a photoelectric conversion device of the present invention is mounted.

A detailed structure of a case where a liquid crystal panel is used for the display portion 733 of the computer shown in FIG. 28A and the display portion 743 of the display device shown in FIG. 28B is shown in FIG. 29.

A liquid crystal panel 762 shown in FIG. 29 is incorporated in a chassis 761 and has substrates 751a and 751b, a liquid crystal layer 752 interposed between the substrates 751a and 751b, polarizing filters 755a and 755b, a back light 753, and the like. In addition, a photoelectric conversion element formation region 754 having a photoelectric conversion element is formed in the chassis 761.

The photoelectric conversion element formation region 754 manufactured by using the present invention detects the amount of light from the back light 753, and the information is fed back to adjust luminance of the liquid crystal panel 762.

Figure 30A:
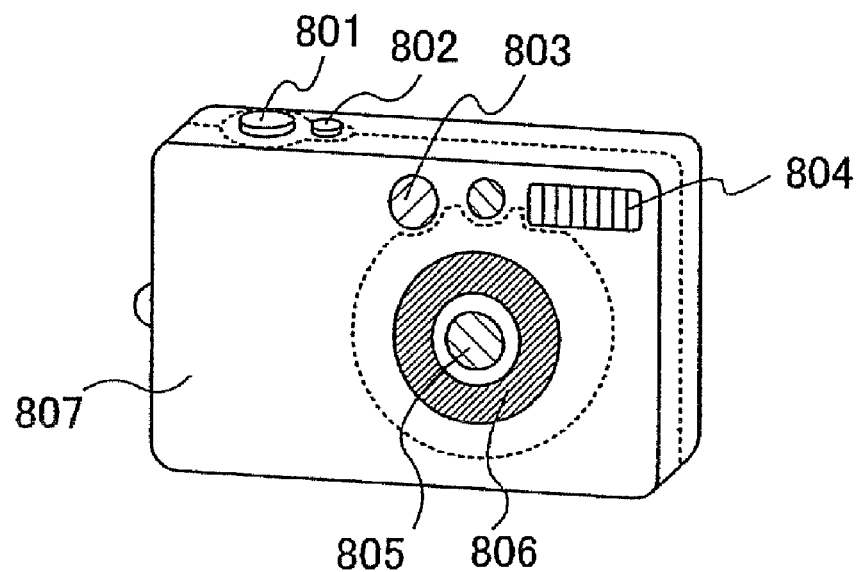
FIGS. 30A and 30B are views each showing a device on which a photoelectric conversion device of the present invention is mounted.
Figure 30B:
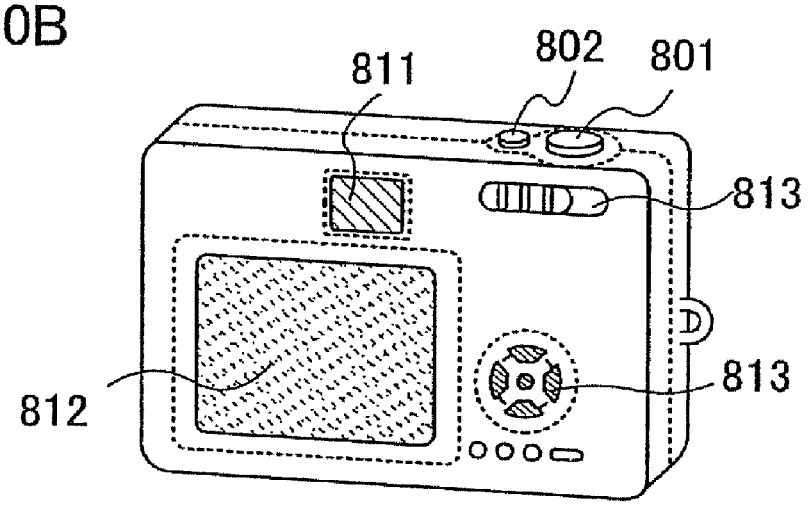

FIGS. 30A and 30B are views showing an example in which a light sensor of the present invention is incorporated in a camera, for example, a digital camera. FIG. 30A is a perspective view seen from the front side of the digital camera, and FIG. 30B is a perspective view seen from the back side thereof. In FIG. 30A, the digital camera is provided with a release button 801, a main switch 802, a viewfinder 803, a flash portion 804, a lens 805, a barrel 806, and a chassis 807.

In addition, in FIG. 30B, the digital camera is provided with an eyepiece finder 811, a monitor 812, and operation buttons 813.

When the release button 801 is pushed down to the half point, a focus adjustment mechanism and an exposure adjustment mechanism are operated, and when the release button is pushed down to the lowest point, a shutter is opened.

By pushing down or rotating the main switch 802, a power supply of the digital camera is switched on or off.

The viewfinder 803 is located above the lens 805, which is on the front side of the digital camera, for checking a shooting range and the focus point from the eyepiece finder 811 shown in FIG. 30B.

The flash portion 804 is located in the upper position on the front side of the digital camera. When the subject brightness is not enough, auxiliary light is emitted from the flash portion 804, at the same time as the release button is pushed down and a shutter is opened.

The lens 805 is located at the front side of the digital camera and made of a focusing lens, a zoom lens, and the like. The lens forms a photographic optical system with a shutter and a diaphragm which are not shown. In addition, behind the lens, an imaging device such as a CCD (Charge Coupled Device) is provided.

The barrel 806 moves a lens position to adjust the focus of the focusing lens, the zoom lens, and the like. In shooting, the barrel is slid out to move the lens 805 forward. Further, when carrying the digital camera, the lens 805 is moved backward to be compact. It is to be noted that a structure is employed in this embodiment, in which the subject can be photographed by zoom by sliding out the barrel; however, the present invention is not limited to this structure, and a structure may also be employed for the digital camera, in which shooting can be conducted by zoom without sliding out the barrel with the use of a structure of a photographic optical system inside the chassis 807.

The eyepiece finder 811 is located in the upper position on the back side of the digital camera for looking therethrough in checking a shooting range and the focus point.

The operation buttons 813 are each a button for various functions provided on the back side of the digital camera, which includes a set up button, a menu button, a display button, a functional button, a selecting button, and the like.

When a light sensor of the present invention is incorporated in the camera shown in FIGS. 30A and 30B, the light sensor can detect whether light exists or not, and light intensity, and thus, exposure adjustment of a camera or the like can be conducted.

In addition, a light sensor of the present invention can also be applied to other electronic devices such as a projection TV and a navigation system. In other words, it can be applied to any object as long as it needs to detect light.

This embodiment can be freely combined with any description of Embodiment Mode and Embodiments 1 to 4.

INDUSTRIAL APPLICABILITY

According to the present invention, a semiconductor device capable of detecting light intensity having a wide range from weak light to strong light can be manufactured.

This application is based on Japanese Patent Application serial No. 2005-217757 filed in Japan Patent Office on Jul. 27, 2005, the entire contents of which are hereby incorporated by reference.

What is claimed is:

1. An electronic device comprising a semiconductor device:
   the semiconductor device comprising:
   a photodiode comprising a photoelectric conversion layer;
   a current amplifier circuit comprising a transistor; and
   a switch between the photodiode and the current amplifier circuit,
   wherein the photodiode and the current amplifier circuit are electrically connected to each other by the switch when intensity of entering light into the photodiode is lower than predetermined intensity so that a photoelectric current is amplified by the current amplifier circuit to be outputted, and
   wherein the photodiode and the current amplifier circuit are electrically disconnected by the switch when intensity of entering light into the photodiode is higher than predetermined intensity so that a photoelectric current is outputted with a reduced amplification factor.

2. The electronic device according to claim 1, wherein the photoelectric conversion layer includes a p-type semiconductor layer, an i-type semiconductor layer, and an n-type semiconductor layer.

3. The electronic device according to claim 1, wherein the transistor is a thin film transistor.

4. The electronic device according to claim 1, wherein the transistor has a source region, a drain region, a channel formation region, a gate insulating film, and a gate electrode.

5. The electronic device according to claim 1, wherein the electronic device is selected from the group consisting of a cellular phone, a computer, a display device, and a camera.

6. The electronic device comprising a semiconductor device:
   the semiconductor device comprising:
   a current mirror circuit comprising a first transistor and n second transistors, wherein the n second transistors are serially connected to each other and are divided into m groups;
   a photodiode of which a first terminal is connected to a power supply and a second terminal is connected to one of a source region and a drain region of the first transistor and a gate electrode of the first transistor; and
   m switches which are provided between the first terminal of the photodiode and m groups of the n second transistors, respectively,
   wherein a common potential is applied to gate electrodes of the first transistor and the n second transistors,
   wherein the m switches are switched on and off in accordance with intensity of light received by the photodiode.

7. The electronic device according to claim 6, wherein each of the first transistor and the n second transistors is a thin film transistor.

8. An electronic device according to claim 6, wherein the electronic device is selected from the group consisting of a cellular phone, a computer, a display device, and a camera.

9. An electronic device comprising a semiconductor device:
   the semiconductor device comprising:
   a current mirror circuit comprising a first transistor and n second transistors, wherein the n second transistors are serially connected to each other and are divided into m groups;
   a photodiode of which a first terminal is connected to a power supply and a second terminal is connected to one of a source region and a drain region of the first transistor and a gate electrode of the first transistor;
   m switches which are provided between the first terminal of the photodiode and m groups of the n second transistors, respectively;
   a controlling portion which switches the m switches in accordance with intensity of light received by the photodiode,
   wherein a common potential is applied to gate electrodes of the first transistor and the n second transistors.

10. An electronic device according to claim 9, wherein each of the first transistor and the n second transistors is a thin film transistor.

11. An electronic device according to claim 9, wherein the electronic device is selected from the group consisting of a cellular phone, a computer, a display device, and a camera.

* * * * *

UNITED STATES PATENT AND TRADEMARK OFFICE
CERTIFICATE OF CORRECTION

PATENT NO.        : 8,049,157 B2
APPLICATION NO.   : 12/949301
DATED             : November 1, 2011
INVENTOR(S)       : Kazuo Nishi et al.

It is certified that error appears in the above-identified patent and that said Letters Patent is hereby corrected as shown below:

At column 6, line 8, "n-channel 1" should be --n-channel TFT--;

At column 6, line 8, "minor" should be --mirror--;

At column 6, lines 8 and 9, "p-channel" should be --p-channel TFT--;

At column 12, line 63, "Al" should be --Al--;

At column 13, line 49, "fowling" should be --forming--;

At column 15, line 7, "104" should be --TFT 104--;

At column 17, line 38, "Al" should be --Al--;

At column 26, line 13, "asking" should be --ashing--;

At column 26, lines 56 and 57, "or polyimide" should be --or polyamide--.

Signed and Sealed this
Sixth Day of March, 2012

David J. Kappos
*Director of the United States Patent and Trademark Office*